United States Patent
Oikawa et al.

(10) Patent No.: US 9,048,277 B2
(45) Date of Patent: Jun. 2, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Yoshiaki Oikawa, Tochigi (JP); Shingo Eguchi, Tochigi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 177 days.

(21) Appl. No.: 13/759,251

(22) Filed: Feb. 5, 2013

(65) Prior Publication Data
US 2013/0149816 A1    Jun. 13, 2013

Related U.S. Application Data

(62) Division of application No. 12/429,202, filed on Apr. 24, 2009, now Pat. No. 8,384,209.

(30) Foreign Application Priority Data

May 12, 2008 (JP) ................................. 2008-124985
May 12, 2008 (JP) ................................. 2008-124992

(51) Int. Cl.
| | | |
|---|---|---|
| H01L 21/71 | (2006.01) | |
| H01L 23/29 | (2006.01) | |
| H01L 23/31 | (2006.01) | |

(52) U.S. Cl.
CPC .............. *H01L 21/71* (2013.01); *H01L 23/293* (2013.01); *H01L 23/3157* (2013.01); *H01L 2924/12044* (2013.01); *H01L 2924/19041* (2013.01); *H01L 2924/0002* (2013.01)

(58) Field of Classification Search
CPC ......... H01L 21/71; H01L 23/14; H01L 23/58; H01L 21/56; H01L 21/00; H01L 21/84

USPC ........... 438/117, 118, 127, 406, 455, 30, 151
See application file for complete search history.

(56) References Cited

U.S. PATENT DOCUMENTS

| | | |
|---|---|---|
| 5,075,166 A | 12/1991 | Sikorski et al. |
| 5,534,372 A | 7/1996 | Koshizuka et al. |

(Continued)

FOREIGN PATENT DOCUMENTS

| | | |
|---|---|---|
| EP | 0636495 A | 2/1995 |
| EP | 0 939 441 | 9/1999 |

(Continued)

OTHER PUBLICATIONS

Invitation to Pay Additional Fees (Application No. PCT/JP2009/058110), International Searching Authority, dated Jun. 2, 2009.

(Continued)

*Primary Examiner* — Chuong A Luu
(74) *Attorney, Agent, or Firm* — Eric J. Robinson; Robinson Intellectual Property Law Office, P.C.

(57) ABSTRACT

To reduce defects of a semiconductor device, such as defects in shape and characteristic due to external stress and electrostatic discharge. To provide a highly reliable semiconductor device. In addition, to increase manufacturing yield of a semiconductor device by reducing the above defects in the manufacturing process. The semiconductor device includes a semiconductor integrated circuit sandwiched by impact resistance layers against external stress and an impact diffusion layer diffusing the impact and a conductive layer covering the semiconductor integrated circuit. With the use of the conductive layer covering the semiconductor integrated circuit, electrostatic breakdown (malfunctions of the circuit or damages of a semiconductor element) due to electrostatic discharge of the semiconductor integrated circuit can be prevented.

13 Claims, 37 Drawing Sheets

(56) References Cited

U.S. PATENT DOCUMENTS

| | | |
|---|---|---|
| 5,597,631 A | 1/1997 | Furumoto et al. |
| 5,757,456 A | 5/1998 | Yamazaki et al. |
| 5,770,313 A | 6/1998 | Furumoto et al. |
| 5,821,138 A | 10/1998 | Yamazaki et al. |
| 6,118,502 A | 9/2000 | Yamazaki et al. |
| 6,127,199 A | 10/2000 | Inoue et al. |
| 6,224,965 B1 | 5/2001 | Haas et al. |
| 6,376,333 B1 | 4/2002 | Yamazaki et al. |
| 6,403,221 B1 | 6/2002 | Nakamura et al. |
| 6,482,495 B1 | 11/2002 | Kohama et al. |
| 6,491,228 B1 | 12/2002 | Ueda et al. |
| 6,509,217 B1 | 1/2003 | Reddy |
| 6,762,508 B1 | 7/2004 | Kiso et al. |
| 6,926,794 B2 | 8/2005 | Kohama et al. |
| 6,998,282 B1 | 2/2006 | Yamazaki et al. |
| 7,049,178 B2 | 5/2006 | Kim et al. |
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,485,489 B2 | 2/2009 | Björbell |
| 7,487,373 B2 | 2/2009 | Koyama |
| 7,622,805 B2 | 11/2009 | Usui et al. |
| 7,965,180 B2 | 6/2011 | Koyama |
| 7,981,528 B2 | 7/2011 | Nakatani et al. |
| 8,242,903 B2 | 8/2012 | Koyama |
| 8,304,289 B2 | 11/2012 | Usui et al. |
| 8,508,360 B2 | 8/2013 | Koyama |
| 2003/0032210 A1 | 2/2003 | Takayama et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0233122 A1 | 10/2005 | Nishimura et al. |
| 2005/0285231 A1 | 12/2005 | Arao et al. |
| 2006/0011288 A1 | 1/2006 | Watanabe et al. |
| 2007/0004125 A1 | 1/2007 | Watanabe et al. |
| 2007/0044303 A1 | 3/2007 | Yamano |
| 2007/0077691 A1 | 4/2007 | Watanabe |
| 2007/0181875 A1 | 8/2007 | Yamazaki et al. |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0044940 A1 | 2/2008 | Watanabe et al. |
| 2008/0054976 A1 | 3/2008 | Endo et al. |
| 2008/0093464 A1 | 4/2008 | Dairiki et al. |
| 2008/0179679 A1 | 7/2008 | Grudowski et al. |
| 2008/0224940 A1 | 9/2008 | Sugiyama et al. |
| 2008/0224941 A1* | 9/2008 | Sugiyama et al. ............ 343/873 |
| 2008/0242005 A1* | 10/2008 | Dozen et al. ................. 438/127 |
| 2008/0303140 A1 | 12/2008 | Ohtani et al. |
| 2009/0267225 A1 | 10/2009 | Eguchi |
| 2009/0289341 A1 | 11/2009 | Yamazaki et al. |
| 2013/0321995 A1 | 12/2013 | Koyama |

FOREIGN PATENT DOCUMENTS

| | | |
|---|---|---|
| EP | 1092739 | 4/2001 |
| EP | 1589797 | 10/2005 |
| EP | 1 758 438 | 2/2007 |
| EP | 1 970 951 | 9/2008 |
| JP | 05-190582 | 7/1993 |
| JP | 07-088974 A | 4/1995 |
| JP | 08-250745 | 9/1996 |
| JP | 08-288522 | 11/1996 |
| JP | 09-156265 A | 6/1997 |
| JP | 10-092980 | 4/1998 |
| JP | 10-129165 A | 5/1998 |
| JP | 10-211784 A | 8/1998 |
| JP | 10-302027 A | 11/1998 |
| JP | 11-250209 A | 9/1999 |
| JP | 2000-036024 A | 2/2000 |
| JP | 2000-231619 | 8/2000 |
| JP | 2001-237351 A | 8/2001 |
| JP | 2001-277726 | 10/2001 |
| JP | 2003-108957 A | 4/2003 |
| JP | 2003-141486 A | 5/2003 |
| JP | 2003-174153 | 6/2003 |
| JP | 2004-094492 A | 3/2004 |
| JP | 2004-118255 | 4/2004 |
| JP | 2004-362341 | 12/2004 |
| JP | 2005-011190 A | 1/2005 |
| JP | 2006-139802 | 6/2006 |
| JP | 2006-190923 A | 7/2006 |
| JP | 2007-018487 A | 1/2007 |
| JP | 2007-123859 A | 5/2007 |
| JP | 2007-241999 A | 9/2007 |
| JP | 2008-083804 A | 4/2008 |
| JP | 2008-084303 A | 4/2008 |
| JP | 2008-103691 A | 5/2008 |
| JP | 2008-100847 A | 5/2008 |
| TW | I295813 | 4/2008 |
| WO | WO 96/09158 | 3/1996 |
| WO | WO 01/01740 | 1/2001 |
| WO | WO 04/001848 | 12/2003 |
| WO | WO 2006/038438 A | 4/2006 |
| WO | WO 2007/043285 A | 4/2007 |

OTHER PUBLICATIONS

Invitation to Pay Additional Fees (Application No. PCT/JP2009/057940) International Searching Authority, dated Jun. 2, 2009.

International Search Report (Application No. PCT/JP2009/057940) dated Aug. 4, 2009.

Written Opinion (Application No. PCT/JP2009/057940) dated Aug. 4, 2009.

* cited by examiner 260 270 271 253 252 254

263
264

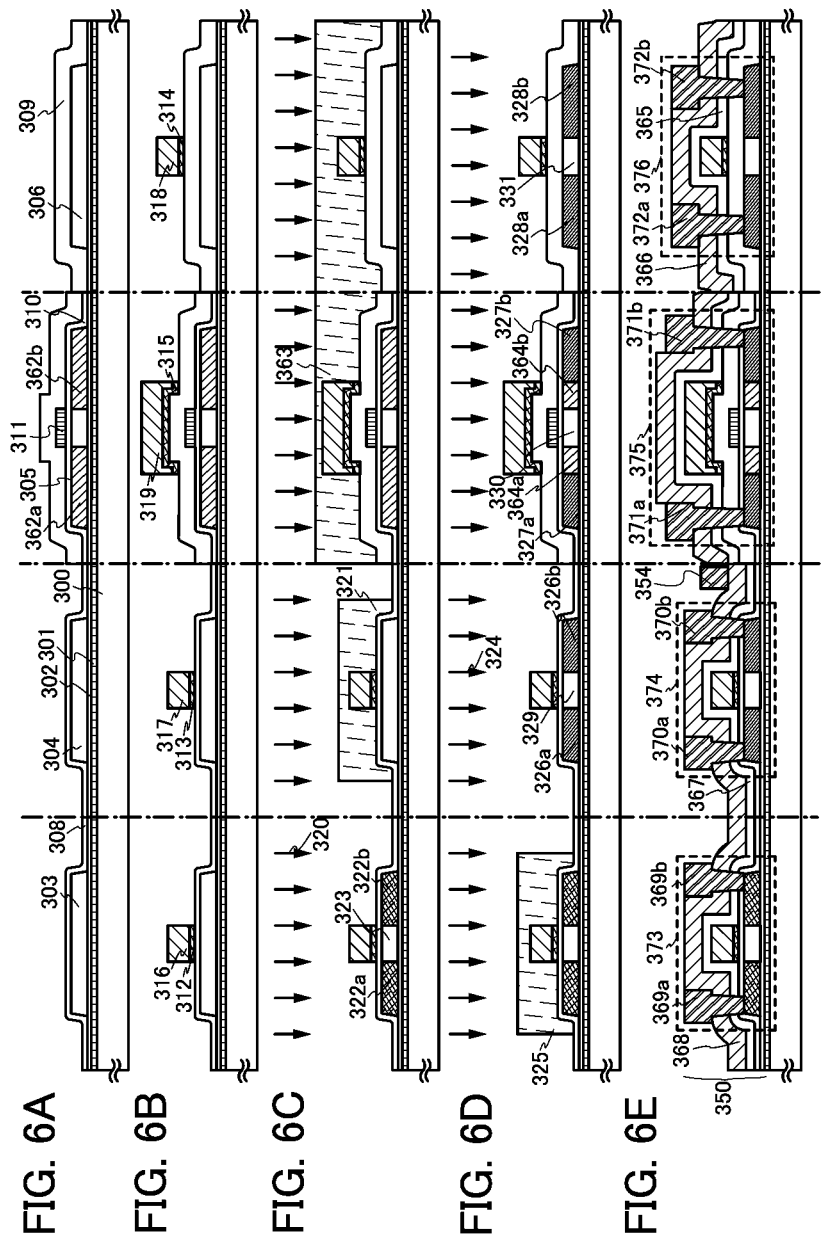

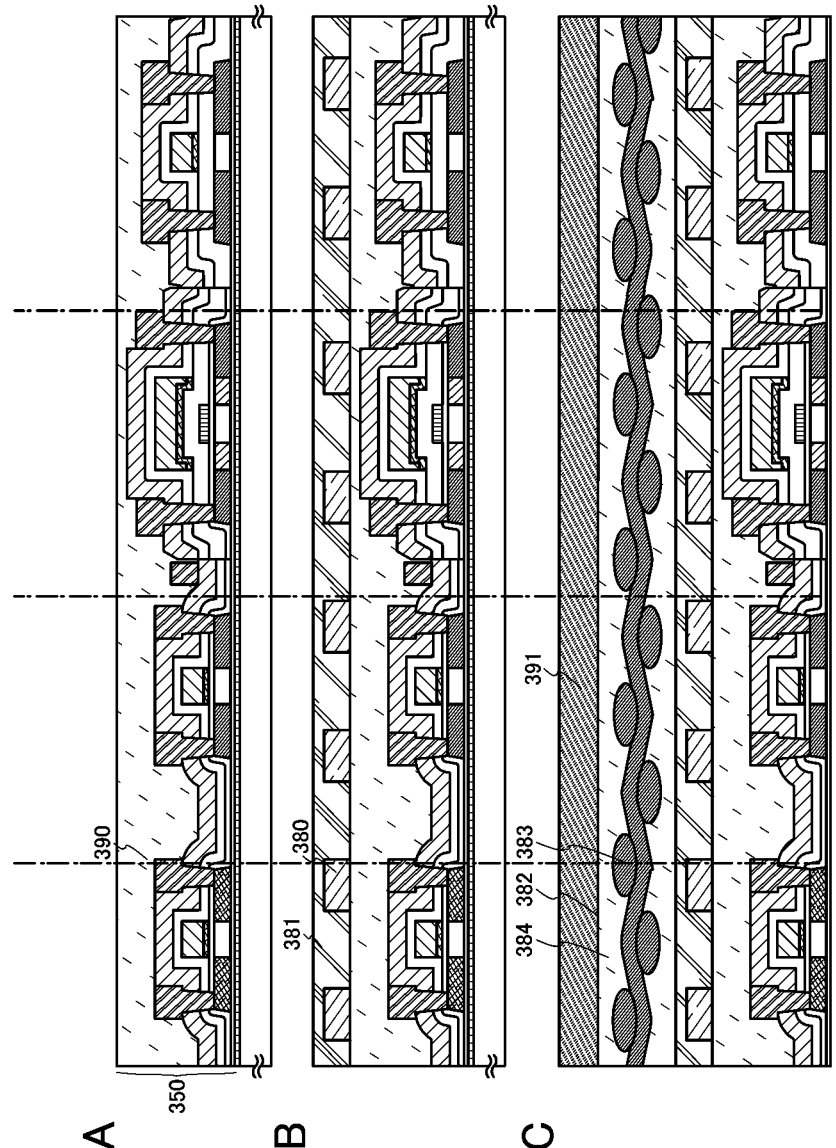

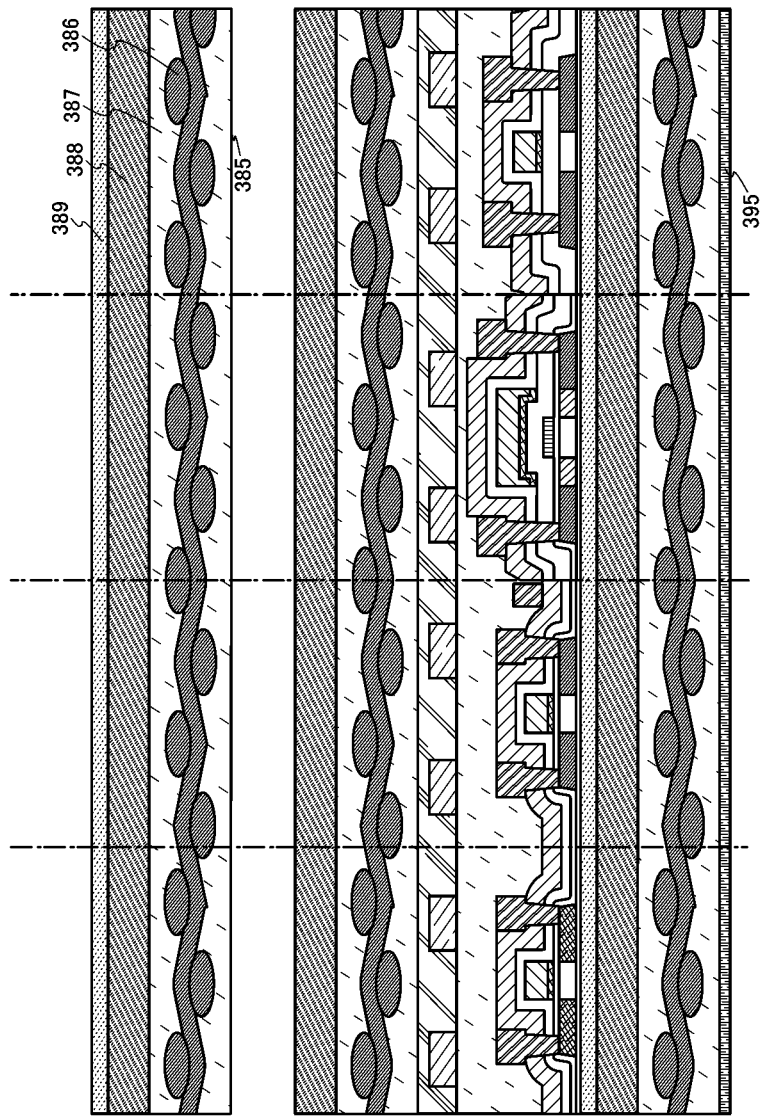

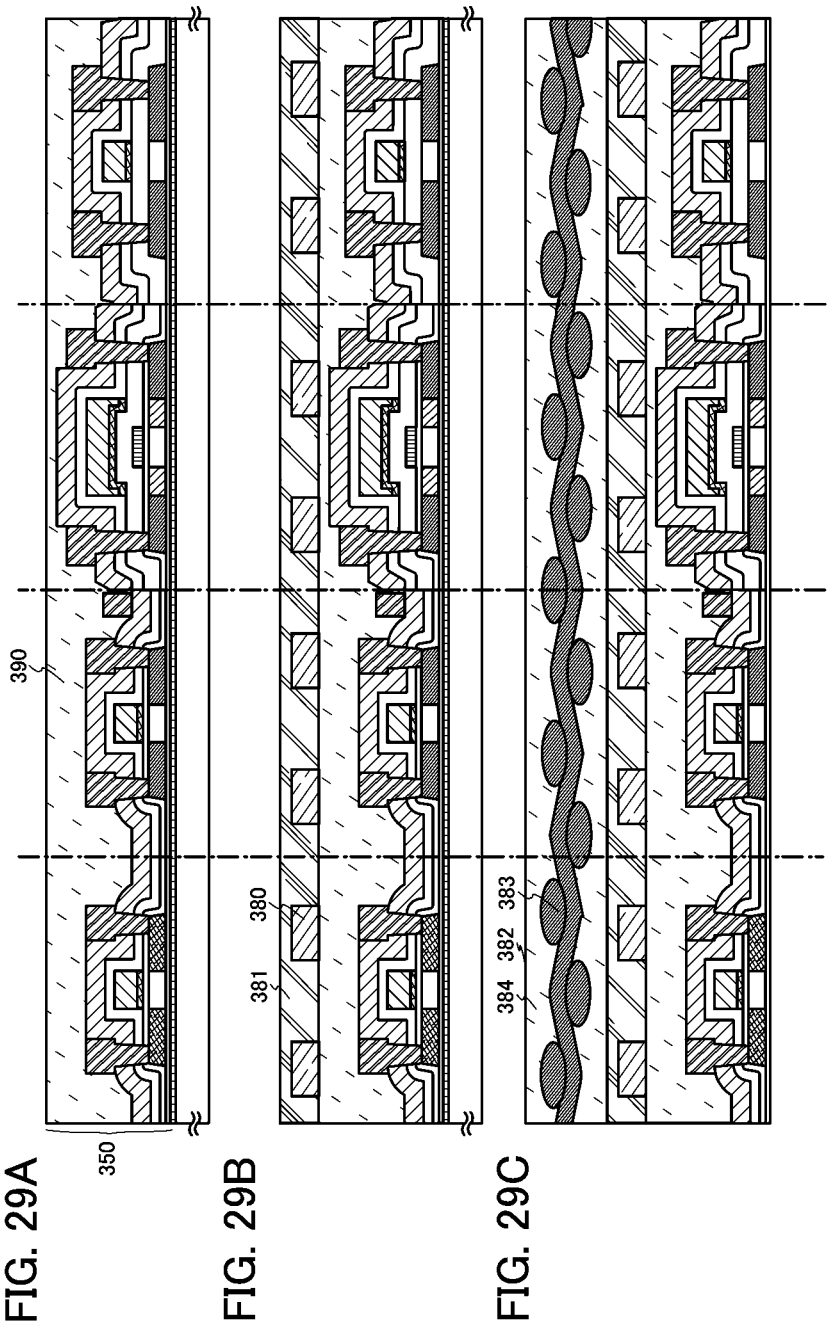

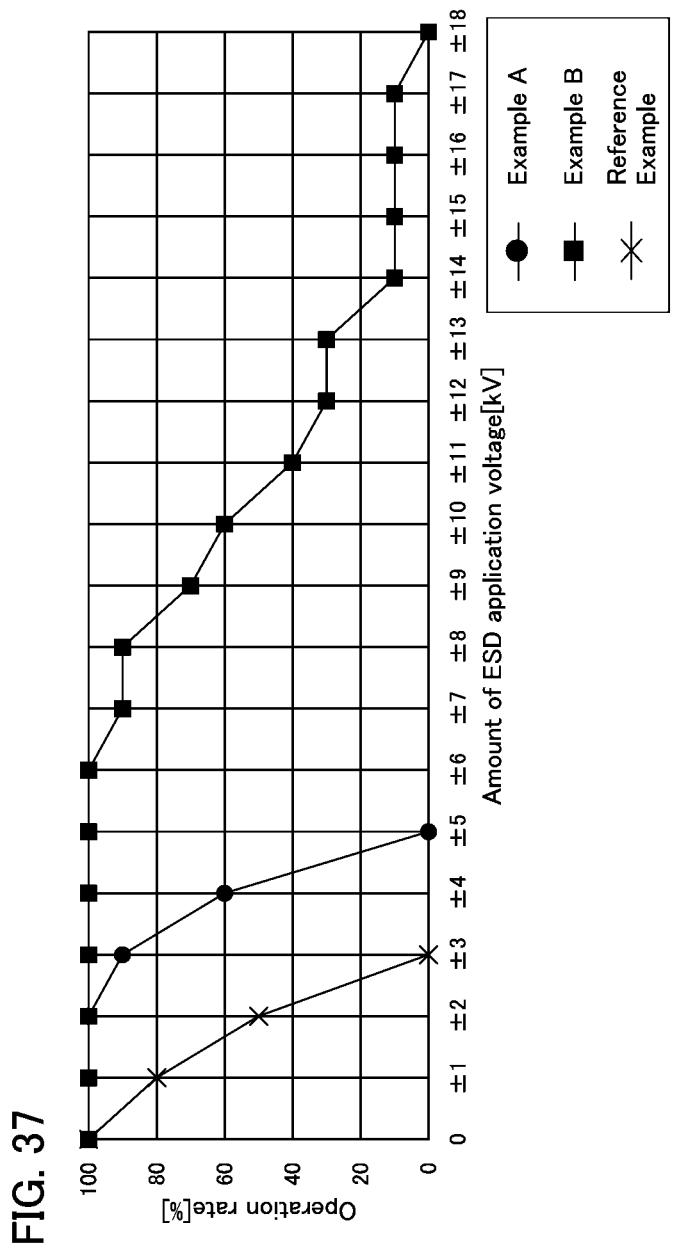

SEMICONDUCTOR DEVICE AND METHOD FOR MANUFACTURING SEMICONDUCTOR DEVICE

This application is Division of application Ser. No. 12/429,202, filed on Apr. 24, 2009, now U.S. Pat. No. 8,384,209.

TECHNICAL FIELD

The present invention relates to a semiconductor device and a method for manufacturing the semiconductor device.

BACKGROUND ART

It is important to increase the strength against external stress of a semiconductor integrated circuit chip (also referred to as an IC chip) that is further downsized and thinned.

A variety of methods for strengthening chips have been proposed to increase the strength of chips (see Patent Document 1: Japanese Published Patent Application No. 2006-139802). For example, Patent Document 1 discloses the method in which a chip is sandwiched between reinforcing metal plates, covered with a sealing resin, and hardened.

Further, a semiconductor integrated circuit chip carried to be used has a problem in that it is broken (electrostatic breakdown occurs) due to external electrostatic discharge in being carried, stored, and used, and the measure for the problem is also disclosed (see Patent Document 2: Japanese Published Patent Application No. 2000-231619).

In Patent Document 2, a semiconductor integrated circuit chip that is being carried and stored can be increased in tolerance for breakage due to electrostatic discharge caused by the fact that all external terminals are short-circuited.

[Patent Document 1] Japanese Published Patent Application No. 2006-139802

[Patent Document 2] Japanese Published Patent Application No. 2000-231619

DISCLOSURE OF THE INVENTION

However, there occurs a problem that by providing reinforcing metal plates as in Patent Document 1, a semiconductor device is increased in thickness and size.

Therefore, an object is to provide a highly reliable semiconductor device that is reduced in thickness and size and has tolerance for external stress and electrostatic discharge. Further, another object is to manufacture a semiconductor device with high yield by preventing a defect in shape and characteristic in a manufacturing process.

An impact resistance layer against force (also referred to as external stress) externally given to a semiconductor device, an impact diffusion layer which diffuses the force, and a conductive layer which covers a semiconductor integrated circuit are provided. The conductive layer diffuses static electricity applied by electrostatic discharge to let it go or prevents local electric charges (localization of electric charges) (prevents local potential difference) so that electrostatic breakdown of the semiconductor integrated circuit can be prevented. The conductive layer is formed so as to cover (overlap) one surface of the semiconductor integrated circuit. In the case of providing an antenna, the conductive layer is formed on the side opposite to the semiconductor integrated circuit, on which the antenna is not provided. Note that the conductive layer is not electrically connected to the semiconductor integrated circuit.

By providing the impact resistance layer against force (also referred to as external stress) externally given to a semiconductor device and an impact diffusion layer which diffuses the force, locally applied force can be alleviated. Therefore, damages, defective characteristics, and the like of the semiconductor device can be prevented.

In a semiconductor device, at least one impact diffusion layer is provided in contact with a semiconductor integrated circuit. By being provided in contact with the semiconductor integrated circuit, the impact diffusion layer has an effect of further diffusing and reducing force externally applied to the semiconductor integrated circuit.

In a semiconductor device, a semiconductor integrated circuit is sandwiched by a pair of impact diffusion layers and an impact resistance layer. The semiconductor integrated circuit is formed over a substrate, bonded to the impact resistance layer, and separated from the substrate. In this specification, a surface along which the semiconductor integrated circuit is exposed by being separated from the substrate is referred to as a separation surface. In an embodiment of the present invention, in the case where the semiconductor device comprises a pair of impact resistance layers and a pair of impact diffusion layers, a separation surface of the semiconductor integrated circuit is in contact with the impact diffusion layer (a second impact diffusion layer) and the other surface is in contact with the impact resistance layer (a first impact resistance layer). A first impact diffusion layer is provided on an outer side than the first impact resistance layer (on the side where the semiconductor integrated circuit is not provided) and a second impact resistance layer is provided on an outer side than the second impact diffusion layer (on the side where the semiconductor integrated circuit is not provided).

The conductive layer is acceptable as long as it has conductivity. The conductive layer with a small thickness preferably has a sheet resistance of from $1.0 \times 10^2 \Omega/\square$ to $1.0 \times 10^7 \Omega/\square$ (more preferably, from $1.0 \times 10^2 \Omega/\square$ to $1.0 \times 10^4 \Omega/\square$).

The conductive layer is formed using a material having a thickness through which radio waves to be transmitted and received by an antenna are transmitted. Accordingly, a highly reliable semiconductor device that has tolerance for electrostatic breakdown and can transmit and receive radio waves can be provided.

For the conductive layer, a film of metal, metal nitride, metal oxide, or the like, or a stack of any of the films can be used.

The conductive layer may be formed using, for example, an element such as titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material each containing any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film having conductivity, which is obtained by adding an impurity element or the like to a semiconductor, or the like can be used. For example, a polycrystalline silicon film doped with an impurity element such as phosphorus can be used.

Still alternatively, a conductive macromolecule (also referred to as a conductive polymer) may be used for the conductive layer. As the conductive macromolecule, a so-called π-electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive macromolecule are as follows: polypyrrole, poly(3-methylpyrrole), poly(3-butylpyrroe), poly(3-octylpyrroe), poly(3-decylpyrroe), poly(3,4-dimethylpyrroe), poly(3,4-dibutylpyrroe), poly(3-hydroxypyrrole), poly(3-methyl-4-hydroxypyrrole), poly(3-methoxypyrrole), poly(3-ethoxypyrroe), poly(3-octoxypyrroe), poly(3-carboxylpyrroe), poly(3-methyl-4-carboxylpyrroe), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

A conductive layer containing a conductive macromolecule may contain an organic resin or a dopant (a halogen, a Lewis acid, an inorganic acid, an organic acid, a transition metal halide, an organic cyano compound, a nonionic surfactant, or the like).

The conductive layer can be formed by a dry process such as a sputtering method, a plasma CVD method, or an evaporation method, or a wet process such as a coating method, a printing method, or a droplet discharge method (inkjet method). The thickness of the conductive layer is preferably from 5 nm to 200 nm.

The impact resistance layer (or the impact diffusion layer) bonded to the semiconductor integrated circuit may be provided with the conductive layer or the impact diffusion layer may be provided with the conductive layer before being bonded to the semiconductor integrated circuit. In the case of employing the structure in which the impact diffusion layer is provided with the conductive layer before being bonded to the semiconductor integrated circuit so that the conductive layer is between the impact diffusion layer and the impact resistance layer, degradation of the conductive layer, such as oxidation, duration, and crazing can be prevented since a surface of the conductive layer is not exposed.

Further, a protective layer may be stacked over the conductive layer. For example, it is preferable that a titanium film be formed as the conductive layer and a titanium oxide film be stacked over the titanium film as a protective layer. Even in the case where the conductive layer is provided on a surface of a semiconductor device, the conductive layer can be prevented from being degraded because a protective layer is formed on an outermost surface of the semiconductor device.

For the impact resistance layer, a structure body in which a fibrous body is impregnated with an organic resin can be used. The impact resistance layer preferably has a modulus of elasticity of 13 GPa or more and a modulus of rupture of less than 300 MPa.

For the impact diffusion layer, a material that has a low modulus of elasticity and a high breaking strength is preferably used, and a film with rubber elasticity may be used. The impact diffusion layer preferably has a modulus of elasticity of from 5 GPa to 12 GPa and a modulus of rupture of 300 MPa or more.

The impact diffusion layer is preferably formed using a high-strength material. As typical examples of the high-strength material, a polyvinyl alcohol resin, a polyester resin, a polyamide resin, a polyethylene resin, an aramid resin, a polyparaphenylenebenzobisoxazole resin, a glass resin, and the like are given. By providing the impact diffusion layer formed using a high-strength material with elasticity, a load such as local pressure is diffused to and absorbed by the impact diffusion layer, so that the semiconductor device can be prevented from being damaged.

In more specific, for the impact diffusion layer, an aramid resin, a polyethylene naphthalate (PEN) resin, a polyethersulfone (PES) resin, a polyphenylene sulfide (PPS) resin, a polyimide resin (PI), or the like may be used.

In this specification, the word "transfer" (also referred to as transpose) means that a semiconductor integrated circuit formed over one substrate is separated from the substrate and moved to another substrate. In other words, it means that a place where the semiconductor integrated circuit is provided is changed to another substrate.

A semiconductor device according to an embodiment of the present invention includes a semiconductor integrated circuit sandwiched between a first impact resistance layer and a second impact resistance layer, which are one pair; and a conductive layer covering (overlapping) the semiconductor integrated circuit, on a side opposite to one of the first impact resistance layer and the second impact resistance layer, on which the semiconductor integrated circuit is not provided.

A semiconductor device according to an embodiment of the present invention includes a semiconductor integrated circuit sandwiched between a first impact resistance layer and a second impact resistance layer, which are one pair; an impact diffusion layer between the semiconductor integrated circuit and the second impact resistance layer; and a conductive layer covering (overlapping) the semiconductor integrated circuit, on a side opposite to one of the first impact resistance layer and the second impact resistance layer, on which the semiconductor integrated circuit is not provided. The impact diffusion layer has a lower modulus of elasticity and a higher breaking strength than the first impact resistance layer and the second impact resistance layer.

A semiconductor device according to an embodiment of the present invention includes a semiconductor integrated circuit sandwiched between a first impact resistance layer and a second impact resistance layer, which are one pair; an impact diffusion layer between the semiconductor integrated circuit and the second impact resistance layer; and a conductive layer covering (overlapping) the semiconductor integrated circuit, between the second impact resistance layer and the impact diffusion layer. The impact diffusion layer has a lower modulus of elasticity and a higher breaking strength than the first impact resistance layer and the second impact resistance layer.

A semiconductor device according to an embodiment of the present invention includes a semiconductor integrated circuit sandwiched between a first impact resistance layer and a second impact resistance layer, which are one pair; a first impact diffusion layer over a surface of the first impact resistance layer, which is not provided with the semiconductor integrated circuit; a second impact diffusion layer between the semiconductor integrated circuit and the second impact resistance layer; and a conductive layer covering (overlapping) the semiconductor integrated circuit, on a side opposite to one of the first impact diffusion layer and the second impact resistance layer, on which the semiconductor integrated circuit is not provided. The first impact diffusion layer and the second impact diffusion layer each have a lower modulus of elasticity and a higher breaking strength than the first impact resistance layer and the second impact resistance layer.

A semiconductor device according to an embodiment of the present invention includes a semiconductor integrated circuit sandwiched between a first impact resistance layer and a second impact resistance layer, which are one pair; a first impact diffusion layer over a surface of the first impact resistance layer, which is not provided with the semiconductor integrated circuit; a second impact diffusion layer between the semiconductor integrated circuit and the second impact resistance layer; and a conductive layer covering the semiconductor integrated circuit, between the second impact resistance layer and the second impact diffusion layer. The first impact diffusion layer and the second impact diffusion layer each have a lower modulus of elasticity and a higher breaking strength than the first impact resistance layer and the second impact resistance layer.

In the above structure, the semiconductor device may be provided with an antenna which receives and transmits a signal from/to the outside on a side opposite to the semiconductor integrated circuit, on which the conductive layer is not provided (opposite to the conductive layer with the semiconductor integrated circuit interposed therebetween). For example, in the case of providing the conductive layer on an outer side opposite to the second impact resistance layer, the antenna may be provided between the semiconductor integrated circuit and the first impact resistance layer. Further, a protective layer may be provided over the semiconductor integrated circuit. For example, an inorganic insulating layer may be formed as the protective layer so as to cover the antenna provided over the semiconductor integrated circuit.

A method for manufacturing a semiconductor device, according to an embodiment of the present invention, includes a step of forming a semiconductor integrated circuit over a substrate with a separation layer interposed therebetween; a step of bonding a first impact resistance layer to the semiconductor integrated circuit and separating the semiconductor integrated circuit from the substrate; a step of bonding the second impact resistance layer to the semiconductor integrated circuit separated from the substrate; and a step of forming a conductive layer covering (overlapping) the semiconductor integrated circuit, on a side opposite to one of the first impact resistance layer and the second impact resistance layer, on which the semiconductor integrated circuit is not provided.

A method for manufacturing a semiconductor device, according to an embodiment of the present invention, includes a step of forming a semiconductor integrated circuit over a substrate with a separation layer interposed therebetween; a step of bonding a first impact resistance layer to the semiconductor integrated circuit and separating the semiconductor integrated circuit from the substrate; a step of bonding a second impact resistance layer and an impact diffusion layer to each other; a step of bonding the impact diffusion layer bonded to the second impact resistance layer to the semiconductor integrated circuit separated from the substrate; and a step of forming a conductive layer covering (overlapping) the semiconductor integrated circuit, on a side opposite to one of the first impact resistance layer and the second impact resistance layer, on which the semiconductor integrated circuit is not provided. The impact diffusion layer has a lower modulus of elasticity and a higher breaking strength than the first impact resistance layer and the second impact resistance layer.

A method for manufacturing a semiconductor device, according to an embodiment of the present invention, includes a step of forming a semiconductor integrated circuit over a substrate with a separation layer interposed therebetween; a step of bonding a first impact resistance layer to the semiconductor integrated circuit and separating the semiconductor integrated circuit from the substrate; a step of forming a conductive layer on one of surfaces of an impact diffusion layer; a step of bonding a second impact resistance layer and one of surfaces of the impact diffusion layer, which is provided with the conductive layer, to each other; and a step of bonding the other surface of the impact diffusion layer bonded to the second impact resistance layer to the semiconductor integrated circuit separated from the substrate. The impact diffusion layer has a lower modulus of elasticity and a higher breaking strength than the first impact resistance layer and the second impact resistance layer.

A method for manufacturing a semiconductor device, according to an embodiment of the present invention, includes a step of forming a semiconductor integrated circuit over a substrate with a separation layer interposed therebetween; a step of bonding a first impact resistance layer and a first impact diffusion layer to the semiconductor integrated circuit and the first impact resistance layer, respectively, and separating the semiconductor integrated circuit from the substrate; a step of bonding a second impact resistance layer and a second impact diffusion layer to each other; a step of bonding the second impact diffusion layer bonded to the second impact resistance layer to the semiconductor integrated circuit separated from the substrate; and a step of forming a conductive layer covering (overlapping) the semiconductor integrated circuit, on a side opposite to one of the first impact diffusion layer and the second impact resistance layer, on which the semiconductor integrated circuit is not provided. The first impact diffusion layer and the second impact diffusion layer each have a lower modulus of elasticity and a higher breaking strength than the first impact resistance layer and the second impact resistance layer.

A method for manufacturing a semiconductor device, according to an embodiment of the present invention, includes a step of forming a semiconductor integrated circuit over a substrate with a separation layer interposed therebetween; a step of bonding a first impact resistance layer and a first impact diffusion layer to the semiconductor integrated circuit and the first impact resistance layer, respectively, and separating the semiconductor integrated circuit from the substrate; a step of forming a conductive layer on one of surfaces of a second impact diffusion layer; a step of bonding a second impact resistance layer and the conductive layer to each other; and a step of bonding the other surface of the second impact diffusion layer bonded to the second impact resistance layer to the semiconductor integrated circuit separated from the substrate. The first impact diffusion layer and the second impact diffusion layer each have a lower modulus of elasticity and a higher breaking strength than the first impact resistance layer and the second impact resistance layer.

The impact diffusion layer may be bonded to the semiconductor integrated circuit with the use of a bonding layer, and in that case, the bonding layer is between the semiconductor integrated circuit and the impact diffusion layer. Further, the impact resistance layer and the impact diffusion layer or the semiconductor integrated circuit may be bonded to each other by heat treatment and pressure treatment.

Note that according to an embodiment of the present invention, a semiconductor device refers to a device which can function by utilizing the semiconductor characteristics. By using an embodiment of the present invention, a semiconductor device having a circuit including a semiconductor element (such as a transistor, a memory element, or a diode), and a semiconductor device such as a chip including a processor circuit can be manufactured.

With the use of a conductive layer covering (overlapping) a semiconductor integrated circuit, electrostatic breakdown (malfunctions of the circuit or damages of a semiconductor element) due to electrostatic discharge of the semiconductor integrated circuit is prevented. Further, with the use of a pair of impact diffusion layers and impact resistance layers which sandwich the semiconductor integrated circuit, a highly reliable semiconductor device that is reduced in thickness and size and has tolerance can be provided. Further, shape defects and defective characteristics are prevented in the manufacturing process, so that a semiconductor device can be manufactured with high yield.

BRIEF DESCRIPTION OF DRAWINGS

In the accompanying drawings:

FIGS. 6A to 6E are views illustrating a method for manufacturing a semiconductor device;

FIGS. 7A to 7C are views illustrating a method for manufacturing a semiconductor device;

FIGS. 8A and 8B are views illustrating a method for manufacturing a semiconductor device;

FIGS. 29A to 29C are views illustrating a method for manufacturing a semiconductor device;

FIG. 37 is a graph showing evaluation results on reliability.

BEST MODE FOR CARRYING OUT THE INVENTION

Figure 1A:
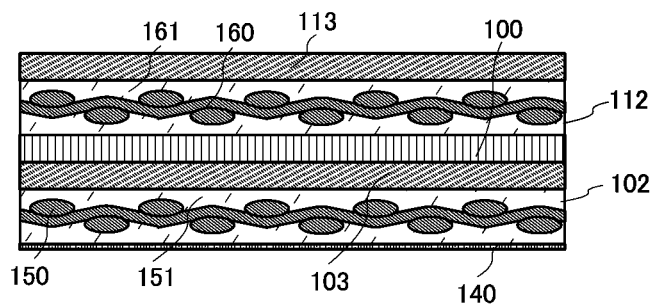
FIGS. 1A to 1C are views each illustrating a semiconductor device.

The embodiments and examples of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiments and examples. Note that a common reference numeral refers to the same part or a part having a similar function throughout the drawings in the structure of the present invention described below, and the description thereof is omitted.

(Embodiment 1)

In this embodiment, a highly reliable semiconductor device and a high-yield method for manufacturing a semiconductor device are described in detail with reference to FIGS. 1A to 1C, FIGS. 2A and 2B, and FIGS. 3A to 3D.

In a semiconductor device according to this embodiment, a semiconductor integrated circuit is separated from a substrate over which the semiconductor integrated circuit has been formed and is sandwiched between flexible impact resistance layers. Note that in this specification, the substrate over which the semiconductor integrated circuit has been formed is also referred to as a formation substrate. Thus, the semiconductor integrated circuit is formed over the formation substrate with a separation layer interposed therebetween.

Figure 1B:
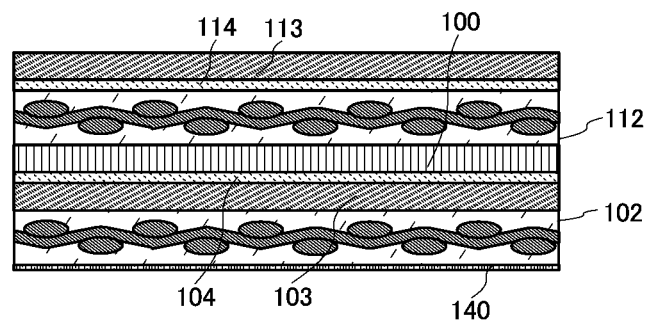

FIGS. 1A and 1B each illustrate a semiconductor device according to this embodiment. In FIG. 1A, a semiconductor integrated circuit 100 is sandwiched by a first impact resistance layer 112, a second impact resistance layer 102, a first impact diffusion layer 113, and a second impact diffusion layer 103. The second impact diffusion layer 103 is provided between the semiconductor integrated circuit 100 and the second impact resistance layer 102. A conductive layer 140 is provided on an outer side than the second impact resistance layer 102 (the side where the second impact diffusion layer 103 is not provided).

The conductive layer 140 is provided on an entire surface of a region overlapped with the semiconductor integrated circuit 100 so as to cover the semiconductor integrated circuit 100. That is to say, the conductive layer 140 is formed so as to cover (overlap) one surface of the semiconductor integrated circuit 100. Note that the conductive layer 140 is not electrically connected to the semiconductor integrated circuit 100. The conductive layer 140 diffuses static electricity applied by electrostatic discharge to let it go or prevents local electric charges (localization of electric charges) (prevents local potential difference), so that electrostatic breakdown of the semiconductor integrated circuit 100 can be prevented.

Figure 17A:
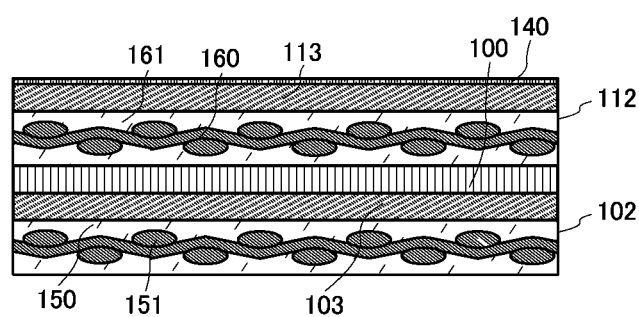
FIGS. 17A and 17B are views each illustrating a semiconductor device.
Figure 17B:
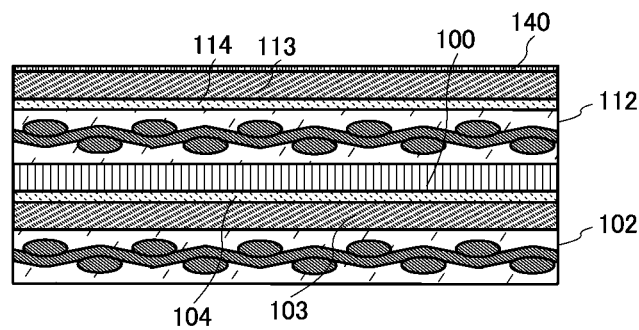

The conductive layer 140 may be provided so as to cover one of surfaces of the semiconductor integrated circuit 100; therefore, the conductive layer 140 may be provided on an outer side than the first impact resistance layer 112 (the side where the semiconductor integrated circuit 100 is not provided) as illustrated in FIGS. 17A and 17B. In the case where an antenna is formed in the structure of FIG. 17A or 17B, a surface on the side where the antenna is not provided has low tolerance for electrostatic discharge (ESD); therefore, the conductive layer 140 is preferably provided on the side opposite to the semiconductor integrated circuit 100, on which the antenna is not provided and the second impact diffusion layer 103 and the second impact resistance layer 102 are provided.

The conductive layer 140 is acceptable as long as it has conductivity. The conductive layer 140 with a small thickness preferably has a sheet resistance of $1.0 \times 10^2 \Omega/\square$ or more and $1.0 \times 10^7 \Omega/\square$ or less (more preferably, $1.0 \times 10^2 \Omega/\square$ or more and $1.0 \times 10^4 \Omega/\square$ or less).

The conductive layer 140 is formed using a material having a thickness small enough that radio waves to be sent and received by an antenna are transmitted. Accordingly, a highly reliable semiconductor device that has tolerance for electrostatic breakdown and can transmit and receive radio waves can be provided.

For the conductive layer 140, a film of metal, metal nitride, metal oxide, or the like, or a stack of the films can be used.

The conductive layer 140 may be formed using an element such as titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material, which contains any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film having conductivity, which is obtained by adding an impurity element to a semiconductor, or the like can be used. For example, a polycrystalline silicon film doped with an impurity element such as phosphorus can be used.

Still alternatively, a conductive macromolecule (also referred to as a conductive polymer) may be used for the conductive layer 140. As the conductive macromolecule, a so-called π-electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive macromolecule are as follows: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

An organic resin or a dopant (a halogen, a Lewis acid, an inorganic acid, an organic acid, a transition metal halide, an organic cyano compound, a nonionic surfactant, and the like) may be contained in the conductive layer 140 containing a conductive macromolecule.

The conductive layer 140 can be formed by a dry process such as a sputtering method, a plasma CVD method, or an evaporation method, or a wet process such as a coating method, a printing method, or a droplet discharge method (inkjet method). The thickness of the conductive layer is preferably larger than or equal to 5 nm and smaller than or equal to 200 nm.

Further, a protective layer may be stacked over the conductive layer 140. For example, it is preferable that a titanium film (with a thickness of from about 10 nm to about 50 nm) be formed as the conductive layer 140 and a titanium oxide film be stacked as a protective layer over the titanium film. Even in the case where the conductive layer 140 is provided on a surface of a semiconductor device, the conductive layer can be prevented from being degraded because a protective layer is formed on an outermost surface of the semiconductor device. The thickness of the protective layer may be from about 10 nm to about 200 nm.

For each of the first impact resistance layer 112 and the second impact resistance layer 102, a structure body in which a fibrous body is impregnated with an organic resin is used. The first impact resistance layer 112 is a structure body in which a fibrous body 160 is impregnated with an organic resin 161, and the second impact resistance layer 102 is a structure body in which a fibrous body 150 is impregnated with an organic resin 151.

The semiconductor integrated circuit 100 is provided so that a separation surface thereof is in contact with the second impact diffusion layer 103 and the other surface is in contact with the first impact resistance layer 112. The first impact diffusion layer 113 is provided on an outer side than the first impact resistance layer 112 (on the side where the semiconductor integrated circuit 100 is not provided), and the second impact resistance layer 102 is provided on an outer side than the second impact diffusion layer 103 (on the side where the semiconductor integrated circuit 100 is not provided).

Figure 1C:
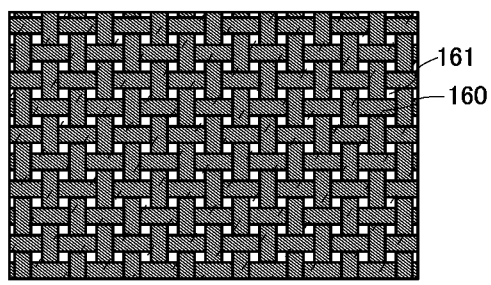

FIG. 1C illustrates a top view of a woven fabric as the fibrous body 160 which is woven using fiber yarn bundles for warp and weft.

As illustrated in FIG. 1C, the fibrous body 160 is woven using warp yarns spaced at regular intervals and weft yarns spaced at regular intervals. Such a fibrous body which is woven using the warp yarns and the weft yarns has regions without the warp yarns and the weft yarns. In the fibrous body 160, the fibrous body is more easily impregnated with the organic resin 161, whereby adhesiveness between the fibrous body 160 and the semiconductor integrated circuit can be increased.

Further, in the fibrous body 160, density of the warp yarns and the weft yarns may be high and a proportion of the regions without the warp yarns and the weft yarns may be low.

The structure body in which the fibrous body 160 is impregnated with the organic resin 161 is also referred to as a prepreg. A prepreg is formed specifically as follows: after a fibrous body is impregnated with a varnish in which a matrix resin is diluted with an organic solvent, drying is performed so that the organic solvent is volatilized and the matrix resin is semi-cured. The thickness of the structure body is preferably from 10 μm to 100 μm, more preferably from 10 μm to 30 μm. With the use of the structure body with such a thickness, a semiconductor device which is thin and can be bent can be formed. The impact resistance layer preferably has a modulus of elasticity of 13 GPa or more and a modulus of rupture of less than 300 MPa. For example, a prepreg with a modulus of elasticity of from 13 GPa to 15 GPa and a modulus of rupture of 140 MPa can be used for the impact resistance layer.

Note that the structure body in which a fibrous body is impregnated with an organic resin may have a layered structure. In that case, the structure body may be a stack of a plurality of structure bodies in each of which a single-layer fibrous body is impregnated with an organic resin or may be a structure body formed in which a plurality of fibrous bodies stacked are impregnated with an organic resin. Further, in stacking a plurality of structure bodies in each of which a single-layer fibrous body is impregnated with an organic resin, another layer may be sandwiched between the structure bodies.

A thermosetting resin such as an epoxy resin, an unsaturated polyester resin, a polyimide resin, a bismaleimide-triazine resin, or a cyanate resin can be used as the organic resin 161. Alternatively, a thermoplastic resin such as a polyphenylene oxide resin, a polyetherimide resin, or a fluorine resin can be used as the organic resin 161. Still alternatively, a plurality of resins selected from the above thermosetting resins and thermoplastic resins may be used as the organic resin 161. By using the above organic resin, the fibrous body can be bonded to the semiconductor integrated circuit by heat treatment. The higher the glass transition temperature of the organic resin 161 is, the less easily the organic resin 161 is damaged by local pressure, which is preferable.

Highly thermally-conductive filler may be dispersed in the organic resin 161 or yarn bundles of fibers. As the highly thermally-conductive filler, aluminum nitride, boron nitride, silicon nitride, alumina, and the like can be given. As the highly thermally-conductive filler, a metal particle such as silver or copper can also be given. In the case where the thermally-conductive filler is included in the organic resin or the yarn bundles of fibers, heat generated in the semiconductor integrated circuit can be easily released to the outside. Accordingly, thermal storage in the semiconductor device can be suppressed and thus the semiconductor device can be prevented from being damaged.

It is preferably that the fibrous body 160 is a woven or nonwoven fabric using high-strength fibers of an organic compound or an inorganic compound. The high-strength fiber is specifically a fiber with a high modulus of elasticity in tension or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, and a carbon fiber can be given. As a glass fiber, a glass fiber using E glass, S glass, D glass, Q glass, or the like can be given. Note that the fibrous body 160 may be formed from one kind of the above high-strength fibers or a plurality of the above high-strength fibers.

The fibrous body 160 may be a woven fabric which is woven using bundles of fibers (single yarns) (hereinafter the bundles of fibers are referred to as yarn bundles) for warp yarns and weft yarns, or a nonwoven fabric obtained by stacking yarn bundles of plural kinds of fibers randomly or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in cross section. Further, by using a loosely twisted yarn for the yarn bundle of fibers, the yarn bundle is easily flattened and has an elliptical shape or a flat shape in cross section. Using a yarn bundle having an elliptical shape or a flat shape in cross section in this manner can reduce the thickness of the fibrous body 160. Accordingly, the thickness of the structure body 160 can be reduced and thus a thin semiconductor device can be manufactured.

Note that in drawings of this embodiment, the fibrous body 160 is illustrated as a woven fabric which is plain-woven using a yarn bundle having an elliptical shape in cross section.

Further, in order to enhance permeability of an organic resin into the inside of the yarn bundle of fibers, the fiber may be subjected to surface treatment. For example, as the surface treatment, corona discharge treatment, plasma discharge treatment, or the like for activating a surface of the fiber can be given. Further, surface treatment using a silane coupling agent or a titanate coupling agent can be given.

Further, for the impact diffusion layer (each of the first impact diffusion layer and the second impact diffusion layer), a material that has a low modulus of elasticity and a high breaking strength is preferably used, and a film with rubber elasticity may be used. The impact diffusion layer preferably has a modulus of elasticity of from 5 GPa to 12 GPa and a modulus of rupture of 300 MPa or more.

The impact diffusion layer is preferably formed using a high-strength material. As typical examples of the high-strength material, a polyvinyl alcohol resin, a polyester resin, a polyamide resin, a polyethylene resin, an aramid resin, a polyparaphenylenebenzobisoxazole resin, a glass resin, and the like are given. By providing the impact diffusion layer formed using a high-strength material having elasticity, a load such as local pressure is diffused to and absorbed by the entire layer, so that the semiconductor device can be prevented from being damaged.

In more specific, for the impact diffusion layer, an aramid resin, a polyethylene naphthalate (PEN) resin, a polyethersulfone (PES) resin, a polyphenylene sulfide (PPS) resin, a polyimide (PI) resin, or the like may be used. In this embodiment, for the impact diffusion layer, an aramid resin film (with a modulus of elasticity of 10 GPa and a modulus of rupture of 480 MPa) is used.

FIG. 1B is an example in which the semiconductor integrated circuit 100 and the second impact diffusion layer 103 are bonded with a bonding layer 104 and the first impact resistance layer 112 and the first impact diffusion layer 113 are bonded with a bonding layer 114. In this embodiment, an aramid film and an acrylic resin are used for the second impact diffusion layer 103 and the bonding layer 104, respectively. The bonding layer 104 is acceptable as long as it can bond the impact diffusion layer and the semiconductor integrated circuit, and can be formed using a thermosetting resin, an ultraviolet curable resin, an acrylic resin, a urethane resin, an epoxy resin, a silicone resin, or the like. In the case where the first impact resistance layer 112 and the first impact diffusion layer 113 are bonded to each other by heat treatment and pressure treatment, the bonding layer 114 is not necessarily used. The thickness of the bonding layer may be from about 3 μm to about 15 μm.

Figure 2A:
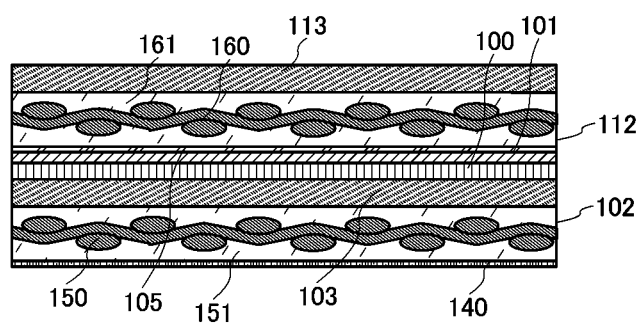
FIGS. 2A and 2B are views each illustrating a semiconductor device.
Figure 2B:
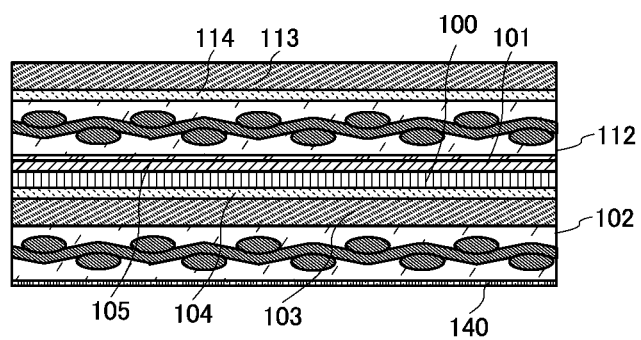

Further, a protective layer may be formed over the semiconductor integrated circuit. FIGS. 2A and 2B each illustrate an example in which an inorganic insulating layer 105 is formed as a protective layer over the semiconductor integrated circuit 100. Further, FIGS. 2A and 2B each illustrate an example in which an antenna 101 is formed over the semiconductor integrated circuit 100 and the inorganic insulating layer 105 is formed over the antenna 101. The inorganic insulating layer 105 covers the antenna 101, thereby preventing oxidation or the like of a conductive layer functioning as an antenna.

Figure 18A:
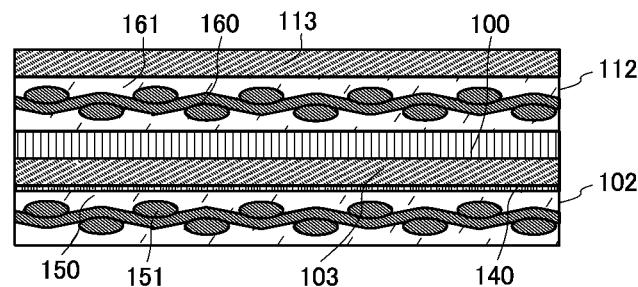
FIGS. 18A and 18B are views each illustrating a semiconductor device.

The conductive layer 140 is formed so as to cover (overlap) one surface of the semiconductor integrated circuit 100. In the case where the antenna 101 is provided, the conductive layer 140 is formed on the side opposite to the semiconductor integrated circuit 100, on which the antenna 101 is not provided (on the second impact resistance layer 102 side in FIG. 2A). Further, the conductive layer 140 may be provided between the second impact diffusion layer 103 and the second impact resistance layer 102 as illustrated in FIGS. 18A and 18B.

Figure 18B:
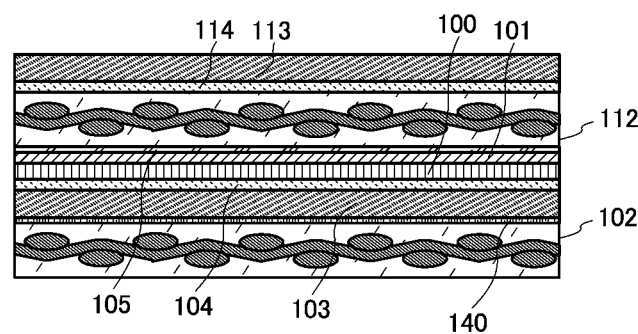

The side where the antenna is not provided has low tolerance for electrostatic discharge (ESD); therefore, the conductive layer 140 is provided opposite to the antenna 101 with the semiconductor integrated circuit 100 interposed between the conductive layer 140 and the antenna 101 as illustrated in FIG. 18B, so that a defect due to electrostatic breakdown can be reduced by the conductive layer 140.

The inorganic insulating layer 105 is formed to have a single-layer structure or a layered structure using an inorganic compound by a sputtering method, a plasma CVD method, a coating method, a printing method, or the like. As typical examples of an inorganic compound, oxide of silicon and nitride of silicon are given. As typical examples of oxide of silicon and nitride of silicon, silicon oxide, silicon oxynitride, silicon nitride, silicon nitride oxide, and the like are given. Note that in this specification, a silicon oxynitride film refers to a film that contains more oxygen than nitrogen. Further, a silicon nitride oxide film refers to a film that contains more nitrogen than oxygen.

Further, the inorganic insulating layer 105 may have a layered structure. For example, inorganic compounds may be stacked to form the inorganic insulating layer 105. Typically, two or more of silicon oxide, silicon nitride oxide, or silicon oxynitride may be stacked to form the inorganic insulating layer 105.

A method for manufacturing a semiconductor device, according to an embodiment of the present invention, is described with reference to FIGS. 3A to 3D. The semiconductor integrated circuit 100 is formed over a substrate 110 having an insulating surface, which is a formation substrate, with a separation layer 111 interposed therebetween (see FIG. 3A).

As the substrate 110, which is a formation substrate, a glass substrate, a quartz substrate, a sapphire substrate, a ceramic substrate, a metal substrate having an insulating layer on a surface thereof, or the like can be used. Alternatively, a plastic substrate which can withstand the process temperature of this embodiment may be used. In the manufacturing process of a semiconductor device, a formation substrate can be selected as appropriate in accordance with the process.

The separation layer 111 is formed to have a single-layer structure or a layered structure including a layer formed of an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy or compound material containing any of the elements as its main component by a sputtering method, a plasma CVD method, a coating method, a printing method, or the like. A layer containing silicon may have an amorphous structure, a microcrystalline structure, or a polycrystalline structure. Note that a coating method includes a spin-coating method, a droplet discharge method, and a dispensing method in its category here.

In the case where the separation layer 111 has a single-layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum corresponds to an alloy of tungsten and molybdenum.

In the case where the separation layer 111 has a layered structure, it is preferable that a tungsten layer, a molybdenum layer, or a layer containing a mixture of tungsten and molybdenum be formed as the first layer, and a layer containing oxide, nitride, oxynitride, or nitride oxide of tungsten, molybdenum, or a mixture of tungsten and molybdenum be formed as the second layer.

Note that in the case where the separation layer 111 is formed to have a layered structure including a layer containing tungsten and a layer containing oxide of tungsten, it may be utilized that the layer containing tungsten is formed first and an insulating layer formed of oxide is formed thereon so that a layer containing oxide of tungsten is formed at the interface between the tungsten layer and the insulating layer. Further, a surface of the layer containing tungsten may be subjected to thermal oxidation treatment, oxygen plasma treatment, or treatment using a strong oxidizing solution such as ozone water to form a layer containing oxide of tungsten. Further, plasma treatment or heat treatment may be performed in an atmosphere of oxygen, nitrogen, dinitrogen monoxide, an elementary substance of dinitrogen monoxide, or a mixed gas of the gas and another gas. The same applies to the case of forming a layer containing nitride, oxynitride, or nitride oxide of tungsten. After a layer containing tungsten is formed, a silicon nitride layer, a silicon oxynitride layer, or a silicon nitride oxide layer may be formed thereover.

Although the separation layer 111 is formed in contact with the substrate 110 according to the above step, the present invention is not limited to this step. An insulating layer to be a base may be formed in contact with the substrate 110, and the separation layer 111 may be provided in contact with the insulating layer.

The semiconductor integrated circuit 100 and the first impact resistance layer 112 are bonded to each other and the semiconductor integrated circuit 100 is separated from the substrate 110 along the separation layer 111. Accordingly, the semiconductor integrated circuit 100 is provided on the first impact resistance layer 112 side (see FIG. 3B).

In this embodiment, for the first impact resistance layer 112, the structure body in which the fibrous body 160 is impregnated with the organic resin 161 is used. The structure body is heated and subjected to pressure bonding so that the organic resin of the structure body is plasticized or cured. Note that in the case where the organic resin is plastic, the organic resin which is plasticized is then cured by cooling the organic resin to a room temperature. By heating and pressure bonding, the organic resin is uniformly spread so as to be in close contact with the semiconductor integrated circuit, and is cured. The step in which the structure body is subjected to pressure bonding is performed under an atmospheric pressure or a reduced pressure.

Note that a step of transferring the semiconductor integrated circuit to another substrate can be performed by any of the following methods as appropriate: a method in which a separation layer is formed between a substrate and a semiconductor integrated circuit, a metal oxide film is provided between the separation layer and the semiconductor integrated circuit, the metal oxide film is crystallized to be embrittled, and the semiconductor integrated circuit is separated; a method in which an amorphous silicon film containing hydrogen is provided between a substrate with high heat resistance and the semiconductor integrated circuit, the amorphous silicon film is removed by laser beam irradiation or etching, and the semiconductor integrated circuit is separated; a method in which a separation layer is formed between a substrate and a semiconductor integrated circuit, a metal oxide film is provided between the separation layer and the semiconductor integrated circuit, the metal oxide film is crystallized to be embrittled, part of the separation layer is removed by etching with a solution or a halogen fluoride gas such as $NF_3$, $BrF_3$, or $ClF_3$, and then the semiconductor integrated circuit is separated along the metal oxide film which has been embrittled; and a method in which a substrate provided with a semiconductor integrated circuit is mechanically cut or etched with a solution or a halogen fluoride gas such as $NF_3$, $BrF_3$, or $ClF_3$. Alternatively, a method in which a film containing nitrogen, oxygen, hydrogen, or the like (for example, an amorphous silicon film containing hydrogen, an alloy film containing hydrogen, or an alloy film containing oxygen) is used for a separation layer and the separation layer is irradiated with a laser beam so that nitrogen, oxygen, or hydrogen contained in the separation layer is discharged as a gas, whereby separation of the semiconductor integrated circuit from the substrate is facilitated may be employed.

By combining any of the above separating methods, the transferring step can be more easily performed. That is, separation may be performed by physical force (by a machine or the like) after the separation layer is irradiated with laser beam, etched by a gas, a solution, or the like or mechanically cut with a sharp knife so that the separation layer and the semiconductor integrated circuit are easily separated from each other.

Alternatively, a liquid may be made to permeate an interface between the separation layer and the semiconductor integrated circuit so that the semiconductor integrated circuit is separated from the formation substrate.

Similarly to the first impact resistance layer 112, the second impact resistance layer 102 is formed using the structure body in which the fibrous body 150 is impregnated with the organic resin 151. The structure bodies are heated and subjected to pressure bonding so that the second impact diffusion layer 103 and the second impact resistance layer 102 are bonded to each other. The bonding layer 104 is provided on a surface of the second impact diffusion layer 103, which is not provided with the second impact resistance layer 102.

The bonding layer 104 is bonded to the separation surface where the semiconductor integrated circuit 100 is exposed, and the semiconductor integrated circuit 100 and the second impact diffusion layer 103 are sandwiched between the first impact resistance layer 112 and the second impact resistance layer 102.

Figure 3A:
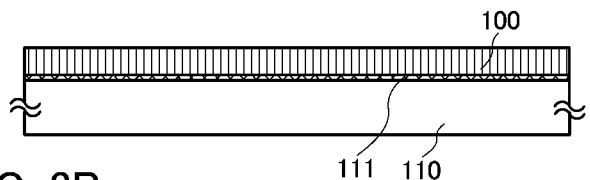
FIGS. 3A to 3D are views illustrating a method for manufacturing a semiconductor device.
Figure 3B:
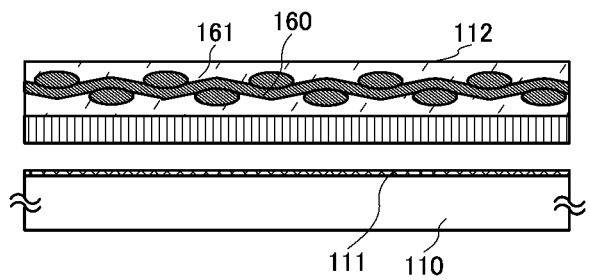
Figure 3C:
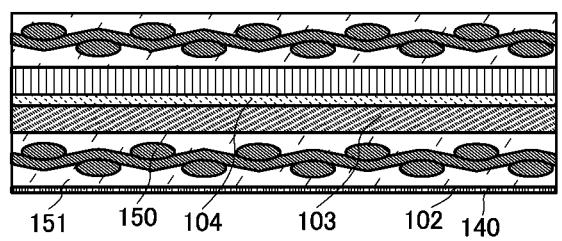

Next, the conductive layer 140 is formed on a surface of the second impact resistance layer 102 (see FIG. 3C). In this embodiment, a titanium film with a thickness of 10 nm is formed as the conductive layer 140 by a sputtering method.

Figure 3D:
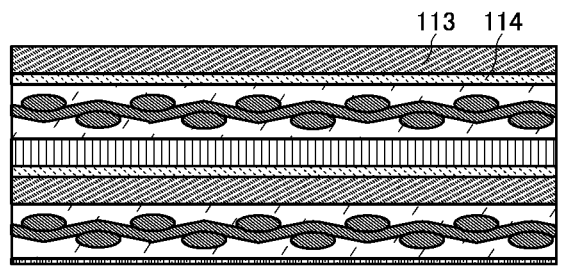

Further, the first impact diffusion layer 113 is bonded using the bonding layer 114 on a side opposite to the first impact resistance layer 112, on which the semiconductor integrated circuit 100 is not provided (see FIG. 3D).

The conductive layer 140 may be formed on an outer side than any of the first impact resistance layer 112, the second impact resistance layer 102, and the first impact diffusion layer 113, which are bonded to the semiconductor integrated circuit 100, or may be formed on an inner side than any of the second impact diffusion layer 103 and the first impact diffusion layer 113, which have not been bonded to the semiconductor integrated circuit 100 (on the semiconductor integrated circuit 100 side). In the case of employing the structure in which the conductive layer 140 is formed on an inner side than any of the second impact diffusion layer 103 and the first impact diffusion layer 113, which have not been bonded to the semiconductor integrated circuit 100 (on the semiconductor integrated circuit 100 side), and the conductive layer 140 is between the second impact diffusion layer 103 and the second impact resistance layer 102 or between the first impact diffusion layer 113 and the first impact resistance layer 112, degradation of the conductive layer, such as oxidation, duration, and crazing can be prevented since a surface of the conductive layer is not exposed.

Figure 16A:
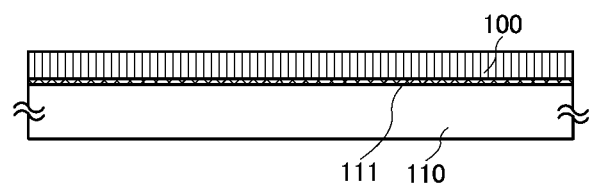
FIGS. 16A to 16C are views illustrating a method for manufacturing a semiconductor device.
Figure 16B:
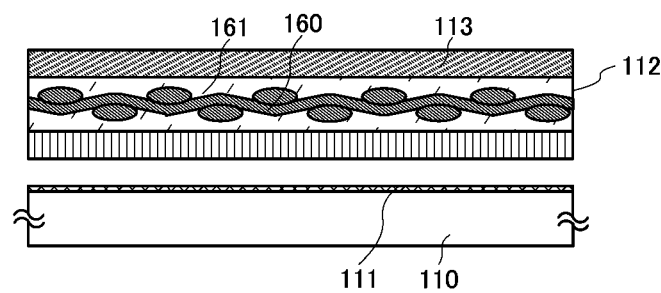
Figure 16C:
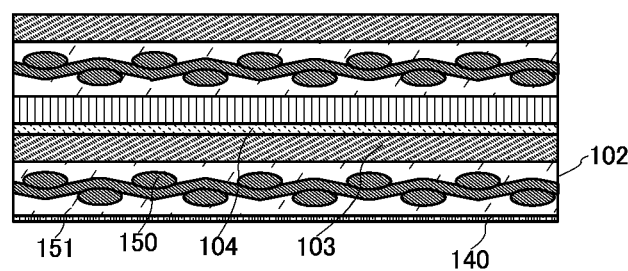

As illustrated in FIGS. 16A to 16C, the first impact diffusion layer 113 may be provided so as to be bonded to the first impact resistance layer 112 at the same time as the first impact resistance layer 112 and the semiconductor integrated circuit 100 are bonded to each other.

As in FIG. 3A, the semiconductor integrated circuit 100 is formed over the substrate 110 having an insulating surface, which is a formation substrate, with the separation layer 111 interposed therebetween (see FIG. 16A).

The first impact resistance layer 112 and the first impact diffusion layer 113 are formed over the semiconductor integrated circuit 100 and heat treatment and pressure treatment are performed so that the first impact resistance layer 112 and the first impact diffusion layer 113 are bonded to the semiconductor integrated circuit 100, and then the semiconductor integrated circuit 100, the first impact resistance layer 112, and the first impact diffusion layer 113 are separated from the substrate 110 along the separation layer 111 (see FIG. 16B). The bonding between the semiconductor integrated circuit 100 and the first impact resistance layer 112 and the bonding between the first impact resistance layer 112 and the first impact diffusion layer 113 may be performed in the same step or different steps.

The second impact diffusion layer 103 below which the second impact resistance layer 102 is stacked is bonded to the separation surface of the semiconductor integrated circuit 100 with use of the bonding layer 104, and the conductive layer 140 is formed on an outer side than the second impact resistance layer 102, so that a semiconductor device is manufactured (see FIG. 16C).

FIGS. 20A to 20C and FIGS. 21A to 21C illustrate an example in which the conductive layer 140 is formed over the first impact diffusion layer 113.

Figure 20A:
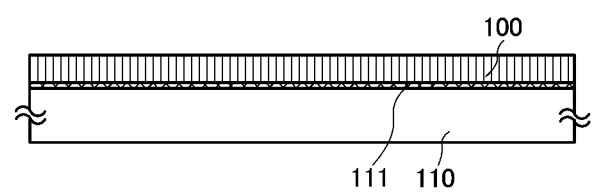
FIGS. 20A to 20C are views illustrating a method for manufacturing a semiconductor device.
Figure 20B:
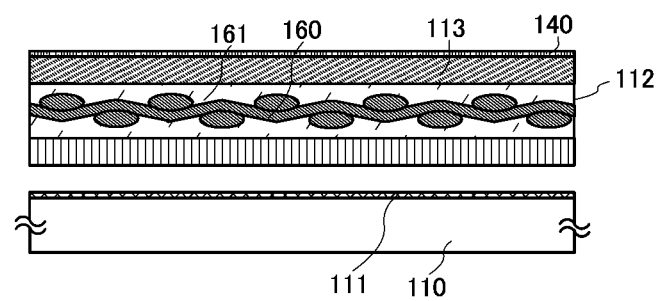
Figure 20C:
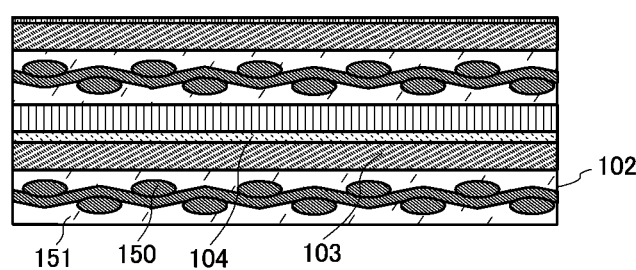

FIG. 20A corresponds to FIG. 3A, and the semiconductor integrated circuit 100 is formed over the substrate 110 with the separation layer 111 interposed therebetween. Next, the first impact resistance layer 112 and a surface of the first impact diffusion layer 113 provided with the conductive layer 140 in advance, on which the conductive layer 140 is not formed, are bonded by heat treatment and pressure treatment. The semiconductor integrated circuit 100 is bonded to the first impact resistance layer 112 and is separated from the substrate 110 along the separation layer 111 (see FIG. 20B). Then, the second impact diffusion layer 103 and the second impact resistance layer 102 are bonded to each other by heat treatment and pressure treatment, and the bonding layer 104 is bonded to the separation surface where the semiconductor integrated circuit 100 is exposed (see FIG. 20C). In FIG. 20C, the conductive layer 140 is provided on an outer side than the first impact diffusion layer 113 (on the side where the semiconductor integrated circuit is not provided).

Figure 21A:
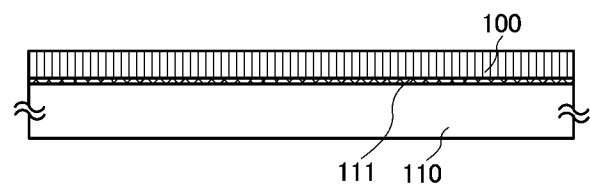
FIGS. 21A to 21C are views illustrating a method for manufacturing a semiconductor device.
Figure 21B:
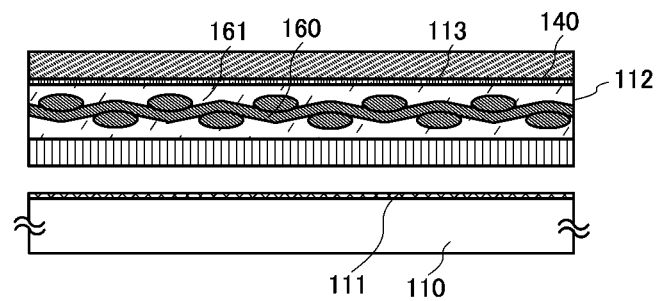
Figure 21C:
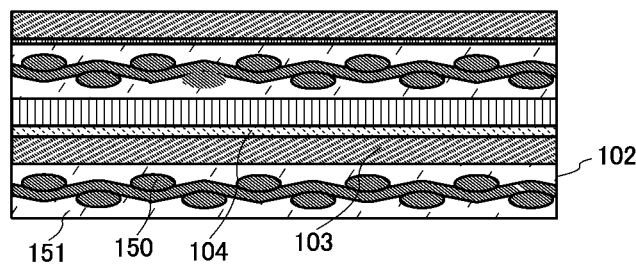

FIG. 21A also corresponds to FIG. 3A, and the semiconductor integrated circuit 100 is formed over the substrate 110 with the separation layer 111 interposed therebetween. Next, the first impact resistance layer 112 and a surface of the first impact diffusion layer 113 provided with the conductive layer 140 in advance, on which the conductive layer 140 is formed, are bonded by heat treatment and pressure treatment, so that the conductive layer 140 is provided between the first impact diffusion layer 113 and the first impact resistance layer 112. The semiconductor integrated circuit 100 is bonded to the first impact resistance layer 112 and is separated from the substrate 110 along the separation layer 111 (see FIG. 21B). Then, the second impact diffusion layer 103 and the second impact resistance layer 102 are bonded to each other by heat treatment and pressure treatment, and the bonding layer 104 is bonded to the separation surface where the semiconductor integrated circuit 100 is exposed (see FIG. 21C). In FIG. 21C, the conductive layer 140 is provided on an inner side than the first impact diffusion layer 113 (on the side where the semiconductor integrated circuit is not provided).

Since the impact diffusion layer is provided in contact with the semiconductor integrated circuit, even in the case of performing pressure treatment in the manufacturing process, the pressure treatment has no adverse effects such as damages and defective characteristics on the semiconductor integrated circuit. Therefore, a semiconductor device can be manufactured with high yield.

By the conductive layer covering the semiconductor integrated circuit, electrostatic breakdown (malfunctions of the circuit or damages of a semiconductor element) due to electrostatic discharge of the semiconductor integrated circuit can be prevented. Further, with the use of the pair of impact diffusion layers and the pair of impact resistance layers which sandwich the semiconductor integrated circuit, a highly reliable semiconductor device that is reduced in thickness and size and has tolerance can be provided. Further, shape defects and defective characteristics are prevented in the manufacturing process, so that a semiconductor device can be manufactured with high yield.

(Embodiment 2)

In this embodiment, another example of a semiconductor device achieving high level of reliability, according to the present invention, is described with reference to FIGS. 22A and 22B. In the structure of this embodiment described below, a common reference numeral refers to the same part or a part having a similar function throughout drawings, in Embodiment 1 and this embodiment, and the description thereof is omitted.

Figure 22A:
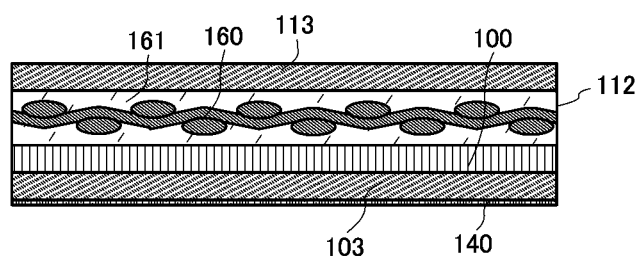
FIGS. 22A and 22B are views each illustrating a semiconductor device.
Figure 22B:
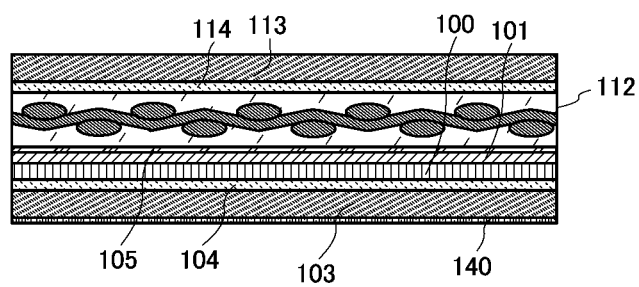

FIGS. 22A and 22B each illustrate a semiconductor device of this embodiment. In FIG. 22A, the semiconductor integrated circuit 100 is sandwiched between the second impact diffusion layer 103, and the first impact resistance layer 112 and the first impact diffusion layer 113, and the conductive layer 140 is provided on an outer side than the second impact diffusion layer 103 (on the side where the semiconductor integrated circuit 100 is not provided).

The conductive layer 140 may be provided on an outer side than the first impact diffusion layer 113 (on the side where the semiconductor integrated circuit 100 is not provided) or between the first impact diffusion layer 113 and the first impact resistance layer 112 as long as it covers one of surfaces of the semiconductor integrated circuit 100.

However, as illustrated in FIG. 22B, in the case of forming the antenna 101, the side where the antenna is not provided has low tolerance for electrostatic discharge (ESD); therefore, the conductive layer 140 is preferably provided on the side opposite to the semiconductor integrated circuit 100, on which the antenna is not provided and the second impact diffusion layer 103 is provided.

The conductive layer 140 is provided on an entire surface of a region overlapped with the semiconductor integrated circuit 100 so as to cover the semiconductor integrated circuit 100. That is to say, the conductive layer 140 is formed so as to cover (overlap) one surface of the semiconductor integrated circuit 100. The conductive layer 140 diffuses static electricity applied by electrostatic discharge to let it go or prevents local electric charges (localization of electric charges) (prevents local potential difference) so that electrostatic breakdown of the semiconductor integrated circuit 100 can be prevented.

Further, by providing the first impact resistance layer 112 against force externally applied to a semiconductor device (also referred to as external stress) and the first impact diffusion layer 113 and the second impact diffusion layer 103 which diffuse the force, the force applied locally can be reduced; therefore, damages, defective characteristics, and the like of the semiconductor device can be prevented.

With the use of the conductive layer covering the semiconductor integrated circuit, electrostatic breakdown (malfunctions of the circuit or damages of a semiconductor element) due to electrostatic discharge of the semiconductor integrated circuit is prevented. Further, with the use of the impact resistance layers and the impact diffusion layers which sandwich the semiconductor integrated circuit, a highly reliable semiconductor device that is reduced in thickness and size and has tolerance can be provided.

(Embodiment 3)

In this embodiment, another example of a semiconductor device achieving high level of reliability, according to the present invention, is described with reference to FIGS. 19A and 19B. In the structure of this embodiment described below, a common reference numeral refers to the same part or a part having a similar function throughout drawings in Embodiment 1 and this embodiment, and the description thereof is omitted.

Figure 19A:
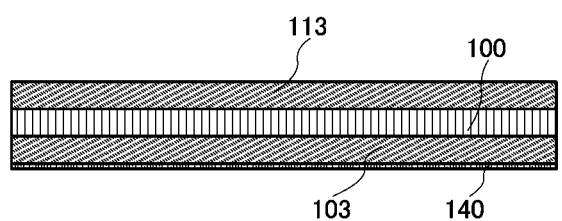
FIGS. 19A and 19B are views illustrating a semiconductor device.
Figure 19B:
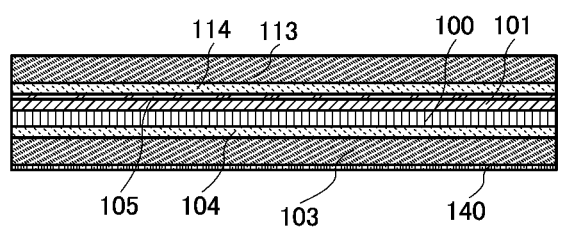

FIGS. 19A and 19B each illustrate a semiconductor device of this embodiment.

In FIG. 19A, the semiconductor integrated circuit 100 is sandwiched between the first impact diffusion layer 113 and the second impact diffusion layer 103, and the conductive layer 140 is provided on an outer side than the second impact diffusion layer 103.

The conductive layer 140 may be provided on an outer side than the first impact diffusion layer 113 (on the side where the semiconductor integrated circuit 100 is not provided) as long as it covers one of surfaces of the semiconductor integrated circuit 100.

However, as illustrated in FIG. 19B, in the case of forming the antenna 101, the side where the antenna is not provided has low tolerance for electrostatic discharge (ESD); therefore, the conductive layer 140 is preferably provided on the side opposite to the semiconductor integrated circuit 100, on which the antenna is not provided and the second impact diffusion layer 103 and the second impact resistance layer 102 are provided.

The conductive layer 140 is provided on an entire surface of a region overlapped with the semiconductor integrated circuit 100 so as to cover the semiconductor integrated circuit 100. That is to say, the conductive layer 140 is formed so as to cover (overlap) one surface of the semiconductor integrated circuit 100. The conductive layer 140 diffuses static electricity applied by electrostatic discharge to let it go or prevents local electric charges (localization of electric charges) (prevents local potential difference) so that electrostatic breakdown of the semiconductor integrated circuit 100 can be prevented.

Further, by providing the first impact diffusion layer 113 and the second impact diffusion layer 103 which diffuse force externally applied to a semiconductor device (also referred to as external stress), the force applied locally can be reduced; therefore, damages, defective characteristics, and the like of the semiconductor device can be prevented.

With the use of the conductive layer covering the semiconductor integrated circuit, electrostatic breakdown (malfunctions of the circuit or damages of a semiconductor element) due to electrostatic discharge of the semiconductor integrated circuit is prevented. Further, with the use of the impact diffusion layers which sandwich the semiconductor integrated circuit, a highly reliable semiconductor device that is reduced in thickness and size and has tolerance can be provided.

(Embodiment 4)

In this embodiment, a highly reliable semiconductor device and a high-yield method for manufacturing a semiconductor device are described in detail with reference to FIGS. 4A to 4C and FIGS. 5A to 5C. In this embodiment, a CMOS (complementary metal oxide semiconductor) is described as an example of the semiconductor device.

Figure 4A:
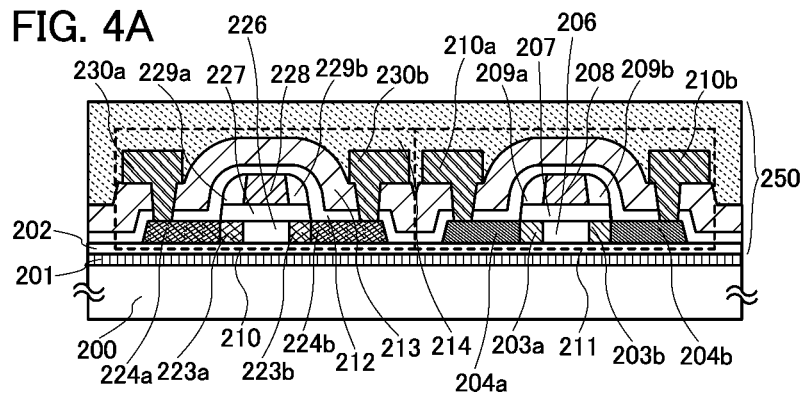
FIGS. 4A to 4C are views illustrating a method for manufacturing a semiconductor device.

Transistors 210 and 211 and insulating films 212, 213, and 214 are provided over a substrate 200 having an insulating surface, which is a formation substrate, with a separation layer 201 interposed therebetween, so that a semiconductor integrated circuit 250 is formed (see FIG. 4A).

The transistor 210 is a thin film transistor and includes a source and drain regions 224a and 224b, impurity regions 223a and 223b whose concentrations are lower than those of the source and drain regions 224a and 224b, a channel formation region 226, a gate insulating layer 227, a gate electrode layer 228, and insulating layers 229a and 229b which have a side-wall structure. The source and drain regions 224a and 224b are in contact with and electrically connected to wiring layers 230a and 230b respectively which function as a source electrode layer and a drain electrode layer. In this embodiment, the transistor 210 is a p-channel thin film transistor and the source and drain regions 224a and 224b and the impurity regions 223a and 223b which are LDD (lightly doped drain) regions include impurity elements imparting p-type conductivity (such as boron (B), aluminum (Al), or gallium (Ga)).

The transistor 211 is a thin film transistor and includes a source and drain regions 204a and 204b, impurity regions 203a and 203b whose concentrations are lower than those of the source and drain regions 204a and 204b, a channel formation region 206, a gate insulating layer 207, a gate electrode layer 208, and insulating layers 209a and 209b which have a sidewall structure. The source and drain regions 204a and 204b are in contact with and electrically connected to wiring layers 210a and 210b respectively which function as a source electrode layer and a drain electrode layer. In this embodiment, the transistor 211 is an n-channel thin film transistor and the source and drain regions 204a and 204b and the impurity regions 203a and 203b which are LDD (lightly doped drain) regions include impurity elements imparting n-type conductivity (such as phosphorus (P) or arsenic (As)).

For a first impact resistance layer 262, a structure body in which a fibrous body 280 is impregnated with an organic resin 281 is used. The semiconductor integrated circuit 250 and the first impact resistance layer 262 are bonded to each other and then are separated from the substrate 200 along the separation layer 201. Accordingly, the semiconductor integrated circuit 250 is provided on the first impact resistance layer 262 side (see FIGS. 4B and 4C).

Similarly to the first impact resistance layer 262, a second impact resistance layer 252 is formed using the structure body in which a fibrous body 270 is impregnated with an organic resin 271. The structure body is heated and subjected to pressure bonding so that the second impact resistance layer 252 and an impact diffusion layer 253 provided with a conductive layer 260 are bonded to each other (see FIG. 5B). The impact diffusion layer 253 is provided with the conductive layer 260 before being bonded to the second impact resistance layer 252. The bonding layer 254 is provided on a surface of the impact diffusion layer 253, which is not provided with the second impact resistance layer 252.

The conductive layer 260 is provided on an entire surface of a region overlapped with the semiconductor integrated circuit 250 so as to cover the semiconductor integrated circuit 250. That is to say, the conductive layer 260 is formed so as to cover (overlap) one surface of the semiconductor integrated circuit 250. The conductive layer 260 diffuses static electricity applied by electrostatic discharge to let it go or prevents local electric charges (localization of electric charges) (prevents local potential difference) so that electrostatic breakdown of the semiconductor integrated circuit 250 can be prevented.

Figure 5A:
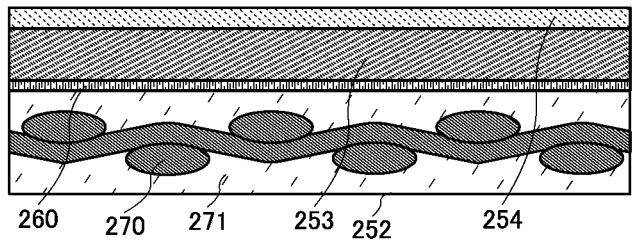
FIGS. 5A to 5C are views illustrating a method for manufacturing a semiconductor device.
Figure 5B:
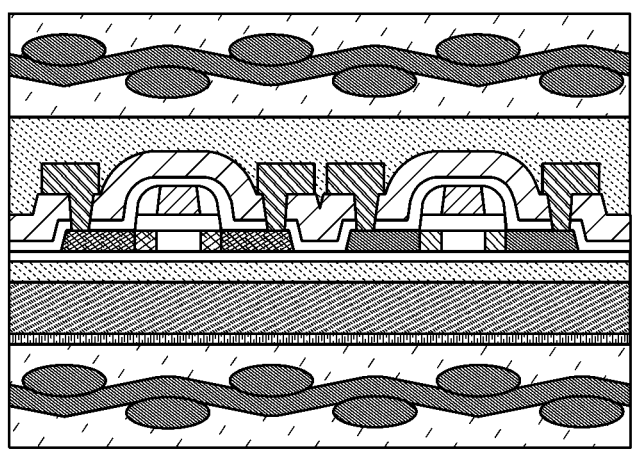
Figure 5C:
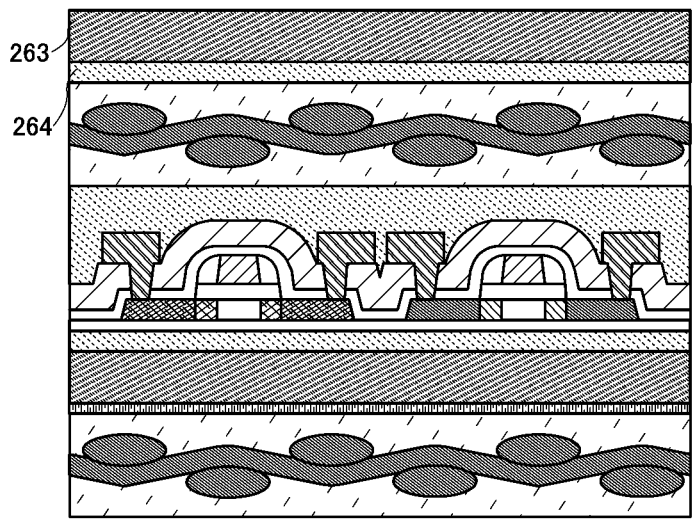
Figure 9A:
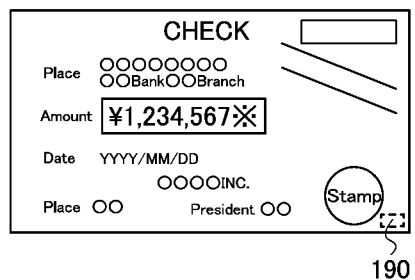
FIGS. 9A to 9G are diagrams each illustrating an application example of a semiconductor device.
Figure 9B:
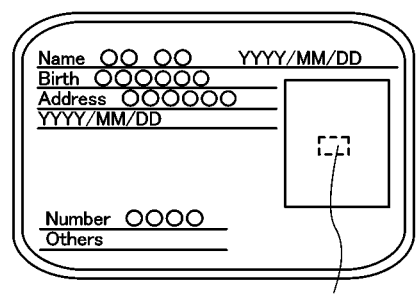
Figure 9C:
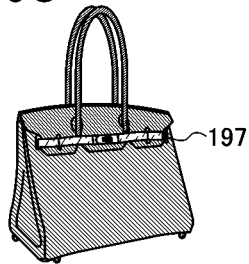
Figure 9D:
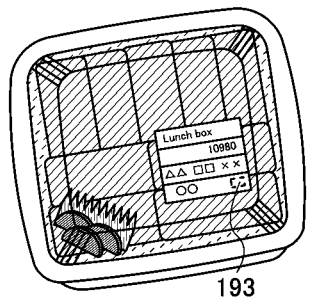
Figure 9E:
Figure 9F:
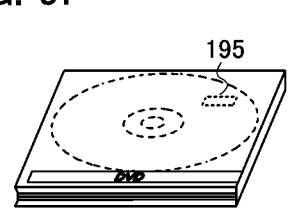
Figure 9G:
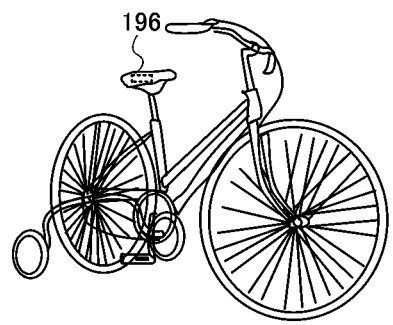

The bonding layer 254 is bonded to a separation surface where the semiconductor integrated circuit 250 is exposed (see FIG. 5B). Further, a first impact diffusion layer 263 is bonded using a bonding layer 264 on the side opposite to the first impact resistance layer 262, on which the semiconductor integrated circuit 250 is not provided, so that a semiconductor device including the semiconductor integrated circuit 250 sandwiched by the first impact resistance layer 262, the second impact resistance layer 252, the first impact diffusion layer 263, and the second impact diffusion layer 253 (see FIG. 5C).

Since the impact diffusion layer is provided in contact with the semiconductor integrated circuit, even in the case of performing pressure treatment in the manufacturing process, the pressure treatment has no adverse effects such as damages and defective characteristics on the semiconductor integrated circuit. Therefore, a semiconductor device can be manufactured with high yield.

With the use of the pair of impact resistance layers which sandwich the semiconductor integrated circuit and the impact diffusion layer stacked below the semiconductor integrated circuit, a highly reliable semiconductor device that is reduced in thickness and size and has tolerance can be provided.

The semiconductor device manufactured in this embodiment can have flexibility with the use of flexible impact resistance layers and flexible impact diffusion layers.

Semiconductor layers included in the transistors 210 and 211 can be formed using any of the following materials: an amorphous semiconductor (hereinafter also referred to as "AS") manufactured by a vapor-phase growth method or a sputtering method using a semiconductor material gas typified by silane or germane; a polycrystalline semiconductor formed by crystallizing the amorphous semiconductor with the use of light energy or thermal energy; a microcrystalline (also referred to as semiamorphous or microcrystal) semiconductor (hereinafter also referred to as "SAS"); or the like. The semiconductor layer can be formed by a sputtering method, an LPCVD method, a plasma CVD method, or the like.

The microcrystalline semiconductor film belongs to a metastable state which is intermediate between an amorphous state and a single crystal state when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a lower wavenumber than 520 $cm^{-1}$ which represents a peak of the Raman spectrum of single crystal silicon. That is to say, a peak of a Raman spectrum of microcrystalline silicon lies between 520 $cm^{-1}$ and 480 $cm^{-1}$ which represent that of single crystal silicon and that of amorphous silicon, respectively. The microcrystalline semiconductor film contains hydrogen or halogen of at least 1 at. % to terminate dangling bonds. Further, a rare gas element such as helium, argon, krypton, or neon may be contained to further promote lattice distortion, so that stability is enhanced and a favorable microcrystalline semiconductor film can be obtained.

The microcrystalline semiconductor film can be formed by a high-frequency plasma CVD method with a frequency of several tens of MHz to several hundred MHz or a microwave plasma CVD apparatus with a frequency of 1 GHz or more. The microcrystalline semiconductor film can be typically formed using silicon hydride such as $SiH_4$, $Si_2H_6$, $SiH_2Cl_2$, $SiHCl_3$, $SiCl_4$, or $SiF_4$ which is diluted with hydrogen. Alternatively, with a dilution with one or plural kinds of rare gas elements selected from helium, argon, krypton, and neon in addition to silicon hydride and hydrogen, the microcrystalline semiconductor film can be formed. In that case, the flow ratio of hydrogen to silicon hydride is set to be from 5:1 to 200:1, preferably, from 50:1 to 150:1, more preferably, 100:1.

Hydrogenated amorphous silicon may be typically used as an amorphous semiconductor, while polysilicon and the like may be typically used as a crystalline semiconductor. As examples of polysilicon (polycrystalline silicon), so-called high-temperature polysilicon which contains polysilicon as a main component and is formed at a process temperature of 800° C. or higher, so-called low-temperature polysilicon that contains polysilicon as a main component and is formed at a process temperature of 600° C. or lower, polysilicon obtained by crystallizing amorphous silicon by using an element promoting crystallization or the like, and the like are given. It is needles to say that as mentioned above, a microcrystalline semiconductor or a semiconductor containing a crystal phase in part of a semiconductor layer may be used.

As a material of the semiconductor, as well as elementary substance of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of any of the above oxide semiconductors, or the like may be used. For example, an oxide semiconductor formed of ZnO, indium oxide, and gallium oxide may be used. In the case of using ZnO for the semiconductor layer, a gate insulating layer is preferably formed using $Y_2O_3$, $Al_2O_3$, $TiO_2$, or a stack of any of the above. For the gate electrode layer, the source electrode layer, and the drain electrode layer, ITO, Au, Ti, or the like is preferably used. Alternatively, ZnO to which In, Ga, or the like is added may be used.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization, such as nickel). Further, a microcrystalline semiconductor which is an SAS may be crystallized by laser irradiation to enhance crystallinity. In the case where the element promoting crystallization is not introduced, before irradiating the amorphous silicon film with a laser beam, hydrogen is released until the concentration of hydrogen contained in the amorphous silicon film becomes $1 \times 10^{20}$ atoms/$cm^3$ or less by heating the amorphous silicon film at a temperature of 500° C. for one hour in a nitrogen atmosphere. This is because the amorphous silicon film containing a high amount of hydrogen is destroyed when being irradiated with a laser beam.

A method for introducing a metal element into the amorphous semiconductor layer is not particularly limited as long as it is capable of introducing the metal element to a surface of or inside the amorphous semiconductor layer. For example, a sputtering method, a CVD method, a plasma treatment method (including a plasma CVD method), an adsorption method, or a method for applying a solution of metal salt can be used. Among them, a method of using a solution is simple and advantageous in that the concentration of the metal element can be easily controlled. At this time, it is desirable to form an oxide film by ultraviolet irradiation in an oxygen atmosphere, a thermal oxidation method, treatment with either ozone water containing hydroxyl radicals or hydrogen peroxide, or the like to improve wettability of the surface of the amorphous semiconductor layer so that an aqueous solution is diffused on the entire surface of the amorphous semiconductor layer.

In a crystallization step in which an amorphous semiconductor layer is crystallized to form a crystalline semiconductor layer, an element promoting crystallization (also referred to as a catalytic element or a metal element) may be added to the amorphous semiconductor layer and crystallization may be performed by heat treatment (at 550 to 750° C. for 3 minutes to 24 hours). The element promoting crystallization can be one or more of elements such as iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element promoting crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used; for example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed on the crystalline semiconductor layer containing the element promoting crystallization, and heat treatment (at 550 to 750° C. for 3 minutes to 24 hours) is performed. The element promoting crystallization, which is contained in the crystalline semiconductor layer, moves into the semiconductor layer containing a rare gas element and thus, the element promoting crystallization, which is contained in the crystalline semiconductor layer, is removed or reduced. After that, the semiconductor layer containing a rare gas element, which has served as a gettering sink, is removed.

An amorphous semiconductor layer may be crystallized by the combination of heat treatment and laser beam irradiation, or one of heat treatment and laser beam irradiation may be performed a plurality of times.

A crystalline semiconductor layer may be directly formed on a substrate by a plasma method. Alternatively, the crystalline semiconductor film may be selectively formed over a substrate by a plasma method.

Each of the gate insulating layers 207 and 227 may be formed using silicon oxide or may be formed to have a layered structure including silicon oxide and silicon nitride. Each of the gate insulating layers 207 and 227 may be formed by depositing an insulating film by a plasma CVD method or a low pressure CVD method or may be formed by solid-phase oxidation or solid-phase nitridation by plasma treatment. This is because a gate insulating layer which is formed using a single crystal semiconductor layer which is oxidized or nitrided by plasma treatment is dense, has high withstand voltage, and is excellent in reliability. For example, a surface of the semiconductor layer is oxidized or nitrided using nitrous oxide ($N_2O$) diluted with Ar by 1 to 3 times (flow ratio) by application of microwave (2.45 GHz) power of 3 to 5 kW at a pressure of 10 to 30 Pa. By this treatment, an insulating film with a thickness of 1 to 10 nm (preferably, 2 to 6 nm) is formed. Further, nitrous oxide ($N_2O$) and silane ($SiH_4$) are introduced and microwave (2.45 GHz) electric power of 3 to 5 kW is applied to the insulating film at a pressure of 10 to 30 Pa to form a silicon oxynitride film by a vapor-phase growth method, which is to be a gate insulating layer. With a combination of a solid-phase reaction and a reaction by a vapor-phase growth method, the gate insulating layer with low interface state density and an excellent withstand voltage can be formed.

As the gate insulating layers 207 and 227, a high dielectric constant material such as zirconium dioxide, hafnium oxide, titanium dioxide, or tantalum pentoxide may be used. By using a high dielectric constant material for the gate insulating layers 207 and 227, a gate leakage current can be reduced.

The gate electrode layers 208 and 228 can be formed using a CVD method, a sputtering method, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Alternatively, a semiconductor film typified by a polycrystalline silicon film doped with an impurity element such as phosphorus, or an AgPdCu alloy may be used. Further, either a single-layer structure or a multi-layer structure may be employed; for example, a two-layer structure of a tungsten nitride film and a molybdenum film may be employed or a three-layer structure in which a tungsten film with a thickness of 50 nm, a film of an aluminum-silicon (Al—Si) alloy with a thickness of 500 nm, and a titanium nitride film with a thickness of 30 nm are stacked in this order may be employed. In the case of the three-layer structure, a tungsten nitride film may be used instead of the tungsten film as the first conductive film, an aluminum-titanium (Al—Ti) alloy film may be used instead of the aluminum-silicon (Al—Si) alloy film as the second conductive film, and a titanium film may be used instead of the titanium nitride film as the third conductive film.

As each of the gate electrode layers 208 and 228, a light-transmitting material which transmits visible light may be used. As a light-transmitting conductive material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

In the case where etching processing is needed to form the gate electrode layers 208 and 228, a mask may be formed and dry etching or wet etching may be performed. The electrode layers can be etched to have a tapered shape by using an ICP (inductively coupled plasma) etching method and appropriately controlling the etching condition (the amount of electric power applied to a coiled electrode, the amount of electric power applied to an electrode on a substrate side, the temperature of the electrode on the substrate side, or the like). Note that as an etching gas, a chlorine-based gas typified by $Cl_2$, $BCl_3$, $SiCl_4$, $CCl_4$, and the like; a fluorine-based gas typified by $CF_4$, $SF_6$, $NF_3$, and the like; or $O_2$ can be used as appropriate.

The insulating layers 209a, 209b, 229a, and 229b having a sidewall structure may be formed in a self-aligned manner by forming an insulating layer, which covers the gate electrode layers and the semiconductor layers, and processing the insulating layer by anisotropic etching of an RIE (reactive ion etching) method. Here, there is no particular limitation on the insulating layers, and the insulating layers are preferably layers of silicon oxide with favorable step coverage, which are formed by reacting TEOS (tetraethyl orthosilicate), silane, or the like with oxygen, nitrous oxide, or the like. The insulating layer can be formed by a thermal CVD method, a plasma CVD method, a normal pressure CVD method, a bias ECR CVD method, a sputtering method, or the like.

Although a transistor having a single-gate structure is described in this embodiment, a transistor having a multi-gate structure such as a double-gate structure may alternatively be employed. In this case, gate electrode layers may be provided above and below the semiconductor layer or a plurality of gate electrode layers may be provided only on one side of (above or below) the semiconductor layer.

Alternatively, silicides may be provided over the source and drain regions of the transistor. The silicides are formed by forming conductive films on the source and drain regions of the semiconductor layer and reacting silicon included in the source and drain regions of the semiconductor layer with the conductive films by heat treatment, a GRTA method, an LRTA method, or the like. Alternatively, the silicides may be formed by laser irradiation or light irradiation using a lamp. As a material used for forming the silicide, any of the followings can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like.

The wiring layers 210a, 210b, 230a, and 230b each function as a source electrode layer or a drain electrode layer can be formed by depositing a conductive film by a PVD method, a CVD method, an evaporation method, or the like, and then etching the conductive film such that it has desired shapes. Alternatively, the wiring layer can be formed selectively at a predetermined place by a printing method, an electroplating method, or the like. Alternatively, a reflow method or a damascene method may be used. As a material of the wiring layers 210a, 210b, 230a, and 230b, metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof can be used. Alternatively, a light-transmitting material may be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide (SnO2), indium oxide containing tungsten oxide, indium zinc oxide containing tungsten oxide, indium oxide containing titanium oxide, indium tin oxide containing titanium oxide, or the like can be used.

For each of the insulating films 212, 213, and 214, an inorganic insulating material such as silicon oxide, silicon nitride, silicon oxynitride, aluminum oxide, aluminum nitride, or aluminum oxynitride can be used.

Since the impact diffusion layer is provided in contact with the semiconductor integrated circuit, even in the case of performing pressure treatment in the manufacturing process, the pressure treatment has no adverse effects such as damages and defective characteristics on the semiconductor integrated circuit. Therefore, a semiconductor device can be manufactured with high yield.

By the conductive layer covering the semiconductor integrated circuit, electrostatic breakdown (malfunctions of the circuit or damages of a semiconductor element) due to electrostatic discharge of the semiconductor integrated circuit can be prevented. Further, with the use of the pair of impact diffusion layers and the pair of impact resistance layers which sandwich the semiconductor integrated circuit, a highly reliable semiconductor device that is reduced in thickness and size and has tolerance can be provided. Further, shape defects and defective characteristics are prevented in the manufacturing process, so that a semiconductor device can be manufactured with high yield.

The semiconductor device according to an embodiment of the present invention can be applied to a storage element or the like using a semiconductor layer as well as a field effect transistor, as a semiconductor element, so that semiconductor devices having functions necessary for a variety of uses can be manufactured and provided.

(Embodiment 5)

In this embodiment, one example of a semiconductor device having a memory is described according to a semiconductor device aimed at increase in integration and reduction in thickness and size, and a manufacturing method thereof with reference to FIGS. 6A to 6E, FIGS. 7A to 7C, and FIGS. 8A and 8B.

A semiconductor device of this embodiment has a memory including a memory cell array and a driver circuit portion which drives the memory cell array.

A separation layer 301 is formed over a substrate 300 which is a formation substrate having an insulating surface, and an insulating film 302 which serves as a base film is formed over the separation layer 301.

Then, a semiconductor film is formed over the insulating film 302. The semiconductor film may be formed by a method (a sputtering method, an LPCVD method, a plasma CVD method, or the like) to a thickness of 25 nm to 200 nm (preferably, 30 nm to 150 nm).

In this embodiment, an amorphous semiconductor film is formed over the insulating film 302, and the amorphous semiconductor film is crystallized by laser irradiation; accordingly, a semiconductor film that is a crystalline semiconductor film is formed.

The semiconductor film obtained in this manner is selectively doped with the slight amount of an impurity element (boron or phosphorus) for controlling threshold voltage of a thin film transistor. This doping of impurity element may be performed against the amorphous semiconductor film before crystallization. When the amorphous semiconductor film is doped with an impurity element, the impurity element can be activated by thermal treatment for crystallization later. Further, defects and the like generated at the doping can be reduced as well.

Next, the semiconductor film is shaped into a desired form using a mask. In this embodiment, after an oxide film formed on the semiconductor film is removed, another oxide film is formed. Then, a photomask is formed, and semiconductor layers 303, 304, 305, and 306 are formed by processing using a photolithography method. For end portions of the semiconductor layers, inclination angles (taper angles) may be provided.

The etching may be carried out by either plasma etching (dry etching) or wet etching. For treating a large-sized substrate, plasma etching is suitable. As an etching gas, a gas containing fluorine or chlorine such as $CF_4$, $NF_3$, $Cl_2$, or $BCl_3$ is used, and an inert gas such as He or Ar may be added thereto, appropriate. If the etching is carried out utilizing atmospheric pressure discharge, electric discharge machining can be carried out locally, and a mask does not need to be formed over the entire surface of the substrate.

An insulating film 310 is formed over the semiconductor layer 305. The insulating film 310 may be formed using silicon oxide or a layered structure of silicon oxide and silicon nitride. The insulating film 310 may be formed by deposition of an insulating layer by a plasma CVD method or a low pressure CVD method; however, the insulating film 310 is preferably formed by solid-phase oxidation or solid-phase nitridation with plasma treatment. This is because an insulating layer which is formed through oxidation or nitridation of the semiconductor layer (typically, a silicon layer) by plasma treatment has a dense film quality, high withstand voltage, and high reliability. The insulating film 310 is used as a tunnel insulating layer for injecting charges into a charge accumulation layer 311; therefore, a strong insulating film is preferable. This insulating film 310 is preferably formed to a thickness of 1 nm to 20 nm, and more preferably, 3 nm to 6 nm.

The insulating film 310 is preferably formed by plasma treatment in such a way that, for example, a silicon oxide layer is formed to a thickness of 3 nm to 6 nm over the semiconductor layer by plasma treatment under an oxygen atmosphere, and a nitrogen-plasma-treated layer is formed by treating the surface of the silicon oxide layer with nitrogen plasma under a nitrogen atmosphere. Specifically, first, a silicon oxide layer with a thickness of 3 nm to 6 nm is formed over the semiconductor layer by plasma treatment under an oxygen atmosphere. Subsequently, a nitrogen-plasma-treated layer with a high concentration of nitrogen is formed over the surface or near the surface of the silicon oxide layer by performance of plasma treatment under a nitrogen atmosphere successively. Note that "near the surface" refers to a depth of approximately 0.5 nm to 1.5 nm from a surface of the silicon oxide layer. For example, by conducting plasma treatment under a nitrogen atmosphere, a structure is obtained in which the silicon oxide layer contains 20 atomic % to 50 atomic % nitrogen in a region from the surface to a depth of about 1 nm.

A surface of a silicon layer as a typical example of the semiconductor layer is oxidized by plasma treatment, whereby a dense oxide layer that has no distortion in an interface can be formed. In addition, through nitridation by plasma treatment of the oxide layer, oxygen on a portion of a surface is replaced with nitrogen and a nitrogen layer is formed, whereby the layer can be made even denser. Consequently, an insulating layer which is high in withstand voltage can be formed.

In any case, through such solid-phase oxidation or solid-phase nitridation by the plasma treatment, even if a glass substrate with a heat resistance temperature of 700° C. or lower is used, an insulating layer equal to a thermal oxidation film that is formed at a temperature of from 950° C. to 1050° C. can be obtained. That is, a tunnel insulating layer having high reliability can be formed as the tunnel insulating layer of the nonvolatile memory element.

The charge accumulation layer 311 is formed over the insulating film 310. This charge accumulation layer 311 may have a single-layer structure or a layered structure.

The charge accumulation layer 311 can be a floating gate formed using a layer or particles of a semiconductor material or a conductive material. As the semiconductor material, silicon, silicon germanium, and the like can be given. When silicon is used, amorphous silicon or polysilicon can be used. Further, polysilicon doped with phosphorus can also be used. As the conductive material, an element such as tantalum (Ta), titanium (Ti), molybdenum (Mo), and tungsten (W); an alloy containing the above element as a main component; an alloy film in which the above elements are combined (typically, an Mo—W alloy film or an Mo—Ta alloy film); or a silicon film provided with conductivity can be used. Under the conductive layer formed using such a material, nitride such as tantalum nitride, tungsten nitride, titanium nitride, or molybdenum nitride; or silicide such as tungsten silicide, titanium silicide, or molybdenum silicide may be formed. Furthermore, a layered structure of the above-described semiconductor materials, conductive materials, or the semiconductor material and the conductive material may be used. For example, a layered structure of a silicon layer and a germanium layer may be used.

Alternatively, the charge accumulation layer 311 can be formed as an insulating layer having a trap that holds charges. As a typical example of such a material, a silicon compound and a germanium compound are given. As the silicon compound, silicon nitride, silicon oxynitride, silicon oxynitride to which hydrogen is added, and the like can be given. As examples of the germanium compound, germanium nitride, germanium nitride to which oxygen is added, germanium oxide to which nitrogen is added, germanium nitride to which oxygen and hydrogen are added, germanium oxide to which nitrogen and hydrogen are added, and the like can be given.

Next, a mask covering the semiconductor layers 303, 304, and 306 is formed. By using the mask and the charge accumulation layer 311 as masks, an impurity element that imparts n-type conductivity is added to form n-type impurity regions 362a and 362b. In this embodiment, phosphorus (P), which is an impurity element that imparts n-type conductivity, is used as the impurity element. Here, the addition is performed so that each of the n-type impurity regions 362a and 362b contains an impurity element that imparts n-type conductivity at a concentration of about $1 \times 10^{17}$ atoms/cm$^3$ to $5 \times 10^{18}$ atoms/cm$^3$. The mask covering the semiconductor layers 303, 304, and 306 is removed.

The oxide film over the semiconductor layer 306 is removed, and a gate insulating layer 309 covering the semiconductor layer 305, the semiconductor layer 306, the insulating film 310, and the charge accumulation layer 311 is formed. When the gate insulating layer 309 is thick in the memory cell array, the thin film transistor and the memory element can have high tolerance to high voltage; accordingly, reliability can be increased.

Note that although the gate insulating layer 309 formed over the semiconductor layer 305 serves as a control insulating layer of the memory element which is completed later, the gate insulating layer 309 formed over the semiconductor layer 306 serves as a gate insulating layer of the thin film transistor. Therefore, the layer is called the gate insulating layer 309 in this specification.

The oxide film over the semiconductor layers 303 and 304 is removed, and a gate insulating layer 308 covering the semiconductor layers 303 and 304 is formed (see FIG. 6A). The gate insulating layer 308 can be formed by a plasma CVD method, a sputtering method, or the like. The gate insulating layer 308 of the thin film transistor provided in the driver circuit portion preferably has a thickness of from 1 nm to 10 nm, more preferably, about 5 nm. Reduction in thickness of the gate insulating layer 308 has an effect that the transistor can be operated in the driver circuit portion at high speed at low voltage.

The gate insulating layer 308 may be formed using silicon oxide or a layered structure of silicon oxide and silicon nitride. The gate insulating layer 308 may be formed by depositing an insulating film by a plasma CVD method or a low pressure CVD method or may be formed by solid-phase oxidation or solid-phase nitridation by plasma treatment. This is because a gate insulating layer which is formed through oxidation or nitridation of the semiconductor layer by plasma treatment has a dense film quality, high withstand voltage, and high reliability.

As the gate insulating layer 308, a high dielectric constant material may be used. When a high dielectric constant material is used for the gate insulating layer 308, gate leakage current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidizing the surface of the semiconductor region by a GRTA method, an LRTA method, or the like, thereby forming a thermal oxide film. Accordingly, a thin silicon oxide film can be formed. Note that a noble gas element such as argon is preferably included in a reactive gas and is preferably mixed in the insulating film to be formed in order to form a dense insulating film with few gate leakage current at a low film-formation temperature.

Then, a first conductive film with a thickness of 20 nm to 100 nm and a second conductive film with a thickness of 100 nm to 400 nm, each of which serves as a gate electrode layer, are stacked over the gate insulating layers 308 and 309. The first and second conductive film can be formed by a sputtering method, an evaporation method, a CVD method, or the like. The first and second conductive films may be formed using an element such as tantalum (Ta), tungsten (W), titanium (Ti), molybdenum (Mo), aluminum (Al), copper (Cu), chromium (Cr), and neodymium (Nd); or an alloy or compound material containing the above element as a main component. Alternatively, the first and second conductive films may be formed using a semiconductor film typified by a polycrystalline silicon film doped with an impurity element such as phosphorus, or an AgPdCu alloy. The conductive film is not limited to the two-layer structure, and, for example, may have a three-layer structure in which a tungsten film with a thickness of 50 nm as the first conductive film, an aluminum-silicon (Al—Si) alloy film with a thickness of 500 nm as the second conductive film, and a titanium nitride film with a thickness of 30 nm as the third conductive film are sequentially stacked. In the case of the three-layer structure, a tungsten nitride film may be used instead of the tungsten film as the first conductive film, an aluminum-titanium (Al—Ti) alloy film may be used instead of the aluminum-silicon (Al—Si) alloy film as the second conductive film, and a titanium film may be used instead of the titanium nitride film as the third conductive film. Alternatively, a single-layer structure may be adopted as well. In this embodiment, a tantalum nitride film with a thickness of 30 nm is formed as the first conductive film, and a tungsten (W) film with a thickness of 370 nm is formed as the second conductive film.

The first conductive film and the second conductive film are etched, and then first gate electrode layers 312, 313, and 314, second gate electrode layers 316, 317, and 318, a first control gate electrode layer 315, and a second control gate electrode layer 319 are formed (see FIG. 6B).

In this embodiment, an example in which the first gate electrode layer and the second gate electrode layer (the first control gate electrode layer and the second control gate electrode layer) are formed to have perpendicular side surfaces is described; however, the present invention is not limited thereto. Both the first gate electrode layer and the second gate electrode layer (the first control gate electrode layer and the second control gate electrode layer) may have tapered shapes, or one of the first gate electrode layer or the second gate electrode layer (the first control gate electrode layer or the second control gate electrode layer) may have a tapered shape while the other may have a perpendicular side surface by anisotropic etching. The taper angles may be different or equal among the stacked gate electrode layers. With the tapered shape, coverage of a film stacked thereover is improved and defects are reduced, which improves reliability.

The gate insulating layers 308 and 309 may be etched to some extent and thinned (so-called film reduction) by the etching step in forming the gate electrode layers (and the control gate electrode layers).

Next, masks 321 and 363 covering the semiconductor layers 304, 305, and 306 are formed. An impurity element 320 that imparts p-type conductivity is added using the masks 321 and 363, the first gate electrode layer 312, and the second gate electrode layer 316 as masks to form p-type impurity regions 322a and 322b. In this embodiment, boron (B) is used as the impurity element. Here, the addition is performed so that the p-type impurity regions 322a and 322b contain the impurity element that imparts p-type conductivity at a concentration of about $1 \times 10^{20}$ atoms/cm³ to about $5 \times 10^{21}$ atoms/cm³. In addition, a channel formation region 323 is formed in the semiconductor layer 303 (see FIG. 6C).

The p-type impurity regions 322a and 322b are high-concentration p-type impurity regions and serve as a source region and a drain region.

Next, a mask 325, which covers the semiconductor layer 303, is formed. An impurity element 324 that imparts n-type conductivity is added using the mask 325, the first gate electrode layer 313, the second gate electrode layer 317, the first gate electrode layer 314, the second gate electrode layer 318, the first control gate electrode layer 315, and the second control gate electrode layer 319 as masks to form n-type impurity regions 326a, 326b, 364a, 364b, 327a, 327b, 328a, and 328b. In this embodiment, phosphorus (P) is used as the impurity element. Here, the addition is performed so that each of the n-type impurity regions 326a, 326b, 327a, 327b, 328a, and 328b contains the impurity element that imparts p-type conductivity at a concentration of about $5 \times 10^{19}$ atoms/cm³ to $5 \times 10^{20}$ atoms/cm³. In addition, a channel formation region 329 is formed in the semiconductor layer 304, a channel formation region 330 is formed in the semiconductor layer 305, and a channel formation region 331 is formed in the semiconductor layer 306 (see FIG. 6D).

The n-type impurity regions 326a, 326b, 327a, 327b, 328a, and 328b are high-concentration n-type impurity regions and serve as source regions and drain regions. On the other hand, the n-type impurity regions 364a and 364b are low-concentration impurity regions, or LDD (lightly doped drain) regions.

The mask 325 is removed by $O_2$ ashing or with a resist stripper, whereby an oxide film is also removed. After that, an insulating film, namely a sidewall may be formed so as to cover side surfaces of the gate electrode layers. The sidewall can be formed using an insulating film containing silicon by a plasma CD method or a low pressure CVD (LPCVD) method.

In order to activate the impurity element, thermal treatment, strong light irradiation, or laser beam irradiation may be performed. At the same time as the activation, plasma damage to the gate insulating layers and to an interface between the gate insulating layers and the semiconductor layers can be repaired.

Subsequently, an interlayer insulating layer which covers the gate insulating layers and the gate electrode layers is formed. In this embodiment, a layered structure of insulating films 367 and 368 is used. The insulating films 367 and 368 each may be a silicon nitride film, a silicon nitride oxide film, a silicon oxynitride film, or a silicon oxide film formed by a sputtering method or plasma CVD. Further, another insulating film containing silicon may also be employed to have a single-layer structure or a layered structure including three or more layers.

Furthermore, thermal treatment is performed in a nitrogen atmosphere at 300° C. to 550° C. for 1 hour to 12 hours, whereby the semiconductor layer is hydrogenated. Preferably, this step is performed at 400° C. to 500° C. Through this step, dangling bonds in the semiconductor layer can be terminated by hydrogen contained in the insulating film 367 that is an interlayer insulating layer. In this embodiment, thermal treatment is performed at 410° C. for one hour.

The insulating film 367 and the insulating film 368 can be formed using a material selected from inorganic insulating substances, such as aluminum nitride (AlN), aluminum oxynitride (AlON), aluminum nitride oxide (AlNO) containing more nitrogen than oxygen, aluminum oxide, diamond-like carbon (DLC), and nitrogen-containing carbon (CN). In addition, a siloxane resin may also be used. The siloxane resin corresponds to a resin including Si—O—Si bonding.

Next, using a resist mask, contact holes (openings) that reach the semiconductor layers are formed in the insulating films 367 and 368, and the gate insulating layers 308 and 309. Etching may be performed once or a plurality of times according to a selection ratio of the materials which are used. Etching is performed to remove the insulating films 368 and 367, and the gate insulating layers 308 and 309, whereby openings that reach the p-type impurity regions 322a and 322b which are a source and drain regions, and openings that reach the n-type impurity regions 326a and 326b, 327a and 327b, and 328a and 328b which are source and drain regions are formed. For the etching, wet etching, dry etching, or the both may be employed. A hydrofluoric acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas. As an inert element to be added, one or more of He, Ne, Ar, Kr, and Xe can be used.

A conductive film is formed so as to cover the openings, and the conductive film is etched to form wiring layers 369a, 369b, 370a, 370b, 371a, 371b, 372a, and 372b, which are source electrode layers and drain electrode layers electrically connected to portions of respective source regions and drain regions. The wiring layers can be formed by forming the conductive film by a PVD method, a CVD method, an evaporation method, or the like, and then etching the conductive film into a desired shape. In addition, a conductive layer can be selectively formed in a given position by a droplet discharge method, a printing method, an electrolytic plating method, or the like. Further, a reflow method or a damascene method may be used as well. As a material for the source electrode layers and the drain electrode layers, a metal such as Ag, Au, Cu, Ni, Pt, Pd, Ir, Rh, W, Al, Ta, Mo, Cd, Zn, Fe, Ti, Zr, or Ba; or Si or Ge; an alloy or nitride thereof can be used. Further, a layered structure of any of these may also be used. In this embodiment, titanium (Ti) is formed to be 60 nm thick, a titanium nitride film is formed to be 40 nm thick, aluminum is formed to be 700 nm thick, and titanium (Ti) is formed to be 200 nm thick, so that a layered structure can be formed, and then the layered structure is processed into a desired shape.

Through the above steps, a semiconductor integrated circuit 350 can be manufactured, in which a p-channel thin film transistor 373 having a p-type impurity region and an n-channel thin film transistor 374 having an n-type impurity region are provided in the driver circuit portion; and a memory element 375 having an n-type impurity region and an n-channel thin film transistor 376 having an n-type impurity region are provided in the memory cell array (see FIG. 6E).

In this embodiment, the semiconductor integrated circuit 350 is provided with an insulating layer 390 (see FIG. 7A). Next, a conductive layer 380 that serves as an antenna is formed over the insulating layer 390, and an inorganic insulating layer 381 is formed as a protective layer over the conductive layer 380 (see FIG. 7B).

A structure body in which a fibrous body 386 is impregnated with an organic resin 387 is used as a first impact resistance layer 382. The structure body is heated and subjected to pressure bonding so that the semiconductor integrated circuit 350, the first impact resistance layer 382, and a first impact diffusion layer 391 are bonded, and the semiconductor integrated circuit 350 is separated from the substrate 300 along the separation layer 301. Accordingly, the semiconductor integrated circuit 350 is provided on the first impact resistance layer 382 side (see FIG. 7C).

Similarly to the first impact resistance layer 382, a second impact resistance layer 385 is formed using a structure body in which the fibrous body 386 is impregnated with the organic resin 387. The structure body is heated and subjected to pressure bonding so that a second impact diffusion layer 388 and the second impact resistance layer 385 are bonded to each other (see FIG. 8A). A bonding layer 389 is provided on a surface of the second impact diffusion layer 388, on which the second impact resistance layer 385 is not provided.

The bonding layer 389 is bonded to the separation surface where the semiconductor integrated circuit 350 is exposed, and the semiconductor integrated circuit 350 is sandwiched by the first impact diffusion layer 391 and the first impact resistance layer 382, and the second impact diffusion layer 388 and the second impact resistance layer 385. Further, a conductive layer 395 is formed on an outer side than the second impact resistance layer 385 (on the side where the second impact diffusion layer 388 is not provided) (see FIG. 8B).

The conductive layer 395 is provided on the entire surface of a region overlapped with the semiconductor integrated circuit 350 so as to cover the semiconductor integrated circuit 350. The conductive layer 395 is formed so as to cover (overlap) one surface of the semiconductor integrated circuit 350 and is provided on the side opposite to the semiconductor integrated circuit 350, on which the conductive layer 380 that serves as an antenna is not provided. The conductive layer 395 diffuses static electricity applied by electrostatic discharge to let it go or prevents local electric charges (localization of electric charges) (prevents local potential difference) so that electrostatic breakdown of the semiconductor integrated circuit 350 can be prevented.

Since the impact diffusion layer is provided in contact with the semiconductor integrated circuit, even in the case of performing pressure treatment in the manufacturing process, the pressure treatment has no adverse effects such as damages and defective characteristics on the semiconductor integrated circuit. Therefore, a semiconductor device can be manufactured with high yield.

By the conductive layer covering the semiconductor integrated circuit, electrostatic breakdown (malfunctions of the circuit or damages of a semiconductor element) due to electrostatic discharge of the semiconductor integrated circuit can be prevented. Further, with the use of the pair of impact diffusion layers and the pair of impact resistance layers which sandwich the semiconductor integrated circuit, a highly reliable semiconductor device that is reduced in thickness and size and has tolerance can be provided. Further, shape defects and defective characteristics are prevented in the manufacturing process, so that a semiconductor device can be manufactured with high yield.

(Embodiment 6)

In this embodiment, a highly reliable semiconductor device and a high-yield method for manufacturing a semiconductor device are described in detail with reference to FIGS. 25A to 25C, FIGS. 26A and 26B, and FIGS. 27A to 27E. In the structure of this embodiment described below, a common reference numeral refers to the same part or a part having a similar function throughout drawings, in Embodiment 1 and this embodiment, and the description thereof is omitted.

In a semiconductor device according to this embodiment, a semiconductor integrated circuit is separated from a substrate at the time of formation and is sandwiched by flexible impact resistance layers and an impact diffusion layer. Note that a substrate over which a semiconductor integrated circuit is formed is also referred to as a formation substrate in this specification. Therefore, the semiconductor integrated circuit is formed over a formation substrate with a separation layer interposed therebetween.

Figure 25A:
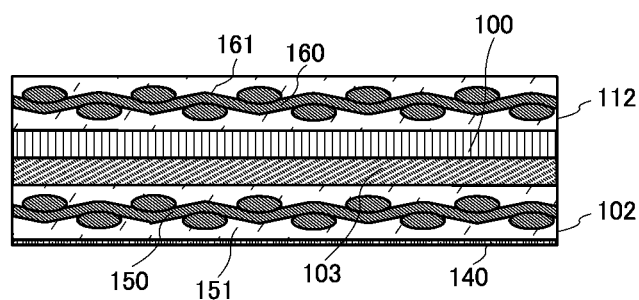
FIGS. 25A to 25C are views each illustrating a semiconductor device.
Figure 25B:
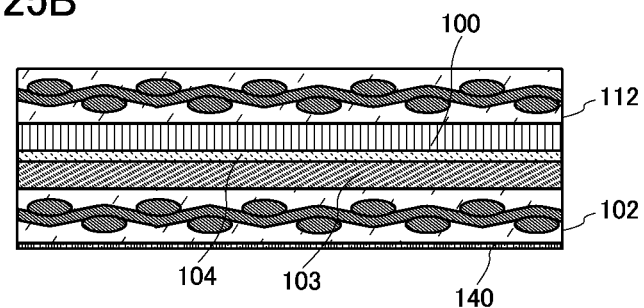

A semiconductor device according to this embodiment is illustrated in FIGS. 25A and 25B. In FIG. 25A, the semiconductor integrated circuit 100 is sandwiched between the first impact resistance layer 112 and the second impact resistance layer 102. The impact diffusion layer 103 is provided between the semiconductor integrated circuit 100 and the second impact resistance layer 102, and the conductive layer 140 is provided on an outer side than the second impact resistance layer 102 (on the side where the impact diffusion layer 103 is not provided).

The conductive layer 140 is provided on an entire surface of a region overlapped with the semiconductor integrated circuit 100 so as to cover the semiconductor integrated circuit 100. The conductive layer 140 is formed so as to cover (overlap) one surface of the semiconductor integrated circuit 100. Note that the conductive layer 140 is not electrically connected to the semiconductor integrated circuit 100. The conductive layer 140 diffuses static electricity applied by electrostatic discharge to let it go or prevents local electric charges (localization of electric charges) (prevents local potential difference) so that electrostatic breakdown of the semiconductor integrated circuit 100 can be prevented.

Figure 32A:
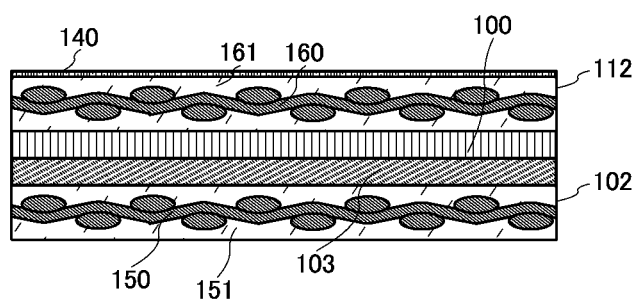
FIGS. 32A and 32B are views each illustrating a semiconductor device.
Figure 32B:
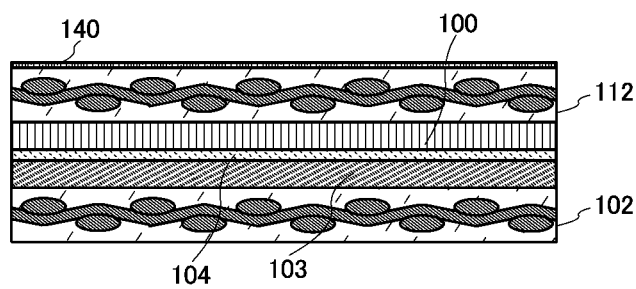

The conductive layer 140 may be provided on an outer side than the first impact resistance layer 112 (on the side where the semiconductor integrated circuit 100 is not provided) as long as it covers one of surfaces of the semiconductor integrated circuit 100, as illustrated in FIGS. 32A and 32B. When an antenna is formed in the structures the of FIGS. 32A and 32B, the surface on the side where the antenna is not provided has low tolerance to electrostatic discharge (ESD); therefore, it is preferable that the conductive layer 140 be provided on the side opposite to the semiconductor integrated circuit 100, on which the antenna is not provided and the impact diffusion layer 103 and the second impact resistance layer 102 are provided.

The conductive layer 140 is acceptable as long as it has conductivity. The conductive layer 140 with a small thickness preferably has a sheet resistance of from $1.0 \times 10^2 \Omega/\square$ to $1.0 \times 10^7 \Omega/\square$ (more preferably, from $1.0 \times 10^2 \Omega/\square$ to $1.0 \times 10^4 \Omega/\square$).

The conductive layer 140 is formed using a material having a thickness small enough that radio waves to be transmitted and received by an antenna are transmitted. Accordingly, a highly reliable semiconductor device that has tolerance to electrostatic breakdown and can transmit and receive radio waves can be provided.

As the conductive layer 140, a film of metal, metal nitride, metal oxide, or the like or a stack of any of the films can be used.

The conductive layer 140 may be formed using, for example, an element such as titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material each containing any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Further, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may also be used.

Alternatively, a semiconductor film having a conductivity type, which is obtained by adding an impurity element or the like to a semiconductor, or the like can be used. For example, a polycrystal silicon film doped with an impurity element such as phosphorus, or the like can be used.

Further, as the conductive layer 140, a conductive macromolecule (also referred to as a conductive polymer) may be used. As the conductive polymer, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive polymer are given below: polypyrrole, poly(3-methylpyrrole), poly(3-butylpyrroe), poly(3-octylpyrroe), poly(3-decylpyrroe), poly(3,4-dimethylpyrroe), poly(3,4-dibutylpyrroe), poly(3-hydroxypyrrole), poly(3-methyl-4-hydroxypyrrole), poly(3-methoxypyrrole), poly(3-ethoxypyrroe), poly(3-octoxypyrroe), poly(3-carboxylpyrroe), poly(3-methyl-4-carboxylpyrroe), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly(3-anilinesulfonic acid).

The conductive layer 140 including a conductive macromolecule may contain an organic resin or a dopant (a halogen, a Lewis acid, an inorganic acid, an organic acid, a transition metal halide, an organic cyano compound, a non-ionic surfactant, or the like).

The conductive layer 140 can be formed by a dry process such as a sputtering method, a plasma CVD method, or an evaporation method, or a wet process such as a coating method, a printing method, or a droplet discharge method (inkjet method). The conductive layer 140 preferably has a thickness of from 5 nm to 200 nm.

A protective layer may be stacked over the conductive layer 140. For example, a titanium film (with a thickness of from about 10 nm to about 50 nm) is formed as the conductive layer 140, and a titanium oxide film may be stacked as a protective layer over the titanium film. Even in the case where the conductive layer 140 is provided on a surface of a semiconductor device, the conductive layer can be prevented from being degraded because a protective layer is formed on an outermost surface of the semiconductor device. The thickness of the protective layer may be from about 10 nm to about 200 nm.

For each of the first impact resistance layer 112 and the second impact resistance layer 102, a structure body in which a fibrous body is impregnated with an organic resin is used. A structure body in which the fibrous body 160 is impregnated with the organic resin 161 is used for the impact resistance layer 112, and a structure body in which the fibrous body 150 is impregnated with the organic resin 151 is used for the second impact resistance layer 102.

Figure 25C:
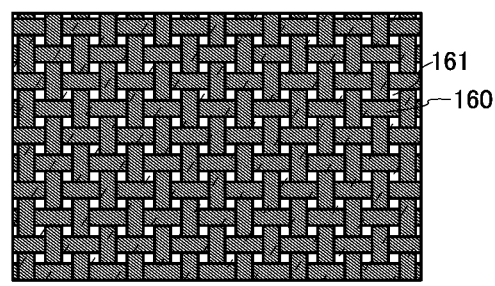

A top view of the fibrous body 160 which is a woven fabric formed by using yarn bundles of fibers for warp yarns and weft yarns is illustrated in FIG. 25C.

As illustrated in FIG. 25C, the fibrous body 160 is woven using the warp yarns spaced at regular intervals and the weft yarns spaced at regular intervals.

In the drawings of this embodiment, the fibrous body 160 is illustrated as a woven fabric which is plain-woven using a yarn bundle having an elliptical shape in cross section.

In this embodiment, for the impact diffusion layer, an aramid resin film (with a modulus of elasticity of 10 GPa and a modulus of rupture of 480 MPa) is used.

FIG. 25B is an example in which the semiconductor integrated circuit 100 and the impact diffusion layer 103 are fixed to each other using the bonding layer 104. In this embodiment, an aramid film is used for the impact diffusion layer 103, and an acrylic resin is used for the bonding layer 104.

Figure 26A:
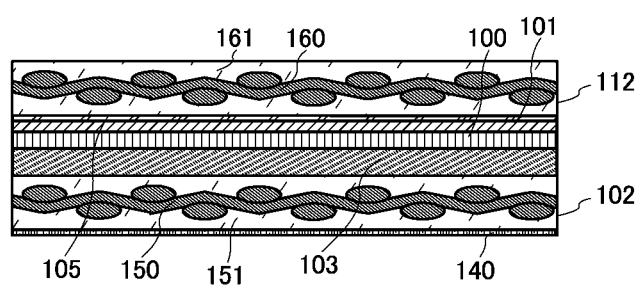
FIGS. 26A and 26B are views each illustrating a semiconductor device.
Figure 26B:
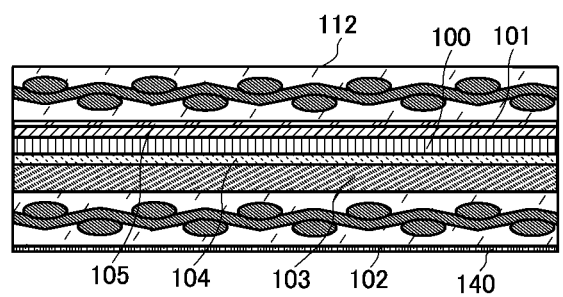

Further, a protective layer may be formed over the semiconductor integrated circuit. FIGS. 26A and 26B each illustrate an example in which an inorganic insulating layer 105 is formed as a protective layer over the semiconductor integrated circuit 100. Further, FIGS. 2A and 2B each illustrate an example in which an antenna 101 is formed over the semiconductor integrated circuit 100 and the inorganic insulating layer 105 is formed over the antenna 101. The inorganic insulating layer 105 covers the antenna 101, thereby preventing oxidation or the like of a conductive layer functioning as an antenna.

Figure 33A:
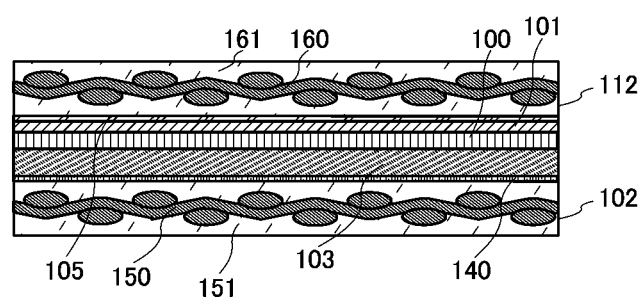
FIGS. 33A and 33B are views each illustrating a semiconductor device.
Figure 33B:
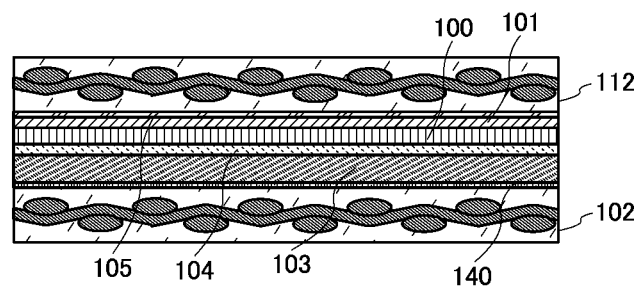

The conductive layer 140 is formed so as to cover (overlap) one surface of the semiconductor integrated circuit 100. When the antenna 101 is provided, the conductive layer 140 is formed on a side opposite to the semiconductor integrated circuit 100, on which the antenna 101 is not provided (on the second impact resistance layer 102 side in FIG. 26A). Alternatively, the conductive layer 140 may be provided between the impact diffusion layer 103 and the second impact resistance layer 102, as illustrated in FIGS. 33A and 33B.

The side where the antenna is not provided has low tolerance for electrostatic discharge (ESD); therefore, the conductive layer 140 is provided opposite to the antenna 101 with the semiconductor integrated circuit 100 interposed between the conductive layer 140 and the antenna 101, so that a defect due to electrostatic breakdown can be reduced by the conductive layer 140.

A method for manufacturing a semiconductor device, according to an embodiment of the present invention, is described with reference to FIGS. 27A to 27E. The semiconductor integrated circuit 100 is formed over the substrate 110 having an insulating surface, which is a formation substrate, with the separation layer 111 interposed therebetween (see FIG. 27A).

The semiconductor integrated circuit 100 and the first impact resistance layer 112 are bonded to each other, and the semiconductor integrated circuit 100 is separated from the substrate 110 along the separation layer 111. Therefore, the semiconductor integrated circuit 100 is provided on the first impact resistance layer 112 side (see FIG. 27B).

In this embodiment, the structure body in which the fibrous body 160 is impregnated with the organic resin 161 is used for the first impact resistance layer 112. The structure body is heated and subjected to pressure bonding so that the organic resin of the structure body is plasticized or cured. In the case where the organic resin is an organic plastic resin, the organic resin which is plasticized is then cured by cooling to room temperature. By heating and pressure bonding, the organic resin is uniformly spread so as to be in close contact with the semiconductor integrated circuit, and is cured. A step in which the structure body is subjected to pressure bonding is performed under an atmospheric pressure or a reduced pressure.

Similarly to the first impact resistance layer 112, the second impact resistance layer 102 is formed using a structure body in which the fibrous body 150 is impregnated with the organic resin 151. The structure body is heated and subjected to pressure bonding so that the impact diffusion layer 103 and the second impact resistance layer 102 are bonded to each other (see FIG. 27C). The bonding layer 104 is provided on a surface of the impact diffusion layer 103, on which the second impact resistance layer 102 is not provided.

Figure 27A:
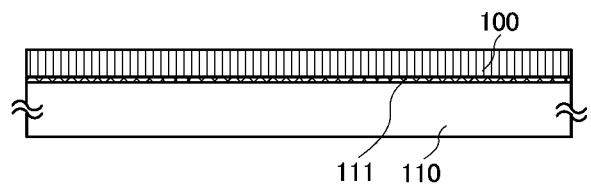
FIGS. 27A to 27E are views illustrating a method for manufacturing a semiconductor device.
Figure 27B:
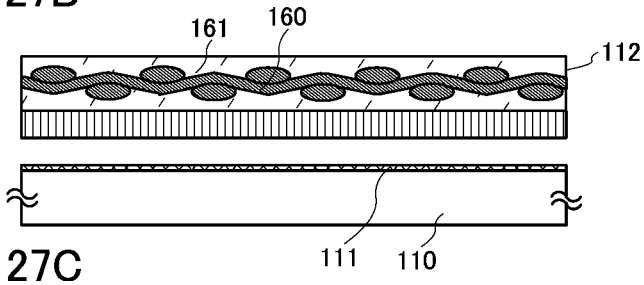
Figure 27C:
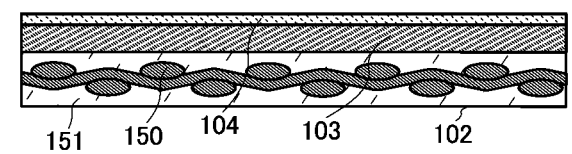
Figure 27D:
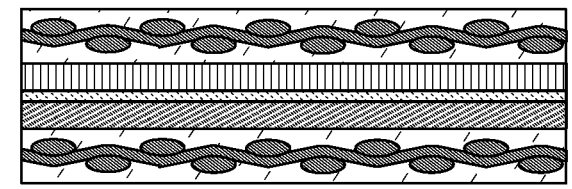

The bonding layer 104 is bonded to the separation surface where the semiconductor integrated circuit 100 is exposed (see FIG. 27D).

Figure 27E:
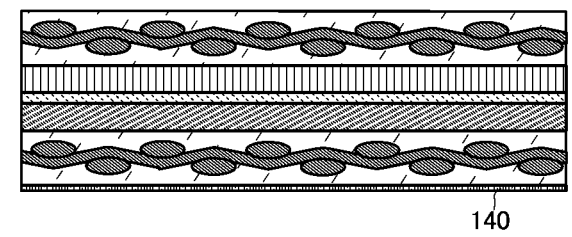

Next, the conductive layer 140 is formed on the surface of the second impact resistance layer 102 (see FIG. 27E). In this embodiment, a titanium film with a thickness of 10 nm is formed as the conductive layer 140 by a sputtering method.

The first impact resistance layer 112 which is bonded to the semiconductor integrated circuit 100, and the second impact resistance layer 102 may be provided with the conductive layer 140, or the impact diffusion layer 103 may be provided with the conductive layer 140 before being bonded to the semiconductor integrated circuit 100. In the case where the impact diffusion layer 103 is provided with the conductive layer 140 before being bonded to the semiconductor integrated circuit 100 so that the conductive layer 140 is between the impact diffusion layer 103 and the second impact resistance layer 102, the surface of the conductive layer 140 is not exposed, which yields an effect that degradation of the conductive layer 140, such as oxidation, duration, and crazing can be prevented.

Figure 31A:
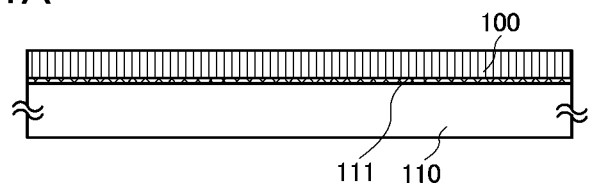
FIGS. 31A to 31D are views illustrating a method for manufacturing a semiconductor device.
Figure 31B:
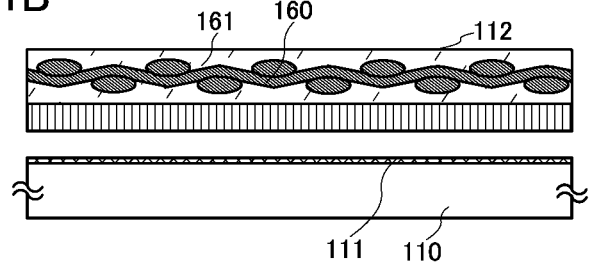
Figure 31C:
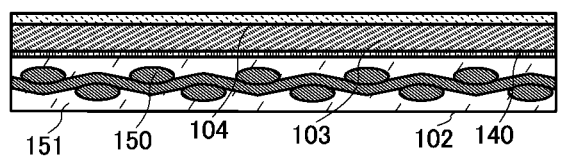

An example in which the impact diffusion layer 103 is provided with the conductive layer 140 is illustrated in FIGS. 31A to 31D. FIGS. 31A and 31B correspond to FIGS. 27A and 27B, and the semiconductor integrated circuit 100 is bonded to the first impact resistance layer 112 and is separated from the substrate 110 along the separation layer 111. Next, the impact diffusion layer 103 provided with the conductive layer 140 in advance and the second impact resistance layer 102 are heated and bonded to each other by pressure treatment (see FIG. 31C). The surface of the impact diffusion layer 103, which is bonded to the second impact resistance layer 102, is provided with the conductive layer 140 in advance, and the other surface of the impact diffusion layer 103 is provided with the bonding layer 104 in FIG. 31C.

Figure 31D:
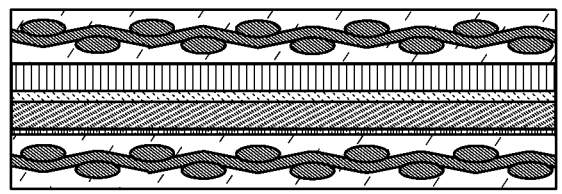

The bonding layer 104 is bonded to the separation surface where the semiconductor integrated circuit 100 is exposed (see FIG. 31D).

Through the above steps, a semiconductor device including the conductive layer 140, and the semiconductor integrated circuit 100 and the impact diffusion layer 103 which are sandwiched between the first impact resistance layer 112 and the second impact resistance layer 102 can be formed.

The impact diffusion layer is provided in contact with the semiconductor integrated circuit; therefore, if pressure treatment is performed in a manufacturing step, the pressure treatment has no adverse effect such as damages or defective characteristics on the semiconductor integrated circuit. Accordingly, a semiconductor device can be formed with high yield.

By the conductive layer covering the semiconductor integrated circuit, electrostatic breakdown (malfunctions of the circuit or damages of a semiconductor element) due to electrostatic discharge of the semiconductor integrated circuit can be prevented. Further, with the use of the pair of impact resistance layers which sandwich the semiconductor integrated circuit and the impact diffusion layer stacked below the semiconductor integrated circuit and, a highly reliable semiconductor device that is reduced in thickness and size and has tolerance can be provided.

(Embodiment 7)

In this embodiment, another example of a semiconductor device achieving high level of reliability, according to the present invention, is described with reference to FIGS. 34A and 34B. In the structure of this embodiment described below, a common reference numeral refers to the same part or a part having a similar function throughout drawings, in Embodiment 1 and this embodiment, and the description thereof is omitted.

Figure 34A:
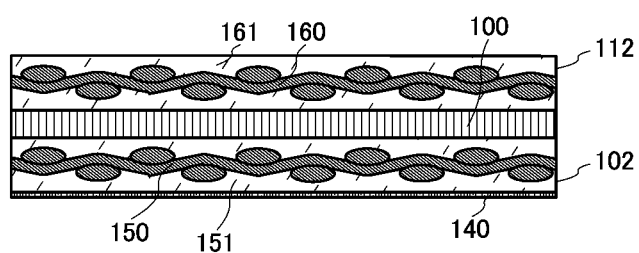
FIGS. 34A and 34B are views each illustrating a semiconductor device.
Figure 34B:
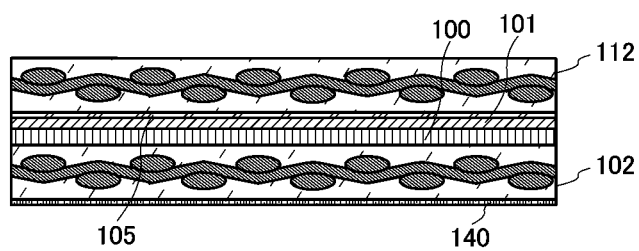

A semiconductor device of this embodiment is illustrated in FIGS. 34A and 34B. In FIG. 34A, the semiconductor integrated circuit 100 is sandwiched between the first impact resistance layer 112 and the second impact resistance layer 102, and the conductive layer 140 is provided on an outer side than the second impact resistance layer 102.

The conductive layer 140 may be provided on an outer side than the first impact resistance layer 112 (on the side where the semiconductor integrated circuit 100 is not provided) as long as it covers one of surfaces of the semiconductor integrated circuit 100.

However, as illustrated in FIG. 34B, in the case of forming the antenna 101, the side where the antenna 101 is not provided has low tolerance for electrostatic discharge (ESD); therefore, the conductive layer 140 is preferably provided on the side opposite to the semiconductor integrated circuit 100, on which the antenna 101 is not provided and the second impact resistance layer 102 is provided.

The conductive layer 140 is provided on an entire surface of a region overlapped with the semiconductor integrated circuit 100 so as to cover the semiconductor integrated circuit 100. That is to say, the conductive layer 140 is formed so as to cover (overlap) one surface of the semiconductor integrated circuit 100. The conductive layer 140 diffuses static electricity applied by electrostatic discharge to let it go or prevents local electric charges (localization of electric charges) (prevents local potential difference) so that electrostatic breakdown of the semiconductor integrated circuit 100 can be prevented.

Further, by providing the first impact resistance layer 112 against force externally applied to a semiconductor device (also referred to as external stress) and the second impact resistance layer 102, the force applied locally can be reduced; therefore, damages, defective characteristics, and the like of the semiconductor device can be prevented.

With the use of the conductive layer covering the semiconductor integrated circuit, electrostatic breakdown (malfunctions of the circuit or damages of a semiconductor element) due to electrostatic discharge of the semiconductor integrated circuit is prevented. Further, with the use of the impact resistance layers which sandwich the semiconductor integrated circuit, a highly reliable semiconductor device that is reduced in thickness and size and has tolerance can be provided.

(Embodiment 8)

In this embodiment, another example of a semiconductor device achieving high level of reliability, according to the present invention, is described with reference to FIGS. 35A and 35B. In the structure of this embodiment described below, a common reference numeral refers to the same part or a part having a similar function throughout drawings, in Embodiment 1 and this embodiment, and the description thereof is omitted.

Figure 35A:
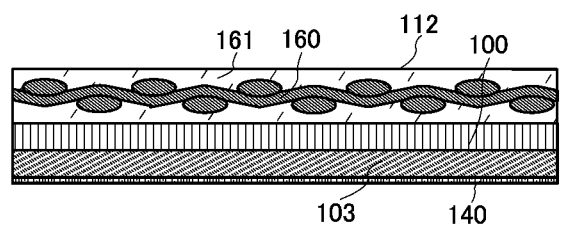
FIGS. 35A and 35B are views each illustrating a semiconductor device.
Figure 35B:
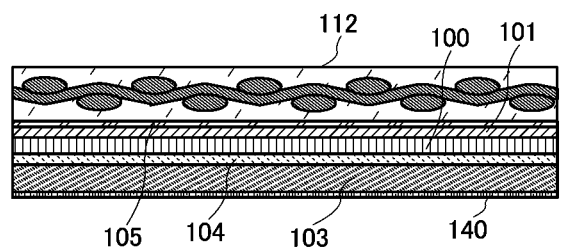

FIGS. 35A and 35B each illustrate a semiconductor device according to this embodiment. In FIG. 35A, the semiconductor integrated circuit 100 is sandwiched between the first impact resistance layer 112 and the impact diffusion layer 103, and the conductive layer 140 is provided on an outer side than the impact diffusion layer 103.

The conductive layer 140 may be provided so as to cover either surface of the semiconductor integrated circuit 100; therefore, the conductive layer 140 can be provided on an outer side than the first impact resistance layer 112 (on the side where the semiconductor integrated circuit 100 is not provided).

However, when the antenna 101 is formed as illustrated in FIG. 35B, the side where the antenna 101 is not provided has low tolerance to electrostatic discharge (ESD); therefore, it is preferable that the conductive layer 140 be provided on side opposite to the semiconductor integrated circuit 100, on which the antenna 101 is not provided and the impact diffusion layer 103 is provided.

The conductive layer 140 is provided on an entire surface of a region overlapped with the semiconductor integrated circuit 100 so as to cover the semiconductor integrated circuit 100. That is to say, the conductive layer 140 is formed so as to cover (overlap) one surface of the semiconductor integrated circuit 100. The conductive layer 140 diffuses static electricity applied by electrostatic discharge to let it go or prevents local electric charges (localization of electric charges) (prevents local potential difference) so that electrostatic breakdown of the semiconductor integrated circuit 100 can be prevented.

Further, by providing the first impact resistance layer 112 and the second impact resistance layer 102 against force externally applied to a semiconductor device (also referred to as external stress) and the impact diffusion layer 103 which diffuse the force, the force applied locally can be reduced; therefore, damages, defective characteristics, and the like of the semiconductor device can be prevented.

With the use of the conductive layer covering the semiconductor integrated circuit, electrostatic breakdown (malfunctions of the circuit or damages of a semiconductor element) due to electrostatic discharge of the semiconductor integrated circuit is prevented. Further, with the use of the impact resistance layers and the impact diffusion layer which sandwich the semiconductor integrated circuit, a highly reliable semiconductor device that is reduced in thickness and size and has tolerance can be provided.

(Embodiment 9)

In this embodiment, a semiconductor device with higher reliability and a method for manufacturing a semiconductor device with high yield are described in detail with reference to FIGS. 4A to 4C and FIGS. 28A and 28B. In this embodiment, a CMOS is described as an example of the semiconductor device.

Figure 4B:
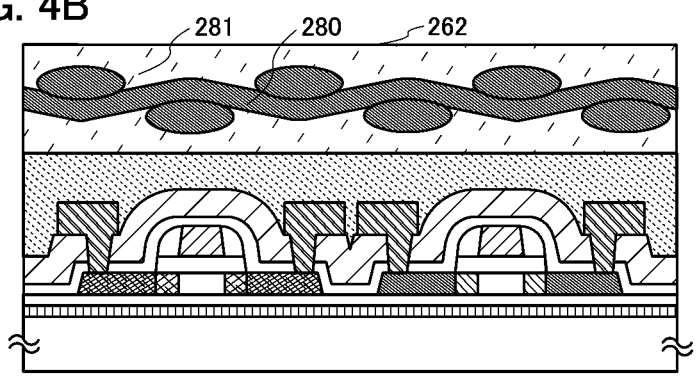
Figure 4C:
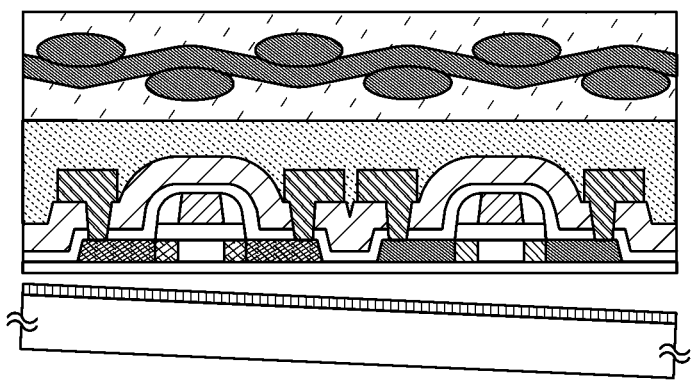
Figure 28A:
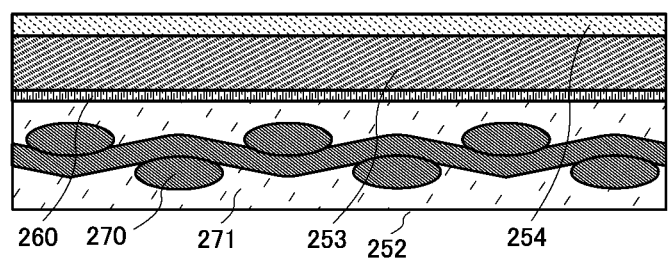
FIGS. 28A and 28B are views illustrating a method for manufacturing a semiconductor device.

FIG. 28A is a step following the step of FIG. 4C in Embodiment 4. Therefore, steps for formation may be performed in a similar manner to those in Embodiment 4, and the detailed description of steps from FIGS. 4A to 4C is omitted.

A structure body in which the fibrous body 280 is impregnated with the organic resin 281 is used for the first impact resistance layer 262. The semiconductor integrated circuit 250 and the first impact resistance layer 262 are bonded to each other, and the semiconductor integrated circuit 250 is separated from the substrate 200 along the separation layer 201. Accordingly, the semiconductor integrated circuit 250 is provided on the first impact resistance layer 262 side.

Similarly to the first impact resistance layer 262, the second impact resistance layer 252 is formed using a structure body in which the fibrous body 270 is impregnated with the organic resin 271. The structure body is heated and subjected to pressure bonding so that the impact diffusion layer 253 provided with the conductive layer 260 and the second impact resistance layer 252 are bonded to each other (see FIG. 28A). The impact diffusion layer 253 is provided with the conductive layer 260 before the conductive layer 260 and the second impact resistance layer 252 are bonded to each other. The bonding layer 254 is provided on a surface of the impact diffusion layer 253 on which the second impact resistance layer 252 is not provided.

The conductive layer 260 is provided on an entire surface of a region overlapped with the semiconductor integrated circuit 250 so as to cover the semiconductor integrated circuit 250. That is to say, the conductive layer 260 is formed so as to cover (overlap) one surface of the semiconductor integrated circuit 250. The conductive layer 260 diffuses static electricity applied by electrostatic discharge to let it go or prevents local electric charges (localization of electric charges) (prevents local potential difference) so that electrostatic breakdown of the semiconductor integrated circuit 250 can be prevented.

Figure 28B:
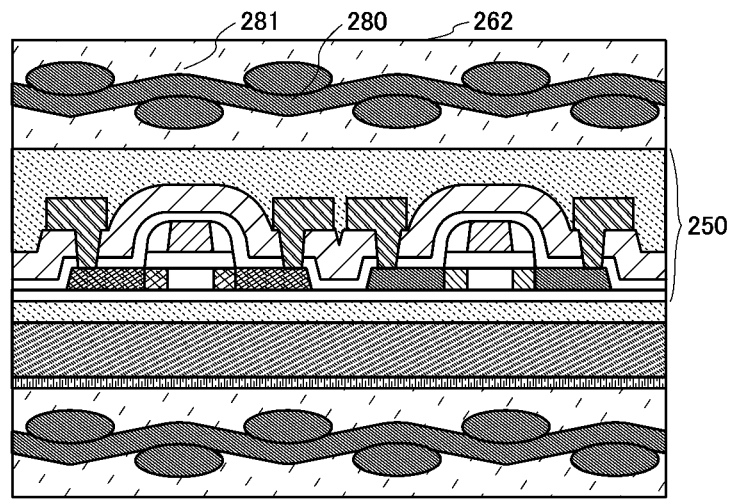
Figures 30A, 30B:
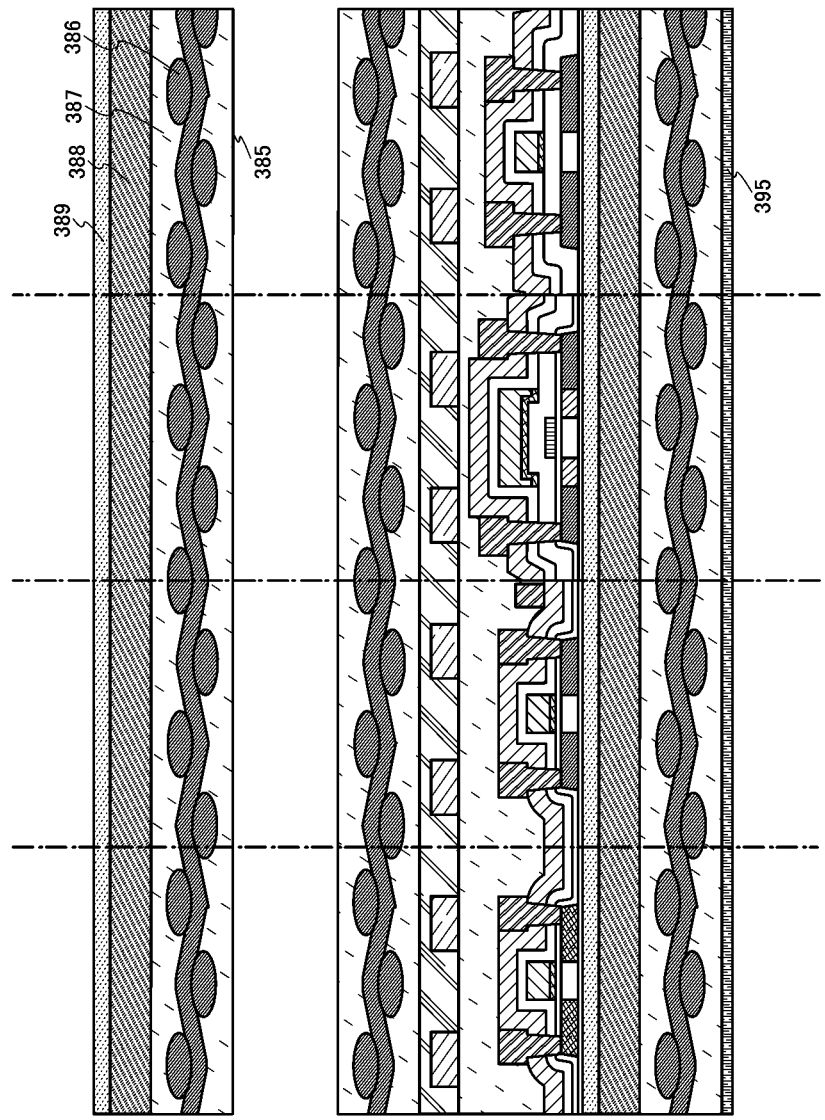
FIGS. 30A and 30B are views illustrating a method for manufacturing a semiconductor device.

The bonding layer 254 is bonded to the separation surface where the semiconductor integrated circuit 250 is exposed, and a semiconductor device including the semiconductor integrated circuit 250 and the impact diffusion layer 253 which are sandwiched between the first impact resistance layer 262 and the second impact resistance layer 252 can be formed (see FIG. 28B).

The impact diffusion layer is provided in contact with the semiconductor integrated circuit; therefore, if pressure treatment is performed in a manufacturing step, the pressure treatment has no adverse effect such as damages or defective characteristics on the semiconductor integrated circuit. Accordingly, a semiconductor device can be formed with high yield.

With the use of the pair of impact resistance layers which sandwich the semiconductor integrated circuit and the impact diffusion layer which is stacked below the semiconductor integrated circuit, a highly reliable semiconductor device that is reduced in thickness and size and has strength can be provided.

The semiconductor device manufactured in this embodiment can have flexibility with the use of flexible impact resistance layers and an impact diffusion layer.

The impact diffusion layer is provided in contact with the semiconductor integrated circuit; therefore, if pressure treatment is performed in a manufacturing step, the pressure treatment has no adverse effect such as damages or defective characteristics on the semiconductor integrated circuit. Accordingly, a semiconductor device can be formed with high yield.

With the use of the conductive layer covering the semiconductor integrated circuit, electrostatic breakdown (malfunctions of the circuit or damages of a semiconductor element) due to electrostatic discharge of the semiconductor integrated circuit is prevented. Further, with the use of the pair of impact resistance layers which sandwich the semiconductor integrated circuit and the impact diffusion layer which is stacked below the semiconductor integrated circuit, a highly reliable semiconductor device that is reduced in thickness and size and has tolerance can be provided.

(Embodiment 10)

In this embodiment, one example of a semiconductor device having a memory is described according to a semiconductor device aimed at increase in integration and reduction in thickness and size, and a manufacturing method thereof with reference to FIGS. 6A to 6E, FIGS. 29A to 29C, and FIGS. 30A and 30B.

A semiconductor device of this embodiment has a memory including a memory cell array and a driver circuit portion which drives the memory cell array.

FIG. 29A is a step following a step of FIG. 6E in Embodiment 5. Therefore, steps for formation may be performed in a similar manner to those in Embodiment 5, and the detailed description of steps from FIGS. 6A to 6E is omitted.

In this embodiment, the semiconductor integrated circuit 350 is provided with the insulating layer 390 (see FIG. 29A). Next, the conductive layer 380 that serves as an antenna is formed over the insulating layer 390, and the inorganic insulating layer 381 is formed as a protective layer over the conductive layer 380 (see FIG. 29B).

A structure body in which a fibrous body 383 is impregnated with an organic resin 384 is used for the first impact resistance layer 382. The semiconductor integrated circuit 350 and the first impact resistance layer 382 are bonded to each other, and the semiconductor integrated circuit 350 is separated from the substrate 300 along the separation layer 301. Accordingly, the semiconductor integrated circuit 350 is provided on the first impact resistance layer 382 side (see FIG. 29C).

Similarly to the first impact resistance layer 382, the second impact resistance layer 385 is formed using a structure body in which the fibrous body 386 is impregnated with the organic resin 387. The structure body is heated and subjected to pressure bonding so that the impact diffusion layer 388 and the second impact resistance layer 385 are bonded to each other (see FIG. 30A). The bonding layer 389 is provided on a surface of the impact diffusion layer 388, on which the second impact resistance layer 385 is not provided.

The bonding layer 389 is bonded to the separation surface where the semiconductor integrated circuit 350 is exposed, and the semiconductor integrated circuit 350 and the impact diffusion layer 388 are sandwiched between the first impact resistance layer 382 and the second impact resistance layer 385. Further, the conductive layer 395 is provided on an outer side than the second impact resistance layer 385 (on the side where the impact diffusion layer 388 is not provided) (see FIG. 30B).

The conductive layer 395 is provided on the entire surface of a region overlapped with the semiconductor integrated circuit 350 so as to cover the semiconductor integrated circuit 350. That is to say, the conductive layer 395 is formed so as to cover (overlap) one surface of the semiconductor integrated circuit 350 and is provided on the side opposite to the semiconductor integrated circuit 350, on which the conductive layer 380 that serves as an antenna is not provided. The conductive layer 395 diffuses static electricity applied by electrostatic discharge to let it go or prevents local electric charges (localization of electric charges) (prevents local potential difference) so that electrostatic breakdown of the semiconductor integrated circuit 350 can be prevented.

Through the above steps, a semiconductor device having a memory of this embodiment can be formed.

The impact diffusion layer is provided in contact with the semiconductor integrated circuit; therefore, if pressure treatment is performed in a manufacturing step, the pressure treatment has no adverse effect such as damages or defective characteristics on the semiconductor integrated circuit. Accordingly, a semiconductor device can be formed with high yield.

With the use of the conductive layer covering the semiconductor integrated circuit, electrostatic breakdown (malfunctions of the circuit or damages of a semiconductor element) due to electrostatic discharge of the semiconductor integrated circuit is prevented. Further, with the use of the pair of impact resistance layers which sandwich the semiconductor integrated circuit and the impact diffusion layer which is stacked below the semiconductor integrated circuit, a highly reliable semiconductor device that is reduced in thickness and size and has tolerance can be provided.

(Embodiment 11)

For a semiconductor device according to an embodiment of the present invention, any of a variety of forms of field effect transistors can be used as a semiconductor element included in a semiconductor integrated circuit. In this embodiment, a field effect transistor including a single crystal semiconductor layer is described in detail as a semiconductor element to which an embodiment of the present invention can be applied.

A method in which a single crystal semiconductor layer made from a single crystal semiconductor substrate is provided over a formation substrate which is a substrate having an insulating surface and a semiconductor element included in a semiconductor integrated circuit portion is formed is described below with reference to FIGS. 14A to 14D and FIGS. 15A to 15C.

Figure 14A:
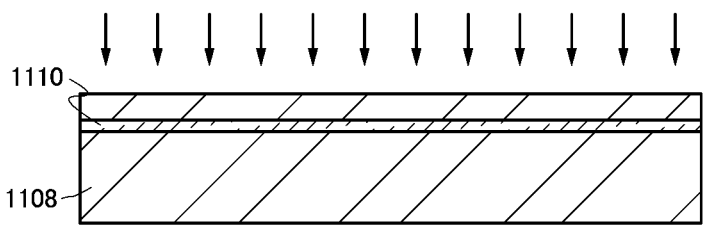
FIGS. 14A to 14D are views illustrating a method for manufacturing a semiconductor device.

A single crystal semiconductor substrate 1108 illustrated in FIG. 14A is cleaned, and is irradiated with ions accelerated by an electric field to a predetermined depth from the surface to form an embrittlement layer 1110. Ion irradiation is performed in consideration of the thickness of a single crystal semiconductor layer which is to be transferred to a formation substrate. An accelerating voltage in irradiation of the ions is set in consideration of such a thickness, and the single crystal semiconductor substrate 1108 is irradiated with the ions. In the present invention, a region which is embrittled by irradiating a single crystal semiconductor substrate with ions so that the region includes microvoids due to the ions is referred to as an embrittlement layer.

As the single crystal semiconductor substrate 1108, a commercial single crystal semiconductor substrate can be used. For example, a single crystal semiconductor substrate formed using a Group 14 element, such as a single crystal silicon substrate, a single crystal germanium substrate, or a single crystal silicon germanium substrate can be used. Alternatively, a compound semiconductor substrate formed using gallium arsenide, indium phosphide, or the like may be used. As the semiconductor substrate, a polycrystalline semiconductor substrate may be used. It is needless to say that the single crystal semiconductor substrate is not limited to a circular wafer, and single crystal semiconductor substrates with a variety of shapes can be used. For example, a polygonal substrate such as a rectangular substrate, a pentagonal substrate, or a hexagonal substrate can be used. It is also needless to say that a commercial circular single crystal semiconductor wafer can be used for the single crystal semiconductor substrate. As the circular single crystal semiconductor wafer, a semiconductor wafer of silicon, germanium, or the like; a compound semiconductor wafer of gallium arsenide, indium phosphide, or the like; or the like can be used. Typical examples of the single crystal semiconductor wafer are circular single crystal silicon wafers which are 5 inches (125 mm) in diameter, 6 inches (150 mm) in diameter, 8 inches (200 mm) in diameter, 12 inches (300 mm) in diameter, 400 mm in diameter, and 450 mm in diameter. Further, a rectangular single crystal semiconductor substrate can be formed by cutting a commercial circular single crystal semiconductor wafer. The substrate can be cut with a cutting device such as a dicer or a wire saw, laser cutting, plasma cutting, electron beam cutting, or any other appropriate cutting means. Alternatively, a rectangular single crystal semiconductor substrate can be formed in such a way that an ingot for manufacturing a semiconductor substrate before being sliced into a substrate is processed into a rectangular solid so as to have a rectangular cross section and the rectangular solid ingot is sliced. Note that although there is no particular limitation on the thickness of the single crystal semiconductor substrate, a thick single crystal semiconductor substrate is preferable in consideration of reuse of the single crystal semiconductor substrate because many single crystal semiconductor layers can be formed from one piece of thick material wafer. The thickness of single crystal silicon wafers circulating in the market conforms to SEMI standards, which specify that, for example, a wafer with a diameter of 6 inches has a thickness of 625 µm, a wafer with a diameter of 8 inches has a thickness of 725 µm, and a wafer with a diameter of 12 inches has a thickness of 775 µm.

Note that the thickness of a wafer conforming to SEMI standards includes a tolerance of ±25 µm. It is needless to say that the thickness of the single crystal semiconductor substrate to be a material is not limited to those of SEMI standards, and the thickness can be adjusted as appropriate when an ingot is sliced. It is also needless to say that when the single crystal semiconductor substrate 1108 is reused, the thickness of the reused single crystal semiconductor substrate 1108 is smaller than the thickness specified by the SEMI standards. A single crystal semiconductor layer obtained over a formation substrate can be determined by selecting a semiconductor substrate to serve as a base.

Further, the crystal plane orientation of the single crystal semiconductor substrate 1108 may be selected depending on a semiconductor element to be manufactured (a field effect transistor in this embodiment). For example, a single crystal semiconductor substrate having a {100} plane, a {110} plane, or the like can be used.

In this embodiment, an ion irradiation separation method is used in which hydrogen, helium, or fluorine ions are added by irradiation to a predetermined depth of the single crystal semiconductor substrate, and then, heat treatment is performed to separate a single crystal semiconductor layer, which is an outer layer. Alternatively, a method may be employed in which single crystal silicon is epitaxially grown on porous silicon and the porous silicon layer is separated by cleavage with water jetting.

A single crystal silicon substrate is used as the single crystal semiconductor substrate 1108, and the surface thereof is processed with dilute hydrofluoric acid. Accordingly, a native oxide film is removed and contaminant such as dust which is attached to the surface is also removed, whereby the surface of the single crystal semiconductor substrate 1108 is cleaned.

The embrittlement layer 1110 may be formed by irradiating the single crystal semiconductor substrate 1108 with ions by an ion doping method (abbreviated as an ID method) or an ion implantation method (abbreviated as an II method). The embrittlement layer 1110 is formed by irradiating the single crystal semiconductor substrate 1108 with ions of hydrogen, helium, or a halogen typified by fluorine. In the case of irradiation of fluorine ions as a halogen element, $BF_3$ may be used as a source gas. Note that ion implantation is a method in which an ionized gas is mass-separated and a semiconductor substrate is irradiated with the ions.

For example, an ionized hydrogen gas is mass-separated by an ion implantation method and only $H^+$ ions (or only $H_2^+$ ions) can be selectively accelerated and a single crystal semiconductor substrate can be irradiated with the ions.

In an ion doping method, without mass separation of an ionized gas, plural kinds of ion species are generated in plasma and accelerated, and then a single crystal semiconductor substrate is irradiated with the accelerated ion species. For example, when the single crystal semiconductor substrate is irradiated with hydrogen ions including $H^+$ ions, $H_2^+$ ions, and $H_3^+$ ions, the proportion of $H_3^+$ ions is typically 50% or more, for example, in general, the proportion of $H_3^+$ ions is 80% and the proportion of other ions ($H_2^+$ ions and $H^+$ ions) is 20%. Here, ion doping also refers to irradiation of only $H_3^+$ ions as ion species.

Alternatively, irradiation may be performed with one ion or plural ions formed of the same atoms which have different mass. For example, in the case of irradiation of hydrogen ions, the hydrogen ions preferably include $H^+$ ions, $H_2^+$ ions, and $H_3^+$ ions with a high proportion of $H_3^+$ ions. In the case of hydrogen ion irradiation, when the hydrogen ions include $H^+$ ions, $H_2^+$ ions, and $H_3^+$ ions with a high proportion of $H_3^+$ ions, efficiency in irradiation can be increased and irradiation time can be reduced. With this structure, separation can be performed easily.

An ion doping method and an ion implantation method are described below in detail. In an ion doping apparatus (also referred to as an ID apparatus) used in an ion doping method, a plasma space is large, so that the single crystal semiconductor substrate can be irradiated with a large amount of ions. On the other hand, an ion implantation apparatus (also referred to as an II apparatus) used in an ion implantation method has a characteristic that mass separation is performed on ions extracted from plasma and only specific ion species can be introduced into a semiconductor substrate. In the ion implantation method, processing is usually performed by scanning a point beam.

As for a plasma generation method, both of the apparatuses create a plasma state by thermoelectrons which are emitted by heating a filament, for example. However, an ion doping method and an ion implantation method differ greatly in the proportion of the hydrogen ion species when the semiconductor substrate is irradiated with hydrogen ions ($H^+$, $H_2^+$, and $H_3^+$) which are generated.

In view of irradiation of a larger amount of $H_3^+$, the ion doping apparatus is preferable to the ion implantation apparatus.

When the single crystal silicon substrate is irradiated with hydrogen ions or halogen ions such as fluorine ions, hydrogen or fluorine which is added knocks out (expels) silicon atoms in a silicon crystal lattice, so that blank portions are created effectively and microvoids are made in the embrittlement layer. In this case, the volume of the microvoids formed in the embrittlement layer is changed by heat treatment at relatively low temperature and separation is performed along the embrittlement layer, so that a thin single crystal semiconductor layer can be formed. After the irradiation of fluorine ions, irradiation of hydrogen ions may be performed so that hydrogen is contained in the voids. Since the embrittlement layer which is formed to separate the thin single crystal semiconductor layer from the single crystal semiconductor substrate is separated using change in volume of the microvoids formed in the embrittlement layer, it is preferable to make effective use of action of fluorine ions or hydrogen ions in such a manner.

A protective layer may be formed between the single crystal semiconductor substrate and an insulating layer which is to be bonded to the single crystal semiconductor layer. The protective layer can be formed of a single layer selected from a silicon nitride layer, a silicon oxide layer, a silicon nitride oxide layer, or a silicon oxynitride layer or a stack of a plurality of layers. These layers can be formed over the single crystal semiconductor substrate before the embrittlement layer is formed in the single crystal semiconductor substrate. Alternatively, these layers may be formed over the single crystal semiconductor substrate after the embrittlement layer is formed in the single crystal semiconductor substrate.

Note that a silicon oxynitride layer refers to a layer that contains more oxygen than nitrogen and, in the case where measurements are performed using Rutherford backscattering spectrometry (RBS) and hydrogen forward scattering (HFS), contains oxygen, nitrogen, silicon, and hydrogen at concentrations of 50 to 70 at. %, 0.5 to 15 at. %, 25 to 35 at. %, and 0.1 to 10 at. %, respectively. Further, a silicon nitride oxide layer refers to a layer that contains more nitrogen than oxygen and, in the case where measurements are performed using RBS and HFS, contains oxygen, nitrogen, silicon, and hydrogen at concentrations of 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

It is necessary to perform irradiation of ions under high dose conditions in the formation of the embrittlement layer, and the surface of the single crystal semiconductor substrate 1108 is roughened in some cases. Accordingly, a protective layer against the ion irradiation, such as a silicon nitride film, a silicon nitride oxide film, or a silicon oxide film may be provided to a thickness of 50 to 200 nm on the surface to be irradiated with ions.

For example, a stack of a silicon oxynitride film (a thickness of 5 nm to 300 nm, preferably 30 nm to 150 nm (for example, 50 nm)) and a silicon nitride oxide film (a thickness of 5 nm to 150 nm, preferably 10 to 100 nm (for example, 50 nm)) is formed as the protective layer over the single crystal semiconductor substrate 1108 by a plasma CVD method. As an example, a silicon oxynitride film is formed to a thickness of 50 nm over the single crystal semiconductor substrate 1108, and a silicon nitride oxide film is formed to a thickness of 50 nm over the silicon oxynitride film. Instead of the silicon oxynitride film, a silicon oxide film formed by a chemical vapor deposition method using an organosilane gas may be used.

Alternatively, thermal oxidation may be performed after the single crystal semiconductor substrate 1108 is degreased and cleaned and an oxide film on the surface is removed. As thermal oxidation, general dry oxidation may be performed, and preferably, oxidation in an oxidizing atmosphere to which halogen is added is performed. For example, heat treatment is performed at a temperature of 700° C. or higher in an atmosphere containing HCl at 0.5 to 10 volume % (preferably 3 volume %) with respect to oxygen. Thermal oxidation is preferably performed at a temperature of 950 to 1100° C. The processing time may be 0.1 to 6 hours, preferably 0.5 to 3.5 hours. The thickness of the oxide film to be formed is 10 to 1000 nm (preferably 50 to 200 nm), and for example, the thickness is 100 nm.

As a substance containing halogen, other than HCl, one or more of HF, $NF_3$, HBr, $Cl_2$, $ClF_3$, $BCl_3$, $F_2$, $Br_2$, dichloroethylene, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by action of chlorine and removed. The heat treatment has an advantageous effect on the case where the surface of the single crystal semiconductor substrate 1108 is subjected to a chemical mechanical polishing (CMP) process. Further, hydrogen has an effect of compensating a defect at the interface between the single crystal semiconductor substrate 1108 and an insulating layer to be formed so as to reduce local level density at the interface, and thus the interface between the single crystal semiconductor substrate 1108 and the insulating layer is inactivated to stabilize electric characteristics.

Halogen can be contained in the oxide film formed by the heat treatment. A halogen element is contained at a concentration of $1 \times 10^{17}$ to $5 \times 10^{20}$ atoms/cm$^3$, whereby the oxide film can function as a protective layer which captures impurities such as metal to prevent contamination of the single crystal semiconductor substrate 1108.

When the embrittlement layer 1110 is formed, the accelerating voltage and the total number of ions can be adjusted depending on the thickness of films deposited on the single crystal semiconductor substrate, the thickness of the targeted single crystal semiconductor layer which is separated from the single crystal semiconductor substrate and transferred to a formation substrate, and ion species with which irradiation is performed.

For example, a hydrogen gas is used for a raw material, and irradiation of ions is performed at an accelerating voltage of 40 kV with the total ion number of $2 \times 10^{16}$ ions/cm$^2$ by an ion doping method, so that the embrittlement layer can be formed. If the protective layer is formed to be thick and irradiation of ions is performed under the same conditions to form the embrittlement layer, a thin single crystal semiconductor layer can be formed as a targeted single crystal semiconductor layer which is separated from the single crystal semiconductor substrate and transferred (transposed) to the formation substrate. For example, although it depends on the proportion of ion species (H$^+$ ions, H$_2^+$ ions, and H$_3^+$ ions), when the embrittlement layer is formed under the above conditions and a silicon oxynitride film (a thickness of 50 nm) and a silicon nitride oxide film (a thickness of 50 nm) are stacked as a protective layer over the single crystal semiconductor substrate, the thickness of the single crystal semiconductor layer to be transferred to the formation substrate is about 120 nm. Alternatively, when a silicon oxynitride film (a thickness of 100 nm) and a silicon nitride oxide film (a thickness of 50 nm) are stacked as a protective layer over the single crystal semiconductor substrate, the thickness of the single crystal semiconductor layer to be transferred to the formation substrate is about 70 nm.

When helium (He) or hydrogen is used for a source gas, irradiation is performed at an accelerating voltage of 10 to 200 kV with a dose of $1 \times 10^{16}$ to $6 \times 10^{16}$ ions/cm$^2$, so that the embrittlement layer can be formed. When helium is used for the source gas, irradiation of He ions as main ions can be performed without mass separation. Further, when hydrogen is used for the source gas, irradiation of H$_3^+$ ions and H$_2^+$ ions as main ions can be performed. Ion species are changed depending on a plasma generation method, pressure, the supply quantity of source gas, or an accelerating voltage.

As an example of forming the embrittlement layer, a silicon oxynitride film (a thickness of 50 nm), a silicon nitride oxide film (a thickness of 50 nm), and a silicon oxide film (a thickness of 50 nm) are stacked as a protective layer over the single crystal semiconductor substrate, and irradiation of hydrogen is performed at an accelerating voltage of 40 kV with a dose of $2 \times 10^{16}$ ions/cm$^2$, so that the embrittlement layer is formed in the single crystal semiconductor substrate. After that, a silicon oxide film (a thickness of 50 nm) is formed as an insulating layer having a bonding surface over the silicon oxide film, which is an uppermost layer of the protective layer. As another example of forming the embrittlement layer, a silicon oxide film (a thickness of 100 nm) and a silicon nitride oxide film (a thickness of 50 nm) are stacked as a protective layer over the single crystal semiconductor substrate, and irradiation of hydrogen is performed at an accelerating voltage of 40 kV with a dose of $2 \times 10^{16}$ ions/cm$^2$, so that the embrittlement layer is formed in the single crystal semiconductor substrate. After that, a silicon oxide film (a thickness of 50 nm) is formed as an insulating layer having a bonding surface over the silicon nitride oxide film, which is an uppermost layer of the protective layer. Note that the silicon oxynitride film and the silicon nitride oxide film may be formed by a plasma CVD method, and the silicon oxide film may be formed by a CVD method using an organosilane gas.

Alternatively, an insulating layer may be formed between the formation substrate and the single crystal semiconductor substrate. The insulating layer may be formed on either the formation substrate side or the single crystal semiconductor substrate side, or both of the sides. An insulating layer formed on a surface which is to be bonded has a smooth surface and forms a hydrophilic surface. A silicon oxide film can be used as the insulating layer. As the silicon oxide film, a silicon oxide film formed by a chemical vapor deposition method using an organosilane gas is preferably used. Alternatively, a silicon oxide film formed by a chemical vapor deposition method using a silane gas may be used.

Examples of organosilane gas which can be used are silicon-containing compounds such as tetraethyl orthosilicate (TEOS: Si(OC$_2$H$_5$)$_4$), trimethylsilane (TMS: (CH$_3$)$_3$SiH), tetramethylsilane (Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), and trisdimethylaminosilane (SiH(N(CH$_3$)$_2$)$_3$). Note that when a silicon oxide layer is formed by a chemical vapor deposition method using organosilane for a source gas, it is preferable to mix a gas which provides oxygen. Oxygen, nitrous oxide, nitrogen dioxide, or the like can be used as the gas which provides oxygen. Further, an inert gas such as argon, helium, nitrogen, or hydrogen may be mixed.

Alternatively, as the insulating layer formed on the surface which is to be bonded, a silicon oxide film formed by a chemical vapor deposition method using silane such as monosilane, disilane, or trisilane for a source gas may be used. Also in this case, it is preferable to mix an inert gas, a gas which provides oxygen, or the like. Further, the silicon oxide film to serve as an insulating layer bonded to the single crystal semiconductor layer may contain chlorine. Note that in this specification, a chemical vapor deposition (CVD) method includes a plasma CVD method, a thermal CVD method, and a photo-CVD method in its category.

Alternatively, as the insulating layer formed on the surface which is to be bonded, silicon oxide formed by heat treatment in an oxidizing atmosphere, silicon oxide which grows by reaction of oxygen radicals, chemical oxide formed with an oxidizing chemical solution, or the like may be used. As the insulating layer, an insulating layer having a siloxane (Si—O—Si) bond may be used. Further, the insulating layer may be formed by reaction between the organosilane gas and oxygen radicals or nitrogen radicals.

Alternatively, an oxide film containing aluminum oxide as its main component may be used as an insulating layer formed on the surface which is to be bonded. The oxide film containing aluminum oxide as its main component refers to an oxide film in which aluminum oxide is contained at at least 10% by weight where the total amount of all components in the oxide film is 100% by weight. Alternatively, as the insulating layer, a film which contains aluminum oxide as its main component and also contains one or both of magnesium oxide and strontium oxide can be used. Note that aluminum oxide containing nitrogen may be used.

The insulating layer can be formed by a sputtering method. As a target used in a sputtering method, for example, metal containing aluminum or metal oxide such as aluminum oxide can be used. Note that a material of the target may be selected as appropriate depending on the film to be formed.

In the case where metal is used as the target, the insulating layer is formed in such a manner that sputtering is performed while a reactive gas (for example, oxygen) is introduced (by a reactive sputtering method). As the metal, magnesium (Mg); an alloy containing aluminum and magnesium; an alloy containing aluminum and strontium (Sr); or an alloy containing aluminum, magnesium, and strontium can be used other than aluminum. In this case, sputtering may be performed using a direct current (DC) power supply or a radio frequency (RF) power supply.

In the case where metal oxide is used as the target, the insulating layer is formed by sputtering with a radio frequency (RF) power supply (by an RF sputtering method). As the metal oxide, magnesium oxide; strontium oxide; oxide containing aluminum and magnesium; oxide containing aluminum and strontium; or oxide containing aluminum, magnesium, and strontium can be used other than aluminum oxide.

Alternatively, the insulating layer may be formed by a bias sputtering method. In the case where a bias sputtering method is used, a film can be deposited while a surface of the film can be planarized.

The oxide film containing aluminum as its main component can prevent impurities such as moisture and mobile ions included in the formation substrate from diffusing into a single crystal semiconductor layer to be provided over the formation substrate later.

The surface of the insulating layer, which is to be bonded, is preferably set as follows: arithmetic mean roughness Ra is less than 0.8 nm and root-mean-square roughness Rms is less than 0.9 nm; more preferably, Ra is 0.4 nm or less and Rms is 0.5 nm or less; still preferably, Ra is 0.3 nm or less and Rms is 0.4 nm or less. For example, Ra is 0.27 nm and Rms is 0.34 nm. In this specification, Ra is arithmetic mean roughness; Rms is root-mean-square roughness; and the measurement area is 2 $\mu m^2$ or 10 $\mu m^2$.

When the formation substrate and the single crystal semiconductor substrate are bonded to each other, a strong bond can be formed by providing an insulating layer which is formed of a silicon oxide film preferably using organosilane for a raw material on one or both of surfaces which are to be bonded to each other.

Figure 14B:
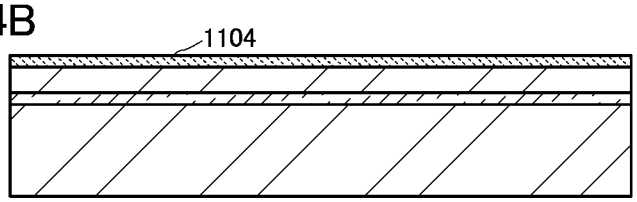

In this embodiment, as illustrated in FIG. 14B, a silicon oxide film is formed as an insulating layer 1104 on the surface which is bonded to the formation substrate. As the silicon oxide film, a silicon oxide film formed by a chemical vapor deposition method using an organosilane gas is preferably used. Alternatively, a silicon oxide film formed by a chemical vapor deposition method using a silane gas may be used. In deposition by a chemical vapor deposition method, a deposition temperature of, for example, 350° C. or lower (300° C. as a specific example) is applied as the temperature at which degasification does not occur from the embrittlement layer 1110 formed in the single crystal semiconductor substrate. Further, heat treatment temperature which is higher than the deposition temperature is applied to heat treatment by which the single crystal semiconductor layer is separated from the single crystal semiconductor substrate.

In this embodiment, a separation layer is formed between the formation substrate and a semiconductor element layer so that the semiconductor element layer is separated from the formation substrate after the semiconductor element layer is provided on the formation substrate. Thus, the single crystal semiconductor layer which is separated from the single crystal semiconductor substrate to be bonded is provided over a separation layer (and an inorganic insulating film) formed over a formation substrate. When a surface of the separation layer is uneven, the contact area of the bonding surface is small in the step of bonding the single crystal semiconductor substrate and the formation substrate; therefore, it is difficult to keep enough bonding strength. Therefore, the step of planarizing the separation layer is necessary.

The separation layer may be formed on the separation substrate side or on the single crystal semiconductor substrate side as long as it is formed between the formation substrate and the single crystal semiconductor layer. Planarization treatment is performed on the separation layer formed on the formation substrate side or on the single crystal semiconductor substrate side.

The insulating layer may also be formed on the formation substrate side or on the single crystal semiconductor substrate side, and/or on the separation layer side. In the case where the formation substrate or the single crystal semiconductor substrate and the separation layer can be directly bonded to each other, the insulating layer is not necessarily provided.

In this embodiment, an example is described in which a separation layer 1125 is formed on the side of a formation substrate 1101 and a blocking layer 1109 is formed over the separation layer 1125.

As planarization treatment, polishing treatment or etching treatment may be performed. It is needless to say that both polishing treatment and etching treatment may be performed. For polishing treatment, a chemical mechanical polishing (CMP) method or a liquid jet polishing method can be used. For etching treatment, wet etching, dry etching, or both of them can be used as appropriate.

Alternatively, planarization treatment may be performed by plasma treatment. For example, by performing planarization treatment by a reverse sputtering method, steps from formation of the insulating layer to planarization can be performed in one apparatus, so that throughput is increased, which is preferable.

A reverse sputtering method is performed, for example, by introducing an inert gas such as an Ar gas in a high vacuum chamber and applying an electric field to a surface to be processed so that a plasma state is generated. In plasma, electrons and positive ions of Ar exist and the positive ions of Ar are accelerated in a cathode direction. The surface to be processed is sputtered with the accelerated positive ions of Ar. At that time, a projected portion of the surface to be processed is preferentially sputtered. Particles of sputtering from the surface to be processed attach to another place of the surface to be processed. At that time, the particles of sputtering from the surface to be processed preferentially attach to a depressed portion of the surface to be processed. By thus partially removing the projected portion and filling the depressed portion, planarity of the surface to be processed is increased.

In this embodiment, the separation layer is formed by a sputtering method and planarization treatment is performed by a reverse sputtering method.

The formation substrate may be provided with a silicon nitride film or a silicon nitride oxide film which prevents diffusion of an impurity element as a blocking layer (also referred to as a barrier layer) between the separation layer and the formation substrate. Further, a silicon oxynitride film may be combined as an insulating film having a function of relieving stress.

Figure 14C:
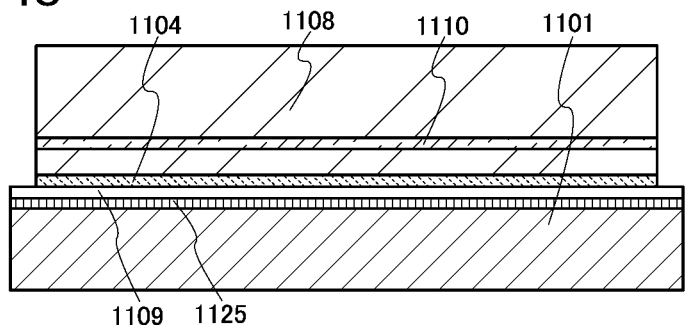

FIG. 14C illustrates a mode in which the blocking layer 1109 provided over the formation substrate 1101 and a surface of the single crystal semiconductor substrate 1108, on which the insulating layer 1104 is formed, are disposed in close contact with each other and bonded to each other. Being provided on the separation layer 1125 which has been planarized, a surface of the blocking layer 1109 has high planarity. The surfaces which are to be bonded to each other are cleaned sufficiently. The surface of the blocking layer 1109 provided over the formation substrate 1101 and the surface of the single crystal semiconductor substrate 1108, on which the insulating layer 1104 is formed, may be cleaned by megasonic cleaning or the like. Further, the surfaces may be cleaned with ozone water after megasonic cleaning, so that an organic substance can be removed and the hydrophilicity of the surfaces can be improved.

By making the blocking layer 1109 over the formation substrate 1101 and the insulating layer 1104 face each other and pressing one part thereof from the outside, the blocking layer 1109 and the insulating layer 1104 attract each other by increase in van der Waals forces or influence of hydrogen bonding due to local reduction in distance between the bonding surfaces. Further, since the distance between the blocking layer 1109 over the formation substrate 1101 and the insulating layer 1104 which face each other in an adjacent region is also reduced, a region in which van der Waals forces strongly act or a region which is influenced by hydrogen bonding is increased. Accordingly, bonding proceeds and spreads across the entire bonding surfaces.

When the blocking layer 1109 and the insulating layer 1104 are pressed against each other so that one of the four corners of the substrate is pressed at a pressure of 100 to 5000 kPa, the bonding surfaces come close to each other; thus, the bonding can shift from Van der Waals force to hydrogen bonding. When the bonding surfaces at one portion come close to each other in the substrate, the bonding surfaces at the adjacent portion also come close to each other and the bonding shifts to hydrogen bonding; thus, the bonding at the entire surfaces can shift to hydrogen bonding.

In order to form a favorable bond, the surface may be activated. For example, the surface which is to be bonded is irradiated with an atomic beam or an ion beam. When an atomic beam or an ion beam is used, an inert gas neutral atom beam or an inert gas ion beam of argon or the like can be used. Alternatively, plasma irradiation or radical treatment is performed. Such surface treatment makes it easier to form a bond between materials of different kinds even at a temperature of 200 to 400° C.

Further, in order to increase bonding strength of a bonding interface between the formation substrate and the insulating layer, heat treatment is preferably performed. For example, heat treatment is performed at a temperature of 70 to 350° C. (for example, at 200° C. for 2 hours) in an oven, a furnace, or the like.

Figure 14D:
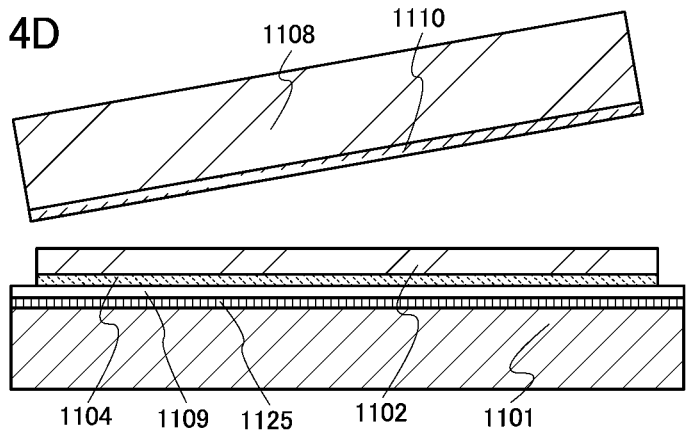

In FIG. 14D, after the formation substrate 1101 and the single crystal semiconductor substrate 1108 are attached to each other, heat treatment is performed, and the single crystal semiconductor substrate 1108 is separated from the formation substrate 1101 by using the embrittlement layer 1110 as a cleavage plane. When heat treatment is performed at, for example, 400 to 700° C., the volume of the microvoids formed in the embrittlement layer 1110 is changed, which enables cleavage along the embrittlement layer 1110. Since the insulating layer 1104 is bonded to the formation substrate 1101 with the blocking layer 1109 interposed therebetween, a single crystal semiconductor layer 1102 having the same crystallinity as the single crystal semiconductor substrate 1108 is left over the formation substrate 1101.

Heat treatment in a temperature range of 400 to 700° C. may be continuously performed in the apparatus same as that for the above heat treatment for increasing bonding strength or in another apparatus. For example, after heat treatment in a furnace at 200° C. for 2 hours, the temperature is increased to near 600° C. and held for 2 hours; the temperature is decreased to a temperature ranging from 400° C. to room temperature; and then the substrate is taken out of the furnace. Alternatively, heat treatment may be performed at the temperature increasing from room temperature. Further, after heat treatment is performed in a furnace at 200° C. for 2 hours, heat treatment may be performed in a temperature range of 600 to 700° C. in a rapid thermal annealing (RTA) apparatus for 1 minute to 30 minutes (for example, at 600° C. for 7 minutes or at 650° C. for 7 minutes).

By heat treatment in a temperature range of 400 to 700° C., bonding between the insulating layer and the formation substrate shifts from hydrogen bonding to covalent bonding, and an element added to the embrittlement layer is separated out and the pressure rises, whereby the single crystal semiconductor layer can be separated from the single crystal semiconductor substrate. After the heat treatment, one of the formation substrate and the single crystal semiconductor substrate is provided over the other, and the formation substrate and the single crystal semiconductor substrate can be separated from each other without application of large force. For example, one substrate located over the other substrate is lifted by a vacuum chuck, so that the substrate can be easily separated. At this time, if the substrate on a lower side is fixed with a vacuum chuck or a mechanical chuck, the formation substrate and the single crystal semiconductor substrate can be separated from each other without horizontal misalignment.

Note that FIGS. 14A to 14D and FIGS. 15A to 15C illustrate an example in which the single crystal semiconductor substrate 1108 is smaller than the formation substrate 1101; however, the present invention is not limited thereto, and the single crystal semiconductor substrate 1108 and the formation substrate 1101 may have the same size or the single crystal semiconductor substrate 1108 may be larger than the formation substrate 1101.

Figure 15A:
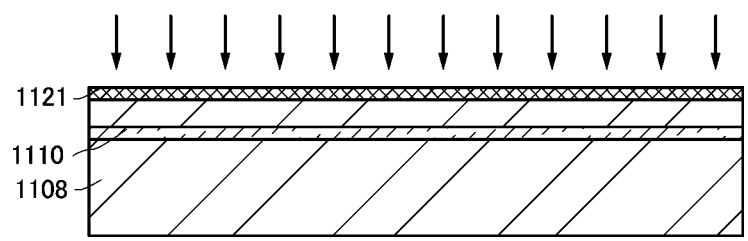
FIGS. 15A to 15C are views illustrating a method for manufacturing a semiconductor device.
Figure 15B:
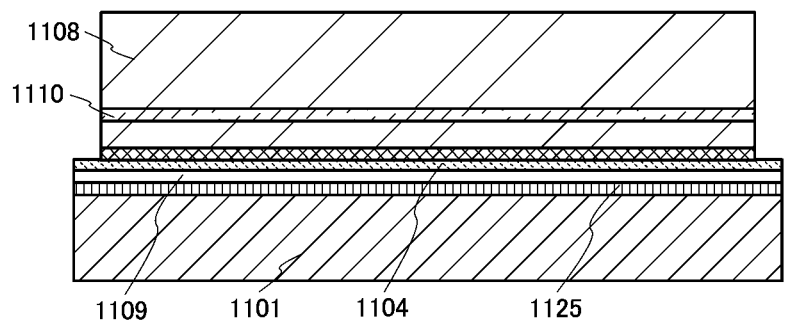
Figure 15C:
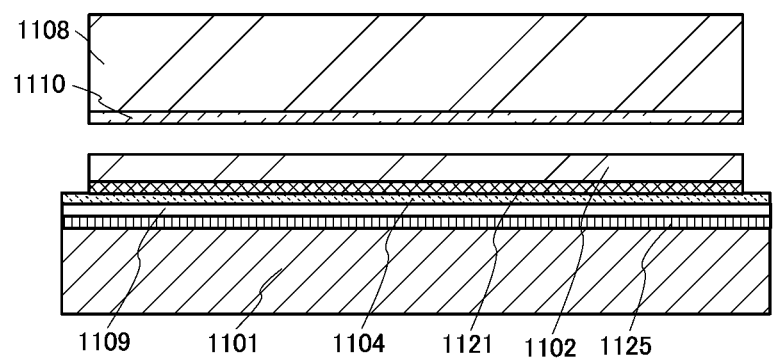

FIGS. 15A to 15C illustrate steps in which an insulating layer is provided on the formation substrate side and a single crystal semiconductor layer is formed. FIG. 15A illustrates a step in which irradiation of ions accelerated by an electric field is performed to a predetermined depth of the single crystal semiconductor substrate 1108 provided with a silicon oxide film as a protective layer 1121 to form the embrittlement layer 1110. Ion irradiation is performed in a manner similar to that in the case of FIG. 14A. By forming the protective layer 1121 on the surface of the single crystal semiconductor substrate 1108, the surface can be prevented from being damaged by ion irradiation and losing the planarity. Further, the protective layer 1121 has an advantageous effect of preventing diffusion of impurities into the single crystal semiconductor layer 1102 formed from the single crystal semiconductor substrate 1108.

FIG. 15B illustrates a step in which the formation substrate 1101 provided with the blocking layer 1109 and the insulating layer 1104 is disposed in close contact with the surface of the single crystal semiconductor substrate 1108, on which the protective layer 1121 is formed, to form a bond. The bond is formed by disposing the insulating layer 1104 over the formation substrate 1101 in close contact with the protective layer 1121 over the single crystal semiconductor substrate 1108.

After that, the single crystal semiconductor substrate 1108 is separated as illustrated in FIG. 15C. Heat treatment for separating a single crystal semiconductor layer is performed in a manner similar to that in the case of FIG. 14D. Thus, a semiconductor substrate having an SOI structure which includes the single crystal semiconductor layer over the substrate with the insulating layer interposed therebetween can be obtained as illustrated in FIG. 15C.

In some cases, the single crystal semiconductor layer which is separated from the single crystal semiconductor substrate and transferred to the formation substrate has crystal defects due to the separation step and the ion irradiation step and thus loses surface planarity and has unevenness. In the case where a transistor is formed as a semiconductor element by using the single crystal semiconductor layer, it is difficult to form a thin gate insulating layer with a high withstand voltage on the surface of the single crystal semiconductor layer having such unevenness. Further, if the single crystal semiconductor layer has crystal defects, performance and reliability of the transistor are adversely affected; for example, a localized interface state density with the gate insulating layer is increased.

Therefore, the single crystal semiconductor layer is preferably irradiated with electromagnetic waves such as a laser beam to reduce crystal defects. At least part of the single crystal semiconductor layer is melted by irradiation with electromagnetic waves, whereby crystal defects in the single crystal semiconductor layer can be reduced. Note that an oxide film (a native oxide film or a chemical oxide film) formed on the surface of the single crystal semiconductor layer may be removed by dilute hydrofluoric acid before irradiation with the electromagnetic waves.

Any electromagnetic wave may be used as long as it provides high energy to the single crystal semiconductor layer, and a laser beam can be preferably used.

Alternatively, the energy can be supplied mainly by heat conduction which is caused by colliding the particles having high energy with the single crystal semiconductor layer by irradiation or the like. As a heat source for supplying the particles having high energy, plasma such as atmospheric-pressure plasma, high-pressure plasma, or a thermal plasma jet, a flame of a gas burner, or the like can be used. Alternatively, an electron beam or the like can be used.

A wavelength of the electromagnetic wave is set so that it is absorbed by the single crystal semiconductor layer. The wavelength can be determined in consideration of the skin depth of the electromagnetic wave or the like. For example, the wavelength of the electromagnetic wave can be 190 to 600 nm. Moreover, the electromagnetic wave energy can be determined in consideration of the wavelength of the electromagnetic wave, the skin depth of the electromagnetic wave, the thickness of the single crystal semiconductor layer to be irradiated, or the like.

A laser emitting laser beam can be a continuous wave laser, a pseudo continuous wave laser, or a pulsed laser. A pulsed laser is preferably used for partial melting. For example, an excimer laser such as a KrF laser, or a gas laser such as an Ar laser or a Kr laser can be used. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, and the like can be used. Note that an excimer laser is a pulsed laser, and some solid-state lasers such as a YAG laser can be used as a continuous wave laser, a pseudo continuous wave laser, and a pulsed laser. In addition, as for a solid-state laser, the second to fifth harmonics of a fundamental wave can be preferably used. Further, a semiconductor laser of GaN, GaAs, GaAlAs, InGaAsP, or the like can be used.

If the single crystal semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high-pressure sodium lamp, or a high-pressure mercury lamp may be used. Flash annealing with the use of the above lamp light may be used. Since flash annealing which is performed by preferably using a halogen lamp, a xenon lamp, or the like takes very short treatment time, heating up of the formation substrate can be suppressed.

A shutter, a reflector such as a mirror or a half mirror, an optical system including a cylindrical lens, a convex lens, or the like may be provided in order to adjust the shape or the path of electromagnetic waves.

Note that for irradiation with electromagnetic waves, an electromagnetic wave may be selectively emitted, or light (an electromagnetic wave) can be emitted by scanning the light (the electromagnetic wave) in the X-Y directions. In this case, a polygon mirror or a galvanometer mirror is preferably used in the optical system.

Irradiation with electromagnetic waves can be performed in an atmosphere which contains oxygen, such as an atmospheric atmosphere, or in an inert atmosphere such as a nitrogen atmosphere. In order to perform irradiation with electromagnetic waves in an inert atmosphere, irradiation with electromagnetic waves may be performed in an airtight chamber an atmosphere in which is controlled. In the case where a chamber is not used, a nitrogen atmosphere can be formed by spraying an inert gas such as a nitrogen gas on a surface to be irradiated with electromagnetic waves.

Further, polishing treatment may be performed on the surface of the single crystal semiconductor layer to which high energy is supplied by electromagnetic wave irradiation or the like to reduce crystal defects. Polishing treatment can enhance the planarity of the surface of the single crystal semiconductor layer.

For the polishing treatment, a chemical mechanical polishing (CMP) method or a liquid jet polishing method can be used. Note that the surface of the single crystal semiconductor layer is cleaned to be purified before the polishing treatment. The cleaning may be performed by megasonic cleaning, two-fluid jet cleaning, or the like; and dust or the like on the surface of the single crystal semiconductor layer is removed by the cleaning. Further, it is preferable to remove a native oxide film or the like on the surface of the single crystal semiconductor layer by using a dilute hydrofluoric acid to expose the single crystal semiconductor layer.

Further, polishing treatment (or etching treatment) may be performed on the surface of the single crystal semiconductor layer before irradiation with electromagnetic waves.

Further, by performing the step of reusing the single crystal semiconductor substrate from which a single crystal semiconductor layer is separated (recycling treatment of the semiconductor substrate), cost reduction can be achieved.

Further, when the single crystal semiconductor layer is transferred from the single crystal semiconductor substrate, the single crystal semiconductor substrate is selectively etched, and a plurality of single crystal semiconductor layers of which shapes are processed may be transferred to a formation substrate. A plurality of island-shaped single crystal semiconductor layers can be formed over the formation substrate. Since the single crystal semiconductor layers of which shapes are processed in advance are transferred from the single crystal semiconductor substrate, there is no limitation on the size and shape of the single crystal semiconductor substrate. Therefore, the single crystal semiconductor layers can be more efficiently transferred to a large formation substrate.

Further, the single crystal semiconductor layer which is bonded to the formation substrate is etched so that the shape of the single crystal semiconductor layer may be processed, modified, and controlled precisely. Accordingly, the single crystal semiconductor layer can be processed to have the shape of a semiconductor element, and error in a formation position and a defect in the shape of the single crystal semiconductor layer due to pattern misalignment caused by light in light exposure for forming a resist mask, which goes around the resist mask, positional misalignment caused by a bonding step in transferring the single crystal semiconductor layer, or the like can be modified.

After being separated from the single crystal semiconductor substrate, the single crystal semiconductor layer may be bonded to the formation substrate. The surface of the single crystal semiconductor layer which is exposed by cleavage may face and be bonded to the formation substrate or may be bonded to the formation substrate so as to be in contact with the gate insulating film.

In this embodiment, when a single crystal silicon substrate is used as the single crystal semiconductor substrate 1108, a single crystal silicon layer can be obtained as the single crystal semiconductor layer 1102. Further, since a method for manufacturing a semiconductor device in this embodiment allows the process temperature to be 700° C. or lower, a glass substrate can be used as the formation substrate 1101. That is, a transistor can be formed over a glass substrate in a manner similar to that of a conventional thin film transistor, and a single crystal silicon layer can be used for the semiconductor layer. Accordingly, it is possible to form a transistor with high performance and high reliability, which can operate at high speed, has a low subthreshold value and high field effect mobility, and can be driven with low voltage consumption, over a formation substrate such as a glass substrate.

This embodiment can be combined with any one of Embodiments 1 to 10 as appropriate.

(Embodiment 12)

In this embodiment, an example of a semiconductor device having higher reliability is described. Specifically, as examples of the semiconductor device, examples of a microprocessor and a semiconductor device which has an arithmetic function and can transmit and receive data without contact are described.

Figure 12:
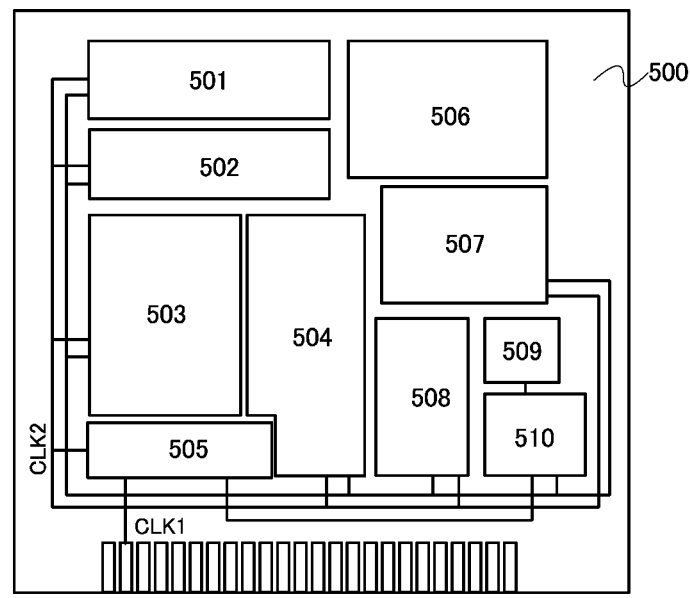
FIG. 12 is a block diagram illustrating a structure of a microprocessor which can be obtained using a semiconductor device.

FIG. 12 illustrates a structure of a microprocessor 500 as an example of a semiconductor device. The microprocessor 500 is manufactured using the semiconductor device of the above embodiment. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 illustrated in FIG. 12 is just an example of the simplified structure, and practical microprocessors have various structures depending on usage.

Figure 13:
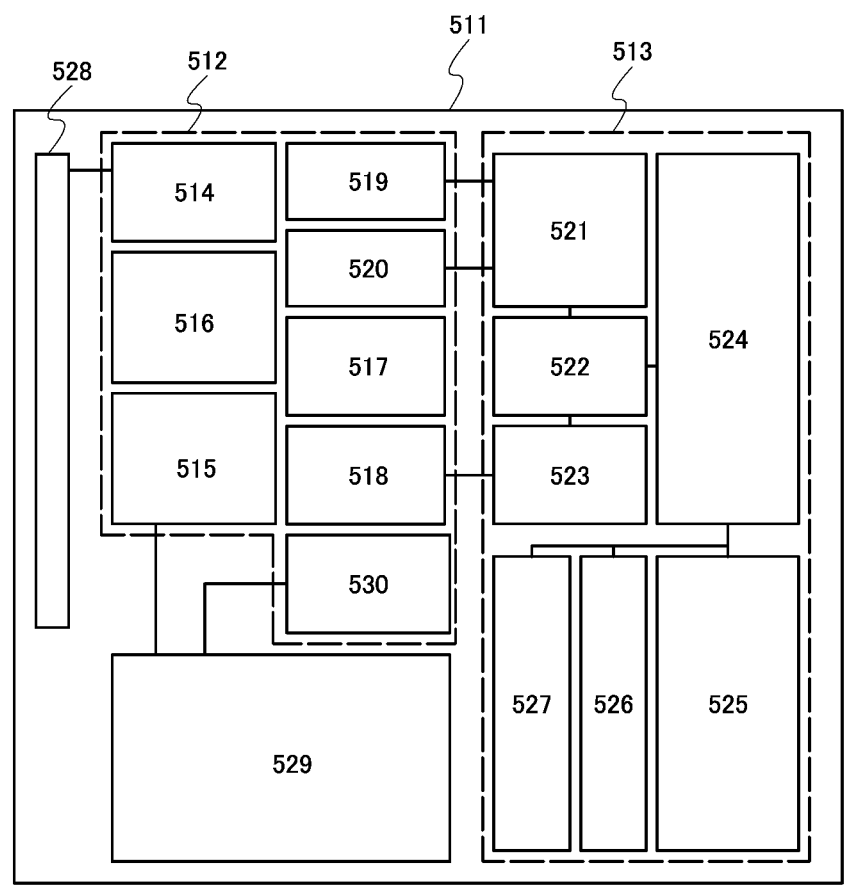
FIG. 13 is a block diagram illustrating a structure of an RFCPU which can be obtained using a semiconductor device.

Next, an example of a semiconductor device which has an arithmetic function and can transmit and receive data without contact is described with reference to FIG. 13. FIG. 13 is an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially constitutes the RFCPU 511.

The reset circuit 517 generates a signal that resets the digital circuit portion 513 to be initialized. For example, a signal which rises with a delay to a rise of the power source voltage is generated as a reset signal. The oscillator circuit 518 changes the frequency and the duty ratio of a clock signal in accordance with a control signal generated by the constant voltage circuit 516. The demodulation circuit 519 having a low pass filter, for example, binarizes changes in amplitude of received signals of an amplitude shift keying (ASK) system. The modulation circuit 520 changes the amplitude of transmitted signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method in which a circuit dedicated to arithmetic is formed and an arithmetic process is conducted using hardware may be employed. In a method in which both hardware and software are used, a method can be employed in which a part of process is conducted in the circuit dedicated to arithmetic and the other part of the arithmetic process is conducted by the central processing unit 525 using a program.

Also in the microprocessor according to this embodiment, with the use of a pair of the impact resistance layers which sandwich the semiconductor integration circuit and the impact diffusion layer which is stacked below the semiconductor integrated circuit, a highly reliable semiconductor device that is reduced in thickness and size and has strength can be provided.

(Embodiment 13)

In this embodiment, an example of usage of the semiconductor device described in the above embodiment is described. Specifically, an application example of a semiconductor device to/from which data can be input/output without contact is described with reference to a drawing. The semiconductor device capable of inputting and outputting data without contact is also referred to as an RFID tag, an ID tag, an IC tag, an IC chip, an RF tag, a wireless tag, an electronic tag, or a wireless chip depending on usage pattern.

Figure 10:
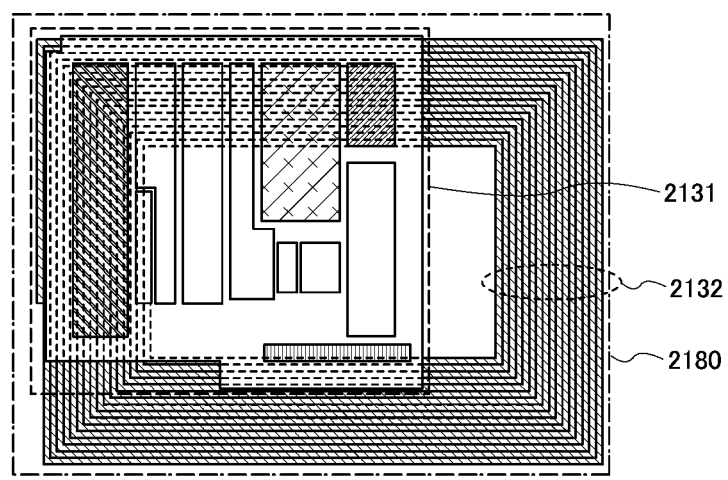
FIG. 10 is a diagram illustrating a semiconductor device.

An example of a top structure of a semiconductor device described in this embodiment is described with reference to FIG. 10. A semiconductor device 2180 illustrated in FIG. 10 includes a thin film integrated circuit 2131 including a plurality of elements such as transistors that constitute a memory portion and a logic portion, and a conductive layer 2132 that serves as an antenna. The conductive layer 2132 that serves as an antenna is electrically connected to the thin film integrated circuit 2131. The transistor described in Embodiment 2 can be applied to the thin film integrated circuit 2131. The conductive layer that serves as an antenna may be provided above or below the thin film integrated circuit. The conductive layer that serves as an antenna may be provided on an outer side than the impact resistance layer. Alternatively, the conductive layer 2132 that serves as an antenna may be provided using a substrate 2133 and then the substrate 2133 and the thin film integrated circuit 2131 may be attached to each other so as to interpose the conductive layer 2132. A structure may be used in which a connecting terminal of the thin film integrated circuit 2131 and the conductive layer that serves as an antenna are electrically connected to each other through conductive particles included in an adhesive resin. Alternatively, an embodiment of the present invention can also be applied to a semiconductor device in which a booster antenna that can convert frequency of radio waves without contact is provided between an interrogator and an antenna that is electrically connected to a thin film integrated circuit.

As a semiconductor element, not to mention a field-effect transistor, a memory element which uses a semiconductor layer, or the like can be employed for the semiconductor device according to an embodiment of the present invention; accordingly, a semiconductor device which can meet functions required for various applications can be manufactured and provided.

Note that although the example in which the conductive layer 2132 that serves as an antenna is provided in the shape of a coil and either an electromagnetic induction method or an electromagnetic coupling method is employed is described in this embodiment, the semiconductor device of the present invention is not limited thereto, and a microwave method may also be employed. In the case of a microwave method, the shape of the conductive layer 2132 that serves as an antenna may be decided as appropriate depending on the wavelength of an electromagnetic wave.

For example, when the microwave method (e.g., with an UHF band (in the range of 860 MHz to 960 MHz), a frequency band of 2.45 GHz, or the like) is employed as the signal transmission method of the semiconductor device, the shape such as length of the conductive layer that serves as an antenna may be set as appropriate in consideration of the wavelength of an electromagnetic wave used for signal transmission. For example, the conductive layer which serves as an antenna can be formed into a linear shape (e.g., a dipole antenna), a flat shape (e.g., a patch antenna or an antenna having a ribbon shape), or the like. Further, the shape of the conductive layer 2132 that serves as an antenna is not limited to a line, and the conductive layer in the shape of a curved line, in a serpentine shape, or in a shape combining them may be provided as well in consideration of the wavelength of the electromagnetic wave.

The conductive layer that serves as an antenna is formed using a conductive material by a CVD method, a sputtering method, a printing method such as screen printing or gravure printing, a droplet discharge method, a dispensing method, a plating method, or the like. The conductive material is any of a metal element such as aluminum (Al), titanium (Ti), silver (Ag), copper (Cu), gold (Au), platinum (Pt), nickel (Ni), palladium (Pd), tantalum (Ta), and molybdenum (Mo); or an alloy material or a compound material including the element, and a single-layer structure or a layered structure may be employed.

For example, when the conductive layer 2132 that serves as an antenna is formed by a screen printing method, it can be provided by selective printing with a conductive paste in which conductive particles with a grain diameter of several nanometers to several tens of micrometers are dissolved or dispersed in an organic resin. As the conductive particle, a fine particle or a dispersive nanoparticle of metal of one or more of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin included in the conductive paste, one or more selected from organic resins that serve as a binder of metal particles, a solvent, a dispersing agent, and a coating material can be used. Typically, an organic resin such as an epoxy resin, a silicone resin, and the like can be given. Further, in forming the conductive layer, it is preferable to bake the conductive paste after being provided. For example, in the case of using fine particles (e.g., with a grain diameter of from 1 nm to 100 nm) containing silver as a main component as a material of the conductive paste, the conductive layer can be formed by baking the conductive paste at a temperature in the range of 150° C. to 300° C. to be cured. Also, fine particles containing solder or lead-free solder as a main component may be used, and in this case fine particles each having a grain diameter of 20 μm or less is preferably used. Solder and lead-free solder have an advantage of being low cost.

In the semiconductor device to which an embodiment of the present invention is applied, with the use of a pair of the impact resistance layers which sandwich the semiconductor integration circuit and the impact diffusion layer which is stacked below the semiconductor integrated circuit, a highly reliable semiconductor device that is reduced in thickness and size and has strength can be provided. Therefore, the semiconductor device to which an embodiment of the present invention is applied is effective in the case where it is used as a small semiconductor device to/from which data can be input/output without contact, which is described in this embodiment.

(Embodiment 14)

In this embodiment, an example of application of the above-described semiconductor device capable of inputting/outputting data without contact, which is formed using an embodiment of the present invention, is described with reference to drawings. The semiconductor device which can input and output data without contact is also referred to as an RFID tag, an ID tag, an IC tag, an IC chip, an RF tag, a wireless tag, an electronic tag, or a wireless chip depending on usage pattern.

Figure 11A:
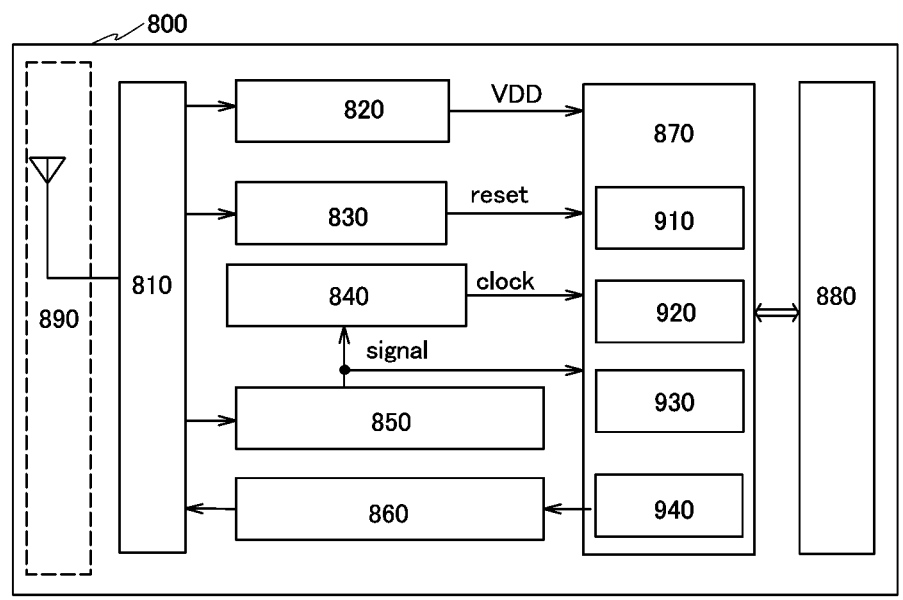
FIGS. 11A to 11C are diagrams each illustrating a semiconductor device.

A semiconductor device 800, which has a function in which data can be exchanged without contact, includes a high-frequency circuit 810, a power supply circuit 820, a reset circuit 830, a clock generator circuit 840, a data demodulation circuit 850, a data modulation circuit 860, a control circuit 870 used for controlling other circuits, a memory circuit 880, and an antenna 890 (see FIG. 11A). The high-frequency circuit 810 receives a signal from the antenna 890 and outputs a signal, which is received from the data modulation circuit 860, with the antenna 890. The power supply circuit 820 generates power source potential from a received signal. The reset circuit 830 generates a reset signal. The clock generator circuit 840 generates various clock signals based on a received signal input from the antenna 890. The data demodulation circuit 850 demodulates a received signal and outputs the demodulated signal to the control circuit 870. The data modulation circuit 860 modulates a signal received from the control circuit 870. As the control circuit 870, for example, a code extracting circuit 910, a code judging circuit 920, a CRC judging circuit 930, and an output unit circuit 940 are provided. Note that the code extracting circuit 910 extracts each of a plurality of codes included in an instruction transmitted to the control circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above-described semiconductor device is described. First, a radio signal is received by the antenna 890. The radio signal is transmitted to the power supply circuit 820 via the high-frequency circuit 810, and a high power source potential (hereinafter referred to as VDD) is generated. The VDD is supplied to each circuit in the semiconductor device 800. A signal transmitted to the data demodulation circuit 850 through the high-frequency circuit 810 is demodulated (hereinafter, this signal is referred to as a demodulated signal). Moreover, signals passed through the reset circuit 830 and the clock generator circuit 840 through the high-frequency circuit 810, and the demodulated signal are transmitted to the control circuit 870. The signals transmitted to the control circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulation circuit 860 and then is transmitted by the antenna 890 as a radio signal. Note that low power source potential (hereinafter referred to as VSS) is common in the plurality of circuits included in the semiconductor device 800, and VSS can be GND.

In this manner, data in the semiconductor device can be read by transmitting a signal to the semiconductor device 800 from a communication device and by receiving a signal which is transmitted from the semiconductor device 800 by the communication device.

Moreover, in the semiconductor device 800, power source voltage may be supplied to each circuit by electromagnetic waves without mounting a power source (battery), or a power source (battery) may be mounted so that power source voltage is supplied to each circuit by both electromagnetic waves and the power source (battery).

Figure 11B:
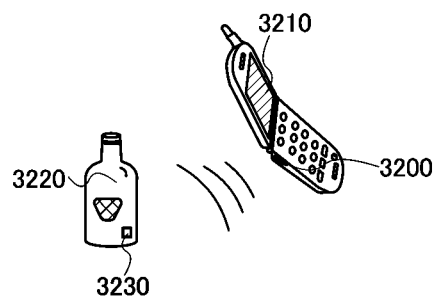
Figure 11C:
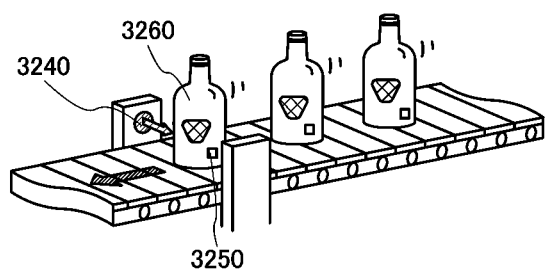

Next, an example of usage of a semiconductor device in which data can be input/output without contact is described. A side surface of a mobile terminal which includes a display portion 3210 is provided with a communication device 3200. A side surface of a product 3220 is provided with a semiconductor device 3230 (FIG. 11B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a communication device 3240 and a semiconductor device 3250 with which the product 3260 is provided (see FIG. 11C). In this manner, information can be easily obtained, and high functions and high added values are realized by utilizing a semiconductor device for a system.

Thus, a highly reliable semiconductor device according to an embodiment of the present invention, which has a very wide range of application, can be used in electronic devices in a variety of fields.

(Embodiment 15)

According to an embodiment of the present invention, a semiconductor device that serves as a chip having a processor circuit (hereinafter also referred to as a processor chip, a wireless chip, a wireless processor, a wireless memory, or a wireless tag) can be formed. The application range of the semiconductor device according to an embodiment of the present invention is so wide that it may be applied to any object in order that the history thereof or the like is revealed without contact and utilized in production, management, and the like. For example, the semiconductor device may be incorporated in bills, coins, securities, certificates, bearer bonds, containers for packages, books, recording media, personal belongings, vehicles, groceries, garments, healthcare items, daily commodities, medicals, electronic devices, or the like. These examples are described with reference to FIGS. 9A to 9G.

The bills and coins are money that circulates in the market, and includes one that can be used in the same way as money in a specific area (cash voucher), a commemorative coin, and the like. The securities include checks, certificates, promissory notes, and the like and can be provided with a chip 190 including a processor circuit (see FIG. 9A). The certificates refer to driver's licenses, certificates of residence, and the like and can be provided with a chip 191 including a processor circuit (see FIG. 9B). The personal belongings include bags, a pair of glasses, and the like and can be provided with a chip 197 including a processor circuit (see FIG. 9C). The bearer bonds refer to stamps, rice coupons, various merchandise coupons, and the like. The containers for packages refer to wrapping paper for food containers, plastic bottles, and the like and can be provided with a chip 193 including a processor circuit (see FIG. 9D). The books refer to hardbacks, paperbacks, and the like and can be provided with a chip 194 including a processor circuit (see FIG. 9E). The recording media refer to DVD software, video tapes, and the like and can be provided with a chip 195 including a processor circuit (see FIG. 9F). The vehicles refer to wheeled vehicles such as bicycles, ships, and the like and can be provided with a chip 196 including a processor circuit (see FIG. 9G). The groceries indicate foods, beverages, and the like. The garments indicate clothes, shoes, and the like. The healthcare items indicate a medical apparatus, a health appliance, and the like. The daily commodities indicate furniture, lighting apparatus, and the like. The medicals indicate a drug, an agricultural chemical, and the like. The electronic devices indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the containers for packages, the recording media, the personal belongings, the groceries, the garments, the daily commodities, the electronic devices, or the like with the semiconductor device. In addition, by providing the vehicles with the semiconductor device, forgery or theft can be prevented. In addition, when the semiconductor device is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

Note that this embodiment can be implemented in combination with any of Embodiments 1 to 14, as appropriate.

(Embodiment 16)

In this embodiment, an example of a semiconductor device according to the present invention is described with reference to FIGS. 24A to 24E.

An embodiment of a semiconductor device of the present invention can be mounted on an article, as described in Embodiment 15. In this embodiment, an example is described in which a flexible semiconductor device mounted on a flexible substrate is formed.

Figure 24A:
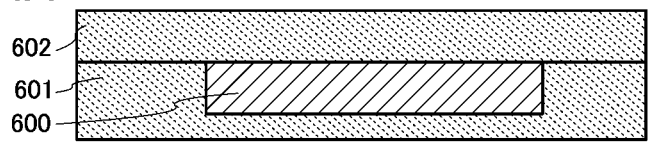
FIGS. 24A to 24E are views each illustrating a semiconductor device.
Figure 24B:
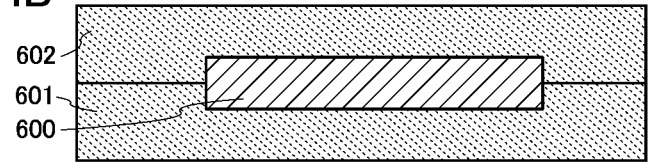
Figure 24C:
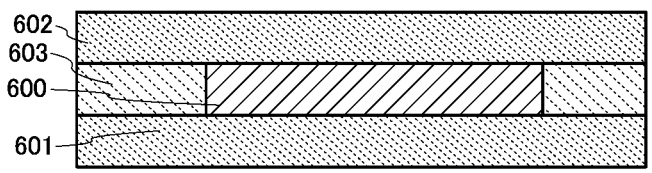
Figure 24D:
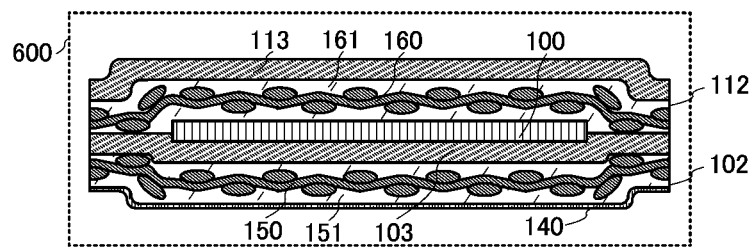
Figure 24E:
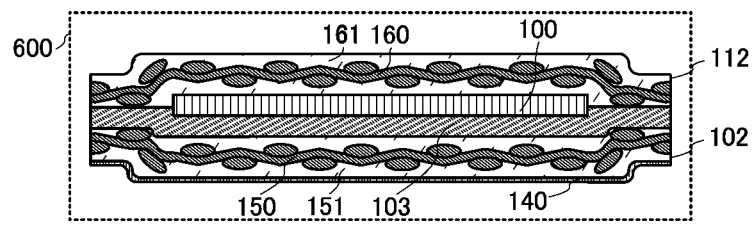

An example in which a semiconductor integrated circuit chip is embedded in a flexible substrate is illustrated in FIGS. 24A to 24C. Any of the semiconductor devices described in Embodiments 1 to 11 can be used for the semiconductor integrated circuit chip, and here, semiconductor integrated circuits which are individually separated in chip shapes are referred to as semiconductor integrated circuit chips. A semiconductor integrated circuit chip 600 is described in detail in FIG. 24D. A semiconductor integrated circuit chip of FIG. 24D is an example using Embodiment 1, and a semiconductor integrated circuit chip of FIG. 24E is an example using Embodiment 5. However, this embodiment can also be applied to other embodiments, and this embodiment is not limited to this structure.

In FIG. 24D, the semiconductor integrated circuit 100 is sandwiched by the first impact diffusion layer 113, the second impact diffusion layer 103, the first impact resistance layer 112, and the second impact resistance layer 102, and the side surface of the semiconductor integrated circuit 100 is also sealed. In this embodiment, the first impact diffusion layer, the second impact diffusion layer, the first impact resistance layer, and the second impact resistance layer are attached so as to sandwich a plurality of semiconductor integrated circuits, and then the semiconductor integrated circuits are individually separated, whereby semiconductor integrated circuit chips are formed. There is no particular limitation on a separation means as long as physical separation is possible, and separation is performed by laser beam irradiation in this embodiment.

In FIG. 24E, the semiconductor integrated circuit 100 is sandwiched by the impact diffusion layer 103, the first impact resistance layer 112, and the second impact resistance layer 102, and the side surface of the semiconductor integrated circuit 100 is also sealed. In this embodiment, the impact diffusion layer, the first impact resistance layer, and the second impact resistance layer are attached so as to sandwich a plurality of semiconductor integrated circuits, and then the semiconductor integrated circuits are individually separated, whereby semiconductor integrated circuit chips are formed.

In FIG. 24A, the semiconductor integrated circuit chip 600 is sandwiched between a flexible substrate 601 and a flexible substrate 602, and the semiconductor integrated circuit chip 600 is provided in a depressed portion formed in the flexible substrate 601.

The depressed portion in which the semiconductor integrated circuit chip 600 is provided may be formed in one flexible substrate or may be formed in both flexible substrates. In FIG. 24B, an example is illustrated in which the semiconductor integrated circuit chip 600 is provided in the depressed portions provided in both the flexible substrate 601 and the flexible substrate 602.

Further, a flexible substrate may have a three-layer structure and a central flexible substrate may be provided with an opening in which the semiconductor integrated circuit chip 600 is provided. In FIG. 24C, an example is illustrated in which an opening is formed in a flexible substrate 603, the semiconductor integrated circuit chip 600 is provided in the opening, and the flexible substrate 603 and the semiconductor integrated circuit chip 600 are sandwiched between the flexible substrate 601 and the flexible substrate 602.

In FIGS. 24A to 24C, a flexible substrate may be stacked on an outer side than the flexible substrate 601 or the flexible substrate 602.

For each of the flexible substrates 601, 602, and 603, a woven fabric which is woven using bundles of fibers (single yarns) (hereinafter, the bundles of fibers are referred to as yarn bundles) for warp yarns and weft yarns, a nonwoven fabric obtained by stacking yarn bundles of plural kinds of fibers randomly or in one direction, paper, or the like can be used. Specifically, the following can be used: a substrate formed from polyethylene terephthalate (PET), polyethylene naphthalate (PEN), polyethersulfone (PES), polypropylene, polypropylene sulfide, polycarbonate, polyetherimide, polyphenylene sulfide, polyphenylene oxide, polysulfone, polyphthalamide, or the like; a substrate formed from polypropylene, polyester, vinyl, polyvinyl fluoride, vinyl chloride, polyester, polyamide, or the like; a film; paper formed from a fibrous material; and the like. A layered film of an adhesive synthetic resin film (such as an acrylic synthetic resin or an epoxy synthetic resin), or the like can be used. When a substrate or a film is bonded to a subject to be processed, a bonding layer may be used. A condition can be selected in accordance with the kind of the substrate or the film, and bonding can be performed by thermal treatment or application of pressure. A bonding layer corresponds to a layer containing an adhesive such as a thermosetting resin, a UV curing resin, an epoxy resin adhesive, or a resin additive.

As in this embodiment, when a depressed portion or an opening is formed in a flexible substrate on which the semiconductor integrated circuit chip 600 is provided so as to be embedded in the depressed portion or the opening, a projected portion is not formed due to the provision of the semiconductor integrated circuit chip 600; therefore, the surface of the flexible substrate is flat, and film thickness can be uniform. Accordingly, even if pressure treatment is performed with a roller or the like for attachment when a semiconductor integrated circuit chip is mounted on a flexible substrate, pressure can be prevented from being locally applied on the semiconductor integrated circuit chip (pressure concentration). Therefore, damages of the semiconductor integrated circuit chip can be reduced in a mounting step, whereby the yield of a semiconductor device is improved. In addition, even after a semiconductor integrated circuit chip is mounted, a highly reliable semiconductor device which has high tolerance to external stress and can be formed.

In addition, since a surface can be flat and smooth, stacking is easily performed, which facilitates storage, transfer using a machine, and the like. Further, a semiconductor integrated circuit chip is not visually identified from the outside (a projected portion that reflects a shape of the semiconductor integrated circuit chip is not generated on the surface); therefore, a semiconductor device with high security can be formed.

EXAMPLE 1

This example describes results obtained by manufacturing semiconductor devices according to an embodiment of the present invention and evaluating reliability of the semiconductor devices.

As samples, a layered structure (Example X) including a first impact diffusion layer, a first impact resistance layer, a semiconductor integrated circuit, a second impact diffusion layer, a second impact resistance layer, and a conductive layer and a layered structure (Reference Example) including a first impact resistance layer, a semiconductor integrated circuit, and a second impact resistance layer are formed. In the samples, a prepreg (with a thickness of 20 μm), which is a structure body in which a fibrous body (glass fiber) is impregnated with an organic resin (brominated epoxy resin) is used for each of the first impact resistance layer and the second impact resistance layer, a titanium film formed by a sputtering method is used for the conductive layer, and an aramid film (with a thickness of 7 μm) is used for each of the first impact diffusion layer and the second impact diffusion layer. Note that an antenna is provided between the semiconductor integrated circuit and the first impact resistance layer, and a silicon nitride film is formed as a protective layer over the antenna.

ESD (electrostatic discharge) measurement is performed on 10 samples of the structure of Example X and 10 samples of the structure of Reference Example, and operation rates of the semiconductor devices are evaluated assuming that 10 semiconductor devices are viewed as 100 semiconductor devices.

For the ESD measurement, the sample is put on a stack of a glass substrate (with a thickness of 0.5 nm), an aluminum plate, and a conductive sheet, a voltage is applied to a central portion of the integrated circuit from the side where the conductive layer of the sample is formed by an ESD tester (for concise response evaluation, manufactured by Takaya corporation), electricity is removed (for one minute) after voltage is applied, and then the operation is checked.

Figure 23:
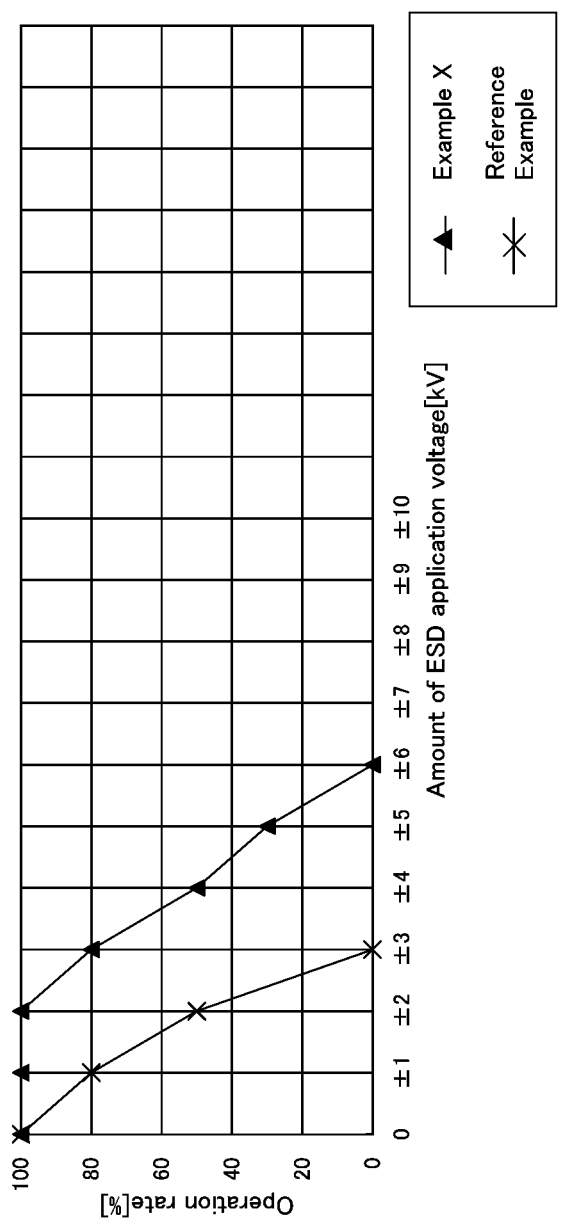
FIG. 23 is a graph showing evaluation results on reliability.

FIG. 23 shows the relation between the amount of ESD and the operation rate in the semiconductor device of each of Example X and Reference Example. In FIG. 23, a triangle-shaped data marker is used for Example X and an x-shaped data marker is used for Reference Example. Further, Table 1 shows average values, maximum values, and minimum values of ESD application voltage (kV) until the time when the semiconductor device becomes in a nonoperating state in the samples of Example X and Reference Example.

TABLE 1

| Sample | ESD application voltage until the time when the semiconductor device becomes in a nonoperating state in the samples [kV] | | |
|---|---|---|---|
| | Average Value | Maximum Value | Minimum Value |
| Example X | 4.6 | 6 | 3 |
| Reference Example | 2.8 | 3 | 1 |

In Reference Example in which a conductive layer is not provided, when the amount of ESD is ±3 kV, the operation rate is 0%, whereas in Example X in which the conductive layer is provided, when the amount of ESD is in the range of ±2 kV, the operation rate is 100% and when the amount of ESD is ±6 kV, the operation rate is 0%. Further, as for the values of ESD application voltage (kV) until the time when the semiconductor device becomes in a nonoperating state, in Reference Example, the average value, the maximum value, and the minimum value are 2.8 kV, 3 kV, and 1 kV, respectively, whereas in Example X, the average value, the maximum value, and the minimum value are 4.6 kV, 6 kV, and 3 kV, respectively; thus, it is found that the semiconductor device can be operated even at higher voltage. Therefore, it can be confirmed that Example X, which is a semiconductor device including a conductive layer formed using an embodiment of the present invention, has tolerance for electrostatic discharge and is not easily broken down by static electricity.

According to the above results, it can be confirmed that by using an embodiment of the present invention, with the use of the conductive layer covering the semiconductor integrated circuit, electrostatic breakdown (malfunctions of the circuit or damages of a semiconductor element) due to electrostatic discharge of the semiconductor integrated circuit can be prevented, so that a highly reliable semiconductor device that is reduced in thickness and size and has tolerance can be provided.

EXAMPLE 2

This example describes results obtained by manufacturing semiconductor devices according to an embodiment of the present invention and evaluating reliability of the semiconductor devices.

As samples, layered structures each including a first impact resistance layer, a semiconductor integrated circuit, a second impact resistance layer, and a conductive layer are formed. In the samples, a prepreg (with a thickness of 20 μm), which is a structure body in which a fibrous body (glass fiber) is impregnated with an organic resin (brominated epoxy resin) is used for each of the first impact resistance layer and the second impact resistance layer, and a titanium film formed by a sputtering method is used for the conductive layer. ESD (electrostatic discharge) measurement is performed on the samples including conductive layers with thicknesses of 0 nm, 5 nm, 10 nm, 20 nm, 30 nm, 50 nm, and 100 nm, for reliability evaluation. Note that the sample including a conductive layer with a thickness of 0 nm refers to the sample in which a conductive layer is not formed, which is Reference Example also described in Example 1.

For the ESD measurement, the sample is put on a stack of a glass substrate (with a thickness of 0.5 nm), an aluminum plate, and a conductive sheet, a voltage is applied to a central portion of the integrated circuit from the side on which the conductive layer of the sample is formed by an ESD tester (for concise response evaluation, manufactured by Takaya corporation), electricity is removed (for one minute) after voltage is applied, and then the operation is checked.

Figure 36:
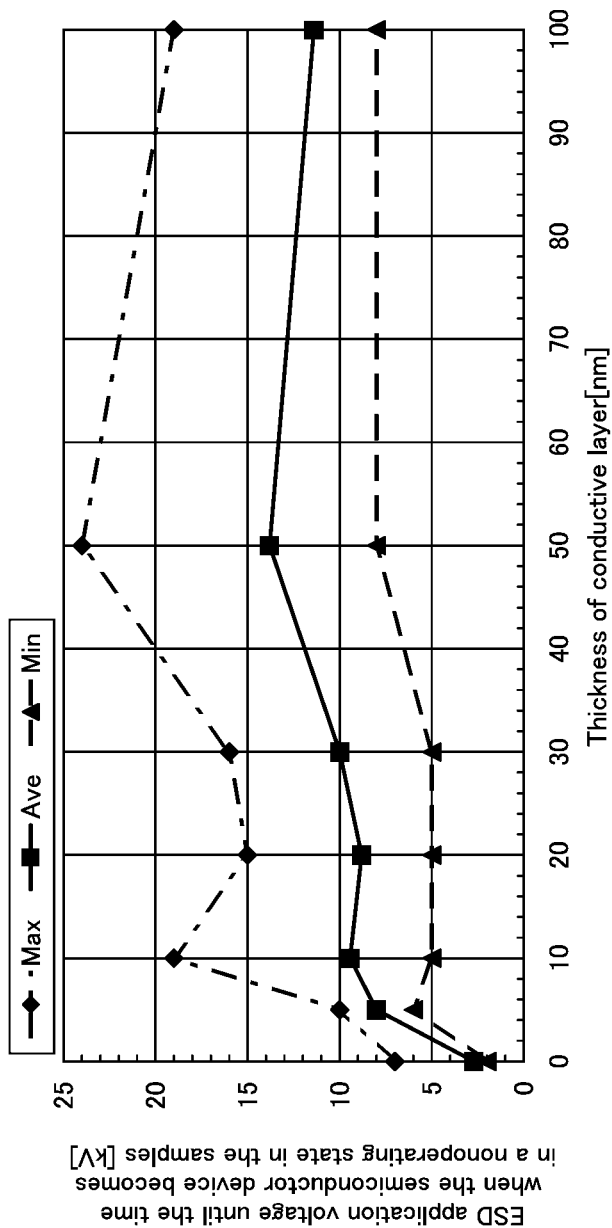
FIG. 36 is a graph showing evaluation results on reliability.

FIG. 36 shows the relation between the thickness of the conductive layer in the sample and the amount of ESD until the semiconductor device, which is the sample, becomes in a nonoperating state. A plurality of samples for each thickness of the conductive layer are measured, and a square-shaped data marker is used for an average value, a diamond-shaped data marker is used for a maximum value, and a triangle-shaped data marker is used for a minimum value. In the case of the structure in which a semiconductor device does not include a conductive layer (a conductive layer with a thickness of 0 nm), the conductive layer becomes in a nonoperating state at the time of ESD application of from about 1 kV to about 2 kV, whereas in the case of the structure in which a semiconductor device includes a conductive layer, the conductive layer becomes in a nonoperating state at the time of ESD application of about 5 kV, which means that ESD tolerance is increased.

As samples, a layered structure (Example A) including a first impact resistance layer, a semiconductor integrated circuit, an impact diffusion layer, a second impact resistance layer, and a conductive layer, a layered structure (Example B) including a first impact resistance layer, a semiconductor integrated circuit, a second impact resistance layer, and a conductive layer, and a layered structure (Reference Example) including a first impact resistance layer, a semiconductor integrated circuit, and a second impact resistance layer are formed. In the samples, a prepreg (with a thickness of 20 µm), which is a structure body in which a fibrous body (glass fiber) is impregnated with an organic resin (brominated epoxy resin) is used for each of the first impact resistance layer and the second impact resistance layer, a titanium film formed by a sputtering method is used for the conductive layer, and an aramid film (with a thickness of 7 µm) is used for the impact diffusion layer.

ESD measurement is performed on 10 samples of the structure of Example A, 10 samples of the structure of Example B, and 10 samples of the structure of Reference Example, and operation rates of the semiconductor devices of each structure are evaluated assuming that 10 semiconductor devices are viewed as 100 semiconductor devices. FIG. 37 shows the relation between the amount of ESD and the operation rate in the semiconductor device of each of Example A, Example B, and Reference Example. In FIG. 37, a circular data marker is used for Example A, a square data marker is used for Example B, and an x-shaped data marker is used for Reference Example. Further, Table 1 shows average values, maximum values, and minimum values of ESD application voltage (kV) until the time when the semiconductor devices of the samples for Example A, Example B, and Reference Example are in a nonoperating state.

TABLE 2

| Sample | ESD application voltage until the time when the semiconductor device becomes in a nonoperating state in the samples [kV] | | |
|---|---|---|---|
| | Average Value | Maximum Value | Minimum Value |
| Example A | 4.5 | 5 | 3 |
| Example B | 11.5 | 18 | 7 |
| Reference Example | 2.8 | 3 | 1 |

In Reference Example in which a conductive layer is not provided, when the amount of ESD is ±3 kV, the operation rate is 0%, whereas in Example A in which the conductive layer is provided, when the amount of ESD is in the range of ±2 kV, the operation rate is 100%, and in Example B in which the conductive layer is provided, when the amount of ESD is in the range of ±6 kV, the operation rate is 100%. Further, as for the values of ESD application voltage (kV) until the time when the semiconductor device becomes in a nonoperating state, in Reference Example, the average value, the maximum value, and the minimum value are 2.8 kV, 3 kV, and 1 kV, respectively, whereas in Example A, the average value, the maximum value, and the minimum value are 4.5 kV, 5 kV, and 3 kV, respectively, and in Example B, the average value, the maximum value, and the minimum value are 11.5 kV, 18 kV, and 7 kV, respectively; thus, it is found that the semiconductor devices of Example A and Example B, each of which includes a conductive layer, can be operated even at higher voltage. Therefore, it can be confirmed that Example A and Example B, each of which is a semiconductor device including a conductive layer formed using an embodiment of the present invention, has tolerance for electrostatic discharge and is not easily broken down by static electricity.

According to the above results, it can be confirmed that by using an embodiment of the present invention, with the use of the conductive layer covering the semiconductor integrated circuit, electrostatic breakdown (malfunctions of the circuit or damages of a semiconductor element) due to electrostatic discharge of the semiconductor integrated circuit can be prevented, so that a highly reliable semiconductor device that is reduced in thickness and size and has tolerance can be provided.

This application is based on Japanese Patent Application serial no. 2008-124985 and 2008-124992 filed with Japan Patent Office on May 12, 2008, the entire contents of which are hereby incorporated by reference.

What is claimed is:

1. A method for manufacturing a semiconductor device, comprising the steps of:
    forming a separation layer over a substrate;
    forming a semiconductor integrated circuit over the separation layer;
    attaching a first layer to the semiconductor integrated circuit and attaching a second layer to the first layer, the first layer being interposed between the semiconductor integrated circuit and the second layer;
    separating the semiconductor integrated circuit from the substrate;
    attaching a third layer to the semiconductor integrated circuit separated from the substrate and attaching a fourth layer to the third layer, the third layer being interposed between the semiconductor integrated circuit and the fourth layer; and
    forming a conductive layer so that the conductive layer and the semiconductor integrated circuit are electrically insulated from each other,
    wherein the first layer includes an organic resin and a fibrous body,
    wherein the third layer includes an organic resin and a fibrous body,
    wherein the second layer has a lower modulus of elasticity and higher breaking strength than the first layer,
    wherein the fourth layer has a lower modulus of elasticity and higher breaking strength than the third layer, and
    wherein the third layer and the fourth layer are between the conductive layer and the semiconductor integrated circuit.

2. The method for manufacturing a semiconductor device, according to claim 1, wherein each of the second layer and the fourth layer includes an aramid resin.

3. The method for manufacturing a semiconductor device, according to claim 1, wherein each of the fibrous bodies in the first layer and the third layer is a woven or nonwoven fabric.

4. The method for manufacturing a semiconductor device, according to claim 1, wherein each of the organic resins in the first layer and the third layer is selected from the group consisting of an epoxy resin, an unsaturated polyester resin, a polyimide resin, a bismaleimide-triazine resin, a cyanate resin, a polyphenylene oxide resin, a polyetherimide resin, and a fluorine resin.

5. The method for manufacturing a semiconductor device, according to claim 1, further comprising the step of providing an antenna electrically connected to the semiconductor integrated circuit,
wherein the antenna is interposed between the semiconductor integrated circuit and the first layer, and
wherein the antenna is located on a side opposite to the conductive layer through the semiconductor integrated circuit.

6. A method for manufacturing a semiconductor device, comprising the steps of:
forming a separation layer over a substrate;
forming a semiconductor integrated circuit over the separation layer, the semiconductor integrated circuit including an antenna;
attaching a first impact resistance layer to the semiconductor integrated circuit;
separating the semiconductor integrated circuit from the substrate;
attaching an impact diffusion layer to the semiconductor integrated circuit separated from the substrate and attaching a second impact resistance layer, the impact diffusion layer being interposed between the semiconductor integrated circuit and the second impact resistance layer; and
forming a conductive layer so that the conductive layer and the semiconductor integrated circuit are electrically insulated from each other,
wherein the first impact resistance layer includes an organic resin and a fibrous body,
wherein the second impact resistance layer includes an organic resin and a fibrous body,
wherein the impact diffusion layer has a lower modulus of elasticity and higher breaking strength than the second impact resistance layer, and
wherein the impact diffusion layer and the second impact resistance layer are between the conductive layer and the semiconductor integrated circuit.

7. The method for manufacturing a semiconductor device, according to claim 6, wherein each of the fibrous bodies in the first impact resistance layer and the second impact resistance layer is a woven or nonwoven fabric.

8. The method for manufacturing a semiconductor device, according to claim 6, wherein each of the organic resins in the first impact resistance layer and the second impact resistance layer is selected from the group consisting of an epoxy resin, an unsaturated polyester resin, a polyimide resin, a bismaleimide-triazine resin, a cyanate resin, a polyphenylene oxide resin, a polyetherimide resin, and a fluorine resin.

9. A method for manufacturing a semiconductor device, comprising the steps of:
forming a separation layer over a substrate;
forming a semiconductor integrated circuit over the separation layer;
attaching a first layer to the semiconductor integrated circuit and attaching a second layer to the first layer, the first layer being interposed between the semiconductor integrated circuit and the second layer;
separating the semiconductor integrated circuit from the substrate;
attaching a third layer to the semiconductor integrated circuit separated from the substrate and attaching a fourth layer to the third layer, the third layer being interposed between the semiconductor integrated circuit and the fourth layer; and
forming a conductive layer so that the conductive layer and the semiconductor integrated circuit are electrically insulated from each other,
wherein the first layer includes an organic resin and a fibrous body,
wherein the fourth layer includes an organic resin and a fibrous body,
wherein the second layer has a lower modulus of elasticity and higher breaking strength than the first layer,
wherein the third layer has a lower modulus of elasticity and higher breaking strength than the fourth layer, and
wherein the third layer and the fourth layer are between the conductive layer and the semiconductor integrated circuit.

10. The method for manufacturing a semiconductor device, according to claim 9, wherein each of the second layer and the third layer includes an aramid resin.

11. The method for manufacturing a semiconductor device, according to claim 9, wherein each of the fibrous bodies in the first layer and the fourth layer is a woven or nonwoven fabric.

12. The method for manufacturing a semiconductor device, according to claim 9, wherein each of the organic resins in the first layer and the fourth layer is selected from the group consisting of an epoxy resin, an unsaturated polyester resin, a polyimide resin, a bismaleimide-triazine resin, a cyanate resin, a polyphenylene oxide resin, a polyetherimide resin, and a fluorine resin.

13. The method for manufacturing a semiconductor device, according to claim 9, further comprising the step of providing an antenna electrically connected to the semiconductor integrated circuit,
wherein the antenna is interposed between the semiconductor integrated circuit and the first layer, and
wherein the antenna is located on a side opposite to the conductive layer through the semiconductor integrated circuit.

* * * * *

UNITED STATES PATENT AND TRADEMARK OFFICE
CERTIFICATE OF CORRECTION

PATENT NO. : 9,048,277 B2
APPLICATION NO. : 13/759251
DATED : June 2, 2015
INVENTOR(S) : Yoshiaki Oikawa et al.

Page 1 of 1

It is certified that error appears in the above-identified patent and that said Letters Patent is hereby corrected as shown below:

In the Specification

At column 3, lines 13-14, "poly(3-butylpyrroe), poly(3-octylpyrroe), poly(3-decylpyrroe), poly(3,4-dimethylpyrroe), poly(3,4-dibutylpyrroe)," should be --poly(3-butylpyrrole), poly(3-octylpyrrole), poly(3-decylpyrrole), poly(3,4-dimethylpyrrole), poly(3,4-dibutylpyrrole),--;

At column 3, lines 16-18, "poly(3-ethoxypyrroe), poly(3-octoxypyrroe), poly(3-carboxylpyrroe), poly(3-methyl-4-carboxylpyrroe)," should be --poly(3-ethoxypyrrole), poly(3-octoxypyrrole), poly(3-carboxylpyrrole), poly(3-methyl-4-carboxylpyrrole),--;

At column 34, lines 6-8, "poly(3-butylpyrroe), poly(3-octylpyrroe), poly(3-decylpyrroe), poly(3,4-dimethylpyrroe), poly(3,4-dibutylpyrroe)," should be --poly(3-butylpyrrole), poly(3-octylpyrrole), poly(3-decylpyrrole), poly(3,4-dimethylpyrrole), poly(3,4-dibutylpyrrole),--;

At column 34, lines 10-12, "poly(3-ethoxypyrroe), poly(3-octoxyprroe), poly(3-carboxylpyrroe), poly(3-methyl-4-carboxylpyrroe)," should be --poly(3-ethoxypyrrole), poly(3-octoxyprrole), poly(3-carboxylpyrrole), poly(3-methyl-4-carboxylpyrrole),--;

At column 45, line 33, "He" should be --$He^+$--.

Signed and Sealed this
Sixteenth Day of February, 2016

Michelle K. Lee
*Director of the United States Patent and Trademark Office*